US012690307B2

(12) United States Patent
Harada et al.

(10) Patent No.: US 12,690,307 B2
(45) Date of Patent: Jul. 21, 2026

(54) DISPLAY DEVICE

(71) Applicant: SUMITOMO CHEMICAL COMPANY, LIMITED, Tokyo (JP)

(72) Inventors: Yoshihiro Harada, Osaka (JP); Yoshifumi Komatsu, Osaka (JP); Tomohiro Fukuura, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 934 days.

(21) Appl. No.: 17/778,760

(22) PCT Filed: Dec. 23, 2020

(86) PCT No.: PCT/JP2020/048159
§ 371 (c)(1),
(2) Date: May 20, 2022

(87) PCT Pub. No.: WO2021/132330
PCT Pub. Date: Jul. 1, 2021

(65) Prior Publication Data

US 2023/0031949 A1 Feb. 2, 2023

(30) Foreign Application Priority Data

Dec. 26, 2019 (JP) ................................ 2019-236574

(51) Int. Cl.
*H10H 20/851* (2025.01)
*H10H 20/84* (2025.01)

(52) U.S. Cl.
CPC ........ *H10H 20/8512* (2025.01); *H10H 20/84* (2025.01)

(58) Field of Classification Search
CPC ... H10H 20/84–20/854; H10H 29/851–29/854
See application file for complete search history.

(56) References Cited

U.S. PATENT DOCUMENTS 9,484,504 B2 * 11/2016 Bibl .................. H10H 20/8512
2015/0340571 A1 11/2015 Tsumori et al.
(Continued)

FOREIGN PATENT DOCUMENTS

CN 104885238 A 9/2015
EP 2 645 433 A2 10/2013
(Continued)

OTHER PUBLICATIONS

Zhu et al. "Highly transparent and color-tunable composite films with increased quantum dot loading". Journal of Materials Chemistry C and Electronic Supplementary Material, (2014); pp. 10031-10036 and pp. 1-4 for Supporting Information.*
(Continued)

*Primary Examiner* — Prashant J Khatri
(74) *Attorney, Agent, or Firm* — Foley & Lardner LLP

(57) ABSTRACT

A display device including a blue light source (A), a wavelength conversion layer (B), and a light absorption layer (C), wherein the wavelength conversion layer (B) has a first wavelength conversion layer (B1) containing a compound (Q1) that absorbs blue and emits red light, and a second wavelength conversion layer (B2) containing a compound (Q2) that absorbs blue and emits green light, and the display device satisfies 0.7≤X1 and 0.7≤X2.

5 Claims, 1 Drawing Sheet

(56) References Cited

U.S. PATENT DOCUMENTS

| | | | | |
|---|---|---|---|---|
| 2017/0122527 | A1* | 5/2017 | Miyanaga | H10H 20/851 |
| 2017/0123120 | A1 | 5/2017 | Shirouchi et al. | |
| 2017/0342320 | A1 | 11/2017 | Tsumori et al. | |
| 2020/0119071 | A1 | 4/2020 | Takishita et al. | |
| 2020/0264461 | A1 | 8/2020 | Kuwana et al. | |

FOREIGN PATENT DOCUMENTS

| | | | |
|---|---|---|---|
| EP | 2 940 745 | A1 | 11/2015 |
| EP | 3 327 813 | A1 | 5/2018 |
| EP | 3 483 933 | A1 | 5/2019 |
| JP | 2006-228705 | A | 8/2006 |
| JP | 2013-203822 | A | 10/2013 |
| JP | 2016-170419 | A | 9/2016 |
| JP | 2017-021322 | A | 1/2017 |
| JP | 2017-025165 | A | 2/2017 |
| JP | 2019-087746 | A | 6/2019 |
| KR | 20190047592 | A | 5/2019 |
| TW | I589674 | B | 7/2017 |
| TW | 201931616 | A | 8/2019 |
| WO | WO-2015/045735 | A1 | 4/2015 |
| WO | WO-2015/156227 | A1 | 10/2015 |
| WO | WO-2016/093076 | A1 | 6/2016 |
| WO | WO-2016/158723 | A1 | 10/2016 |

OTHER PUBLICATIONS

Office Action issued in corresponding Taiwanese Patent Application No. 109145384 dated Feb. 20, 2024 (9 pages).

European Extended Search Report issued in corresponding European Patent Application No. 20905459.2 dated Mar. 4, 2024 (16 pages).

Lim et al., "Highly Efficient Cadmium-Free Quantum Dot Light-Emitting Diodes Enabled by the Direct Formation of Excitons within InP@ZnSeS Quantum Dots", ACS Nano, vol. 7, No. 10, Sep. 24, 2013, pp. 9019-9026, XP093131674.

Office Action issued in corresponding Chinese Patent Application No. 202080090083.1 dated Mar. 27, 2024 (13 pages).

International Searching Authority, "International Search Report," issued in connection with International Patent Application No. PCT/JP2020/048159, dated Feb. 9, 2021.

International Searching Authority, "Written Opinion," issued in connection with International Patent Application No. PCT/JP2020/048159, dated Feb. 9, 2021.

Ziegler et al., "Silica-Coated InP/ZnS Nanocrystals as Converter Material in White LEDs", Advanced Materials, vol. 20, No. 21, Nov. 3, 2008, pp. 4068-4073.

* cited by examiner

[Figure 1]
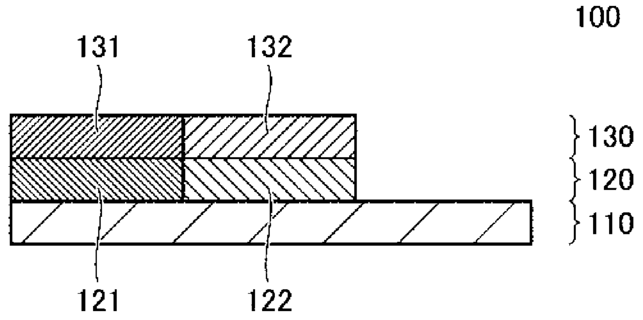
[Figure 2]
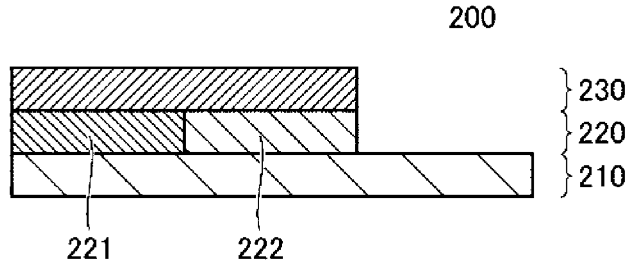
[Figure 3]
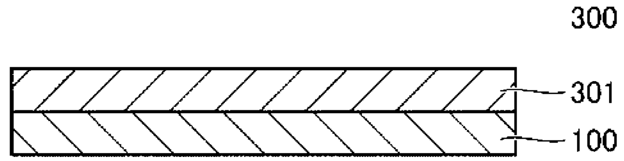

DISPLAY DEVICE

CROSS-REFERENCE TO RELATED APPLICATIONS

The present application claims priority under 35 U.S.C. § 371 to International Patent Application No. PCT/JP2020/048159, filed Dec. 23, 2020, which claims priority to and the benefit of Japanese Patent Application No. 2019-236574, filed on Dec. 26, 2019. The contents of these applications are hereby incorporated by reference in their entireties.

TECHNICAL FIELD

The present invention relates to a display device comprising a light source, a wavelength conversion layer, and a light absorption layer, and further relates to a film that can be used for the wavelength conversion layer.

BACKGROUND ART

Patent Literature 1 proposes a display device including an optical conversion unit containing quantum dots and a color filter.

Patent Literature 2 proposes a light emitting device using a composition for forming a cured film containing a binder polymer, a polymerizable compound, semiconductor quantum dots, and a dispersant. Further, Patent Literature 3 proposes a color filter manufactured by using a photosensitive resin composition containing a quantum dot dispersion.

CITATION LIST

Patent Literature

Patent Literature 1: International Publication No. 2015/045735

Patent Literature 2: Japanese Patent Laid-Open No. 2017-025165

Patent Literature 3: Japanese Patent Laid-Open No. 2017-21322

SUMMARY OF INVENTION

Technical Problem

In a conventionally proposed display device including a wavelength conversion layer containing quantum dots and a light absorption layer, a wide color gamut and excellent energy efficiency may not be simultaneously obtained.

An object of the present invention is to achieve both a wide color gamut and excellent energy efficiency in a display device comprising a blue light source, a wavelength conversion layer having a first wavelength conversion layer that emits green light and a second wavelength conversion layer that emits red light, and a light absorption layer.

Another object of the present invention is to provide a film that can be used as a wavelength conversion layer that emits green light and that can achieve both a wide color gamut and excellent energy efficiency in a display device.

Yet another object of the present invention is to provide a film that can be used as a wavelength conversion layer that emits red light and that can achieve both a wide color gamut and excellent energy efficiency in a display device.

Solution to Problem

The present invention provides the following display device and film.

[1] A display device comprising: a blue light source (A); a wavelength conversion layer (B); and a light absorption layer (C), wherein the wavelength conversion layer (B) has a first wavelength conversion layer (B1) containing a compound (Q1) that absorbs blue and emits red light, and a second wavelength conversion layer (B2) containing a compound (Q2) that absorbs blue and emits green light, and the display device satisfies the following conditions (1) and (2):

$$0.7 \leq X1; \text{ and} \tag{1}$$

$$0.7 \leq X2, \tag{2}$$

wherein

X1 is a value obtained by dividing a product of a thickness T1 [μm] of the first wavelength conversion layer (B1) and a content ratio W1 [% by mass] of the compound (Q1) in the first wavelength conversion layer (B1) by 100 [X1=(T1×W1)/100, and X2 is a value obtained by dividing a product of a thickness T2 [μm] of the second wavelength conversion layer (B2) and a content ratio W2 [% by mass] of the compound (Q2) in the second wavelength conversion layer (B2) by 100 [X2=(T2×W2)/100.

[2] The display device according to [1], wherein the blue light source (A) emits light having a peak at a wavelength of 600 nm or less.

[3] The display device according to [1] or [2], wherein the compound (Q1) contains at least one selected from the group consisting of an indium compound and a cadmium compound.

[4] The display device according to any one of [1] to [3], wherein the compound (Q2) contains at least one selected from the group consisting of an indium compound and a cadmium compound.

[5] The display device according to any one of [1] to [4], wherein the first wavelength conversion layer (B1) further contains a light scattering agent (S) and satisfies the following condition (3):

$$X3 \leq 1.6, \tag{3}$$

wherein

X3 is a value obtained by dividing a product of a thickness T1 [μm] of the first wavelength conversion layer (B1) and a content ratio W3 [% by mass] of the light scattering agent (S) in the first wavelength conversion layer (B1) by 100 [X3=(T1×W3)/100.

[6] The display device according to any one of [1] to [5], wherein the second wavelength conversion layer (B2) further contains a light scattering agent (S) and satisfies the following condition (4):

$$X4 \leq 1.6, \tag{4}$$

wherein

X4 is a value obtained by dividing a product of a thickness T2 [μm] of the second wavelength conversion layer (B2) and a content ratio W4 [% by mass] of the light scattering agent (S) in the second wavelength conversion layer (B2) by 100 [X4=(T2×W4)/100].

[7] The display device according to any one of [1] to [6], wherein the light absorption layer (C) includes a first light absorption layer (C1) and a second light absorption layer (C2), the first light absorption layer (C1) is disposed on the first wavelength conversion layer (B1), and the second light absorption layer (C2) is disposed on the second wavelength conversion layer (B2).

[8] A film comprising a compound (Q1) that absorbs blue and emits red light, and satisfying the following condition (5):

$$0.7 \leq X5, \quad (5)$$

wherein

X5 is a value obtained by dividing a product of a thickness T5 [μm] of the film and a content ratio W5 [% by mass] of the compound (Q1) in the film by 100 [X5=(T5×W5)/100].

[9] A film comprising a compound (Q2) that absorbs blue and emits green light, and satisfying the following condition (6):

$$0.7 \leq X6, \quad (6)$$

wherein

X6 is a value obtained by dividing a product of a thickness T6 [μm] of the film and a content ratio W6 [% by mass] of the compound (Q2) in the film by 100 [X6=(T6×W6)/100].

Advantageous Effects of Invention

According to the present invention, it is possible is to achieve both a wide color gamut and energy efficiency in a display device comprising a blue light source, a wavelength conversion layer having a first wavelength conversion layer that emits red light and a second wavelength conversion layer that emits green light, and a light absorption layer.

According to another aspect of the present invention, it is possible to provide a film that can be used as a wavelength conversion layer that emits green light and that can achieve both a wide color gamut and excellent energy efficiency in a display device.

According to yet another aspect of the present invention, it is possible to provide a film that can be used as a wavelength conversion layer that emits red light and that can achieve both a wide color gamut and excellent energy efficiency in a display device.

BRIEF DESCRIPTION OF DRAWINGS

FIG. 1 is a schematic cross-sectional view showing a display device according to an embodiment of the present invention.

FIG. 2 is a schematic cross-sectional view showing a display device according to an embodiment of the present invention.

FIG. 3 is a schematic cross-sectional view showing a display according to an embodiment of the present invention.

DESCRIPTION OF EMBODIMENTS

<Display Device>

The display device includes a blue light source (A), a wavelength conversion layer (B), and a light absorption layer (C). The display device is a device that irradiates the wavelength conversion layer (B) with light from the blue light source (A) to cause the wavelength conversion layer (B) to emit light, and the emitted light is extracted through the light absorption layer (C).

The wavelength conversion layer (B) is composed of a first wavelength conversion layer (B1) containing a compound (Q1) that absorbs blue and emits red light (hereinafter abbreviated as light-emitting compound (Q1)), and a second wavelength conversion layer (B2) containing a compound (Q2) that absorbs blue and emits green light (hereinafter abbreviated as light-emitting compound (Q2)).

The term "light-emitting" indicates a property of emitting light. The light-emitting property is preferably a property of emitting light by excitation of electrons, and more preferably a property of emitting light by excitation of electrons by excitation light. The peak wavelength of the excitation light may be, for example, 200 nm to 800 nm, 250 nm to 750 nm, 300 nm to 700 nm, or 300 nm to 600 nm.

"Blue" refers to any light visible as blue (any light having intensity in a blue wavelength region, for example, 380 nm to 495 nm), and is not limited to light having a single wavelength.

"Green" refers to any light visible as green (any light having intensity in a green wavelength region, for example, 495 nm to 585 nm), and is not limited to light having a single wavelength.

"Red" refers to any light visible as red (any light having intensity in a red wavelength region, for example, 585 nm to 780 nm), and is not limited to light having a single wavelength.

"Yellow" refers to any light visible as yellow (any light having intensity in a yellow wavelength region, for example, 560 nm to 610 nm), and is not limited to light having a single wavelength.

The display device may include layers such as a light guide plate, a reflection film, a diffusion film, a brightness enhancement unit, a prism sheet, and a medium material layer between elements.

The first wavelength conversion layer (B1) and the second wavelength conversion layer (B2) may be disposed directly on the blue light source (A), or may be disposed on a light guide plate disposed between the blue light source (A) and the first wavelength conversion layer (B1) and the second wavelength conversion layer (B2) in an optical path of light from the blue light source (A).

The display device may have the blue light source (A), the wavelength conversion layer (B), and the light absorption layer (C) in this order in the optical path of the light from the blue light source (A).

When conditions (1) and (2) are satisfied, the display device can exhibit a wide color gamut and excellent energy efficiency. In a display device including a blue light source, a wavelength conversion layer containing a compound having a light-emitting property, and a light absorption layer, a part of light from the blue light source leaks from the wavelength conversion layer, so that the peak intensity of light emitted from the wavelength conversion layer is lowered, and the target chromaticity and emission intensity may not be obtained. In order to suppress such leakage of light from the blue light source, it is conceivable to increase the thickness of the wavelength conversion layer, but if the thickness is too large, the formation of the wavelength conversion layer tends to be difficult. As a result of studies, it has been found that when the product of the thickness of the wavelength conversion layer and the content ratio of the compound having a light-emitting property in the wavelength conversion layer is set to a certain value or more, leakage of a part of light from the blue light source from the wavelength conversion layer is easily suppressed in a thickness range in which the wavelength conversion layer can be formed, and a wide color gamut and excellent energy efficiency can be obtained.

<Condition (1)>

A value X1 [X1=(T1×W1)/100] (hereinafter, also abbreviated as X1) obtained by dividing a product of a thickness T1 [μm] of the first wavelength conversion layer (B1) and a content ratio W1 [% by mass] of the light-emitting compound (Q1) in the first wavelength conversion layer (B1) by 100 is 0.7 or more. The first wavelength conversion layer (B1) preferably satisfies 1.0≤X1, more preferably 1.5≤X1, and still more preferably 2.0≤X1, from the viewpoint of color gamut and energy efficiency. The first wavelength conversion layer (B1) usually satisfies X1≤4.0, and preferably X1≤3.5 from the viewpoint of ease of production.

<Condition (2)>

A value X2 [X2=(T2×W2)/100] (hereinafter, also abbreviated as X2) obtained by dividing a product of a thickness T2 [μm] of the second wavelength conversion layer (B2) and a content ratio W2 [% by mass] of the light-emitting compound (Q2) in the second wavelength conversion layer (B2) by 100 is 0.7 or more. The first wavelength conversion layer (B2) preferably satisfies 1.0≤X2, more preferably 1.5≤X2, and still more preferably 2.0≤X2, from the viewpoint of color gamut and energy efficiency. The first wavelength conversion layer (B1) usually satisfies X2≤4.0, and preferably X2≤3.5 from the viewpoint of ease of production.

The thickness T1 of the first wavelength conversion layer (B1) may be, for example, 1 μm or more and 20 μm or less, preferably 1.5 μm or more and 15 μm or less, and more preferably 2 μm or more and 10 μm or less, from the viewpoint of ease of production. The thickness T1 [μm] of the first wavelength conversion layer (B1) is measured according to the method described in the column of Examples described later.

The thickness T2 of the second wavelength conversion layer (B2) may be, for example, 1 μm or more and 20 μm or less, preferably 1.5 μm or more and 15 μm or less, and more preferably 2 μm or more and 10 μm or less, from the viewpoint of ease of production. The thickness T2 [μm] of the second wavelength conversion layer (B2) is measured according to the method described in the column of Examples described later.

The thickness T1 of the first wavelength conversion layer (B1) and the thickness T2 of the second wavelength conversion layer (B2) may be the same or different.

The content ratio W1 of the light-emitting compound (Q1) in the first wavelength conversion layer (B1) may be, for example, 10% by mass or more and 80% by mass or less, and is preferably 15% by mass or more and 60% by mass or less, and more preferably 15% by mass or more and 40% by mass or less, from the viewpoint of color gamut and energy efficiency. The content ratio W1 of the light-emitting compound (Q1) in the first wavelength conversion layer (B1) is obtained as a mass percentage of the light-emitting compound (Q1) based on the mass of the solid content of the curable resin composition (Q1) to be described later, which forms the first wavelength conversion layer (B1).

The content ratio W2 of the light-emitting compound (Q2) in the second wavelength conversion layer (B2) may be, for example, 10% by mass or more and 80% by mass or less, and is preferably 15% by mass or more and 60% by mass or less, and more preferably 15% by mass or more and 40% by mass or less, from the viewpoint of color gamut and energy efficiency. The content ratio W2 of the light-emitting compound (Q2) in the second wavelength conversion layer (B2) is obtained as a mass percentage of the light-emitting compound (Q2) based on the mass of the solid content of the curable resin composition (Q2) to be described later, which forms the second wavelength conversion layer (B2).

The conditions (1) and (2) can be satisfied by, for example, adjusting the types, average particle sizes, content ratios, and the like of the light-emitting compounds (Q1) and (Q2) in the curable resin composition (Q) described later, adjusting the types, content ratios, and the like of the polymers, adjusting the thicknesses of the wavelength conversion layers, and the like.

<Blue Light Source>

The blue light sources (A) may be a light source that emits at least blue light capable of causing the light-emitting compound (Q1) in the first wavelength conversion layer (B1) and the light-emitting compound (Q2) in the second wavelength conversion layer (B2) to emit light. As the blue light source (A), for example, a known light source such as a light emitting diode (LED) including a blue light-emitting diode, a laser, and an EL can be used. The blue light source (A) is a light source that emits light having a peak of preferably 600 nm or less from the viewpoint of color gamut and energy efficiency. The peak of the light emitted from the blue light source (A) is measured according to the method described in the column of Examples described later.

The blue light source (A) can be used as a backlight in combination with the wavelength conversion layer (B). The backlight may include a light guide plate.

<Wavelength Conversion Layer>

The wavelength conversion layer (B) is composed of a first wavelength conversion layer (B1) and a second wavelength conversion layer (B2). The first wavelength conversion layer (B1) and the second wavelength conversion layer (B2) are preferably those capable of converting the wavelength of blue light from the blue light source (A) into the wavelength of red light and the wavelength of green light, respectively.

The first wavelength conversion layer (B1) can absorb a part of light from the blue light source (A) and emit red light. Although the first wavelength conversion layer (B1) may transmit another part of the light from the blue light source (A), it is preferable that the amount of light transmitted from the blue light source (A) is small.

The light emitted from the first wavelength conversion layer (B1) has a peak in the wavelength range of 620 nm to 650 nm, and a full width at half maximum of the peak is 15 nm to 80 nm, and more preferably a peak in the wavelength range of 625 nm to 645 nm, and a full width at half maximum of the peak is 15 nm to 45 nm. The wavelength range and full width at half maximum of the peak are measured by the methods described in the Examples section below.

The second wavelength conversion layer (B2) can absorb a part of light from the blue light sources (A) and emit green light. Although the second wavelength conversion layer (B2) may transmit another part of the light from the blue light source (A), it is preferable that the amount of light transmitted from the blue light source (A) is small.

The light emitted from the second wavelength conversion layer (B2) has a peak in the wavelength range of 520 nm to 545 nm, and a full width at half maximum of the peak is 15 nm to 80 nm, and more preferably a peak in the wavelength range of 525 nm to 535 nm, and a full width at half maximum of the peak is 15 nm to 45 nm.

The first wavelength conversion layer (B1) and the second wavelength conversion layer (B2) may be a layer containing a cured product of a curable resin composition (hereinafter also referred to as curable resin composition (D1)) containing a light-emitting compound (Q1) and a layer containing a cured product of a curable resin composition (hereinafter also referred to as curable resin composition (D2)) containing a light-emitting compound (Q2), respectively. Hereinafter, the curable resin composition (D1) and the curable resin composition (D2) are collectively referred to as a curable resin composition (D).

The first wavelength conversion layer (B1) and the second wavelength conversion layer (B2) may each have a single-layer structure or a multi-layer structure including a plurality of layers. When the first wavelength conversion layer (B1) has a multi-layer structure including a plurality of layers, the first wavelength conversion layer (B1) may have two or more layers containing a cured product of the curable resin composition (D1).

The light transmittance (450 nm) of the first wavelength conversion layer (B1) may be, for example, 85% or less, and is preferably 60% or less, more preferably 40% or less, still more preferably 30% or less, particularly preferably 20% or less, and more particularly preferably 10 or less, from the viewpoint of color gamut and energy efficiency.

The light transmittance (450 nm) of the second wavelength conversion layer (B2) may be, for example, 90% or less, and is preferably 75% or less, more preferably 60% or less, still more preferably 40% or less, particularly preferably 30% or less, and more particularly preferably 20% or less, from the viewpoint of color gamut and energy efficiency.

[Light-Emitting Compound]

The emission spectrum (peak) of the red light emitted by the light-emitting compound (Q1) preferably has a maximum value in the wavelength range of 610 nm to 750 nm. When the maximum value is in the wavelength range of 610 nm to 750 nm, the color purity of the red light corresponding to the peak is particularly high, so that the brightness of the red light of the display device can be further improved. The maximum value is more preferably present in the wavelength range 620 nm to 650 nm. The emission spectrum of the light-emitting compound (Q1) is measured according to the method described in the column of Examples described later.

The emission spectrum of the light-emitting compound (Q1) preferably has a full width at half maximum of 20 nm to 80 nm. When the full width at half maximum is 80 nm or less, the color purity of the red light is high in the light emitted from the first wavelength conversion layer (B1), so that the brightness of the red light of the display device can be further improved. On the other hand, when the full width at half maximum is 20 nm or more, the amount of transmitted red light can be further increased, so that the brightness of red light can be further improved. The full width at half maximum of the emission spectrum of the red light is more preferably 20 nm to 60 nm, and still more preferably 20 nm to 50 nm.

The emission spectrum (peak) of the green light emitted by the light-emitting compound (Q2) preferably has a maximum value in the wavelength range of 500 nm to 560 nm. When the maximum value is in the wavelength range of 500 nm to 560 nm, the color purity of the green light corresponding to the peak is particularly high, so that the brightness of the green light of the display device can be further improved. The maximum value is more preferably present in the wavelength range 500 nm to 560 nm. The emission spectrum of the light-emitting compound (Q2) is measured according to the method described in the column of Examples described later.

The emission spectrum of the light-emitting compound (Q2) preferably has a full width at half maximum of 20 nm to 80 nm. When the full width at half maximum is 80 nm or less, the color purity of the green light is high in the light emitted from the second wavelength conversion layer (B2), so that the brightness of the green light of the display device can be further improved. On the other hand, when the full width at half maximum is 20 nm or more, the amount of transmitted green light can be further increased, so that the brightness of green light can be further improved. The full width at half maximum of the emission spectrum of the green light is more preferably 20 nm to 60 nm, and still more preferably 20 nm to 50 nm.

As the light-emitting compound (Q1) and the light-emitting compound (Q2), quantum dots are preferable. Examples of quantum dots include particles of an indium compound having a light-emitting property and particles of a cadmium compound having a light-emitting property.

Examples of the indium compound include a Group III-V indium compound, a Group III-VI indium compound, and a Group I-III-VI indium compound, preferably a Group III-V indium compound, and more preferably an indium compound containing a phosphorus element as the Group V.

Examples of the cadmium compound include a Group II-VI cadmium compound and a Group II-V cadmium compound.

The indium compound does not contain a cadmium element, and the cadmium compound does not contain an indium element.

[Group III-V Indium Compound]

The Group III-V indium compound is a compound containing a Group III element and a Group V element, and is a compound containing at least an indium element. Here, the Group III means the Group 13 of the periodic table, and the Group V means the Group 15 of the periodic table (the same applies hereinafter). As used herein, the "periodic table" means a long-period periodic table.

The Group III-V indium compound may be a binary system, a ternary system, or a quaternary system.

The binary Group III-V indium compound may be a compound containing an indium element (first element) and a Group V element (second element), and examples thereof include InN, InP, InAs, and InSb.

The ternary Group III-V indium compound may be a compound containing an indium element (first element) and two elements selected from Group V (second element), or may be a compound containing two elements selected from Group III (first element) in which one is an indium element and one element selected from Group V (second element).

Examples of the ternary Group III-V indium compound include InPN, InPAs, InPSb, and InGaP.

The quaternary Group III-V indium compound is a compound containing two elements selected from Group III (first element) in which one is an indium element and two elements selected from Group V (second element).

Examples of the quaternary Group III-V indium compound include InGaPN, InGaPAs, and InGaPSb.

A semiconductor containing the Group III-V indium compound may contain an element other than the Group 13 and Group 15 of the periodic table (excluding the element of cadmium) as a doping element.

[Group III-VI Indium Compound]

The Group III-VI indium compound is a compound containing a Group III element and a Group VI element, and is a compound containing at least an indium element. Here, the Group VI means the Group 16 of the periodic table (the same applies hereinafter).

The Group III-VI indium compound may be a binary system, a ternary system, or a quaternary system.

The binary Group III-VI indium compound may be a compound containing an indium element (first element) and a Group VI element (second element), and examples thereof include $In_2S_3$, $In_2Se_3$, and $In_2Te_3$.

The ternary Group III-VI indium compound may be a compound containing an indium element (first element) and two elements selected from Group VI (second element), or may be a compound containing two elements selected from Group III (first element) in which one is an indium element and one element selected from Group VI (second element).

Examples of the ternary Group III-VI indium compound include $InGaS_3$, $InGaSe_3$, $InGaTe_3$, $In_2SSe_2$, and $In_2TeSe_2$.

The quaternary Group III-VI indium compound is a compound containing two elements selected from Group III (first element) in which one is an indium element and two elements selected from Group VI (second element).

Examples of the quaternary Group III-VI indium compound include $InGaSSe_2$, $InGaSeTe_2$, and $InGaSTe_2$.

A semiconductor containing the Group III-VI indium compound may contain an element other than the Group 13 and Group 16 of the periodic table (excluding the element of cadmium) as a doping element.

[I-III-VI Group Indium Compound]

The Group I-III-VI indium compound is a compound containing a Group I element, a Group III element and a Group VI element, and is a compound containing at least an indium element. Here, the Group I means the Group 11 of the periodic table (the same applies hereinafter).

The Group I-III-VI indium compound may be a ternary system or a quaternary system.

The ternary Group I-III-VI indium compound is a compound containing an element selected from Group I (first element), an indium element (second element), and an element selected from Group VI (third element).

Examples of the ternary Group I-III-VI indium compound include $CuInS_2$.

A semiconductor containing the Group I-III-VI indium compound may contain an element other than the Group 11, Group 13, and Group 16 of the periodic table (excluding the element of cadmium) as a doping element.

From the viewpoint of obtaining sufficient emission intensity, the indium compound is preferably InP, $CuInS_2$, InNP, and GaInNP, and more preferably InP and $CuInS_2$.

[Group II-VI Cadmium Compound]

The Group II-VI cadmium compound is a compound containing a Group II element and a Group VI element, and is a compound containing at least a cadmium element. Here, the Group II means the Group 2 or Group 12 of the periodic table (the same applies hereinafter).

The Group II-VI cadmium compound may be a binary system, a ternary system, or a quaternary system.

The binary Group II-VI cadmium compound may be a compound containing a cadmium element (first element) and a Group 16 element (second element), and examples thereof include CdS, CdSe, and CdTe.

The ternary Group II-VI cadmium compound may be a compound containing a cadmium element (first element) and two elements selected from Group VI (second element), or may be a compound containing two elements selected from Group II (first element) in which one is a cadmium element and one element selected from Group VI (second element).

Examples of the ternary Group II-VI cadmium compound include CdSeS, CdSeTe, CdSTe, CdZnS, CdZnSe, CdZnTe, CdHgS, CdHgSe, and CdHgTe.

The quaternary Group II-VI cadmium compound is a compound containing two elements selected from Group II (first element) in which one is a cadmium element and two elements selected from Group VI (second element).

Examples of the quaternary Group II-VI cadmium compound include CdZnSeS, CdZnSeTe, CdZnSTe, CdHgSeS, CdHgSeTe, and CdHgSTe.

A semiconductor containing the Group II-VI cadmium compound may contain an element other than the Group 2, Group 12, and Group 16 of the periodic table (excluding the element of indium) as a doping element.

[Group II-V Cadmium Compound]

The Group II-V cadmium compound is a compound containing a Group II element and a Group V element, and is a compound containing at least a cadmium element.

The Group II-V cadmium compound may be a binary system, a ternary system, or a quaternary system.

The binary Group II-V cadmium compound may be a compound containing a cadmium element (first element) and a Group V element (second element), and examples thereof include $Cd_3P_2$, $Cd_3As_2$, and $Cd_3N_2$.

The ternary Group II-V cadmium compound may be a compound containing a cadmium element (first element) and two elements selected from Group V (second element), or may be a compound containing two elements selected from Group II (first element) in which one is a cadmium element and one element selected from Group V (second element).

Examples of the ternary Group II-V cadmium compound include $Cd_3PN$, $Cd_3PAs$, $Cd_3AsN$, $Cd_2ZnP_2$, $Cd_2ZnAs_2$, and $Cd_2ZnN_2$.

The quaternary Group II-V cadmium compound is a compound containing two elements selected from Group II (first element) in which one is a cadmium element and two elements selected from Group V (second element).

Examples of the quaternary Group II-V cadmium compound include CdZnPN, CdZnPAs, and $Cd_2ZnAsN$.

A semiconductor containing the Group II-V cadmium compound may contain an element other than the Group 2, Group 12, and Group 15 of the periodic table (excluding the element of indium) as a doping element.

From the viewpoint of obtaining sufficient emission intensity, the cadmium compound is preferably CdS, CdSe, ZnCdS, CdSeS, CdSeTe, CdSTe, CdZnS, CdZnSe, CdZnTe, ZnCdSSe, CdZnSeS, CdZnSeTe, or CdZnSTe, more preferably CdS, CdSe, ZnCdS, CdSeS, CdZnS, CdZnSe, ZnCdSSe, or CdZnSeS, still more preferably CdS, CdSe, ZnCdS, ZnCdSSe, or CdZnSeS, and particularly preferably CdSe or CdZnSeS.

The particles of the indium compound and the particles of the cadmium compound may have an inorganic protective layer on the surface of the particles from the viewpoint of emission intensity and durability. The inorganic protective layer may be formed of two or more layers or one layer. Examples of the inorganic material capable of forming the inorganic protective layer include, but are not limited to, a semiconductor having a larger band gap than that of an indium compound and/or a cadmium compound. The inorganic protective layer is formed of a known inorganic material such as ZnS, ZnSe, and CdS.

The particles of the indium compound and the particles of the cadmium compound can be synthesized by a wet chemical process, a metal organic chemical vapor deposition process, or a molecular beam epitaxy process. The wet chemical process is a method in which a precursor material is placed in an organic solvent to grow particles. During crystal growth, the organic solvent naturally coordinates to the surface of the quantum dot crystal and acts as a dispersant to regulate crystal growth, and thus, the growth of nanoparticles can be controlled through an easier and less expensive process compared to vapor deposition methods such as metal organic chemical vapor deposition (MOCVD) and molecular beam epitaxy (MBE).

[Light Scattering Agent]

The first wavelength conversion layer (B1) and/or the second wavelength conversion layer (B2) may further contain a light scattering agent (S) from the viewpoint of efficiently absorbing the incident light. The light scattering agent (S) is not particularly limited, but is preferably a light scattering agent having translucency from the viewpoint of extracting emitted light, and may be, for example, light scattering particles such as inorganic oxide particles. Examples of the inorganic oxide particles include titanium oxide particles.

[Condition (3)]

When the first wavelength conversion layer (B1) further contains a light scattering agent (S), the first wavelength conversion layer (B1) preferably satisfies the condition (3) that the value X3 [X3=(T1×W3)/100] (hereinafter, also abbreviated as X3) obtained by dividing the product of the thickness T1 of the first wavelength conversion layer (B1) and the content ratio W3 of the light scattering agent (S) in the first wavelength conversion layer (B1) by 100 is 1.6 or less, more preferably X3≤1.2, and still more preferably X3≤1.0, from the viewpoint of color gamut and energy efficiency. When the first wavelength conversion layer (B1) further contains a light scattering agent (S), it is usually 0.1≤X3, and preferably 0.5≤X3 from the viewpoint of color gamut and energy efficiency.

When the first wavelength conversion layer (B1) further contains the light scattering agent (S), the content ratio of the light scattering agent (S) in the first wavelength conversion layer (B1) may be, for example, 1% by mass or more and 20% by mass or less, and is preferably 3% by mass or more and 15% by mass or less, from the viewpoint of color gamut and energy efficiency.

[Condition (4)]

When the second wavelength conversion layer (B2) further contains a light scattering agent (S), the second wavelength conversion layer (B2) preferably satisfies the condition (4) that the value X4 [X4=(T2×W4)/100] (hereinafter, also abbreviated as X4) obtained by dividing the product of the thickness T2 of the second wavelength conversion layer (B2) and the content ratio W4 of the light scattering agent (S) in the second wavelength conversion layer (B2) by 100 is 1.6 or less, more preferably X4≤1.2, and still more preferably X4 1.0, from the viewpoint of color gamut and energy efficiency. When the second wavelength conversion layer (B2) further contains a light scattering agent (S), it is usually 0.1≤X4, and preferably 0.3≤X4 from the viewpoint of color gamut and energy efficiency.

When the second wavelength conversion layer (B2) further contains the light scattering agent (S), the content ratio of the light scattering agent (S) in the second wavelength conversion layer (B2) may be, for example, 1% by mass or more and 20% by mass or less, and is preferably 3% by mass or more and 15% by mass or less, from the viewpoint of color gamut and energy efficiency.

The wavelength conversion layer (B) can be used by being bonded to a substrate, a barrier layer, a light scattering layer, or the like.

[Substrate]

The substrate preferably has translucency from the viewpoint of extracting light at the time of light emission. As the substrate, for example, a thermoplastic resin film such as polyethylene terephthalate or a known material such as glass can be used. For example, in the wavelength conversion layer (B), a layer containing a cured product of a curable resin composition (Q) described later can be provided on a substrate.

[Barrier Layer]

In order to protect the wavelength conversion layer (B) from water vapor in the outside air and oxygen in the atmosphere, a barrier layer may be bonded. The barrier layer is not particularly limited, and a known barrier layer can be applied.

[Light Scattering Layer]

A light scattering layer may be bonded from the viewpoint of efficiently absorbing the incident light. The light scattering layer is not particularly limited, but a light scattering layer having translucency is preferable from the viewpoint of extracting emitted light, and a known light scattering layer such as an amplified diffusion film can be applied.

[Method for Producing Wavelength Conversion Layer]

Examples of the method for producing the wavelength conversion layer (B) include a method for producing including a step of preparing a curable resin composition (D), a step of applying the curable resin composition (D) to a substrate, and a step of removing a solvent; a method for producing including a step of preparing a film containing a cured product of a curable resin composition (D), and a step of laminating the obtained film to a substrate; and a method for producing including a step of preparing a curable resin composition (D), a step of applying the curable resin composition (D) to a substrate, and a step of polymerizing a polymerizable compound.

As a method for coating the curable resin composition (D) on the substrate, known coating methods such as a gravure coating method, a bar coating method, a printing method, a spray method, a spin coating method, a dip method, and a die coating method can be used.

An arbitrary adhesive can be used in the step of laminating the film containing a cured product of the curable resin composition (D) on the substrate. The adhesive is not particularly limited as long as the curable resin composition (D) is not dissolved therein, and a known adhesive can be used.

The method for producing the wavelength conversion layer (B) may be a production method including a step of further laminating an arbitrary film. Examples of the arbitrary film to be laminated include a barrier film, a light scattering film, a reflective film, and a diffusion film. An arbitrary adhesive can be used in the step of laminating an arbitrary film. The adhesive described above is not particularly limited as long as the curable resin composition (Q) is not dissolved therein, and a known adhesive can be used.

[Curable Resin Composition]

The wavelength conversion layer (B) may be formed from the curable resin composition (D). The curable resin composition (D) may further contain at least one selected from the group consisting of an organic ligand (L), a light scattering agent (S), a solvent (K), a polymerizable compound (G), and a polymerization initiator (H) in addition to a light-emitting compound (Q1) or a light-emitting compound (Q2).

The content ratio of the light-emitting compound (Q1) in the curable composition (D1) may be, for example, based on the total amount of the solid content of the curable composition (D1), 10% by mass or more and 80% by mass or less, and is preferably 15% by mass or more and 60% by mass or less, and more preferably 15% by mass or more and 40% by mass or less, from the viewpoint of color gamut and energy efficiency.

The content ratio of the light-emitting compound (Q2) in the curable composition (D2) may be, for example, based on the total amount of the solid content of the curable composition (D2), 10% by mass or more and 80% by mass or less, and is preferably 15% by mass or more and 60% by mass or less, and more preferably 15% by mass or more and 40% by mass or less, from the viewpoint of color gamut and energy efficiency.

When the curable resin composition (D1) contains the light scattering agent (S), the content ratio of the light scattering agent (S) in the curable resin composition (D1) may be, for example, based on the total amount of the solid content of the curable composition (D1), 1% by mass or more and 20% by mass or less, and is preferably 3% by mass or more and 15% by mass or less, from the viewpoint of color gamut and energy efficiency.

When the curable resin composition (D2) contains the light scattering agent (S), the content ratio of the light scattering agent (S) in the curable resin composition (D2) may be, for example, based on the total amount of the solid content of the curable composition (D2), 1% by mass or more and 20% by mass or less, and is preferably 3% by mass or more and 15% by mass or less, from the viewpoint of color gamut and energy efficiency.

[Organic Ligand]

The organic ligand (L) may be either a non-polar organic ligand or a polar organic ligand. Examples of the non-polar organic ligand include a linear or branched saturated or unsaturated aliphatic acid having 1 to 30 carbon atoms, an aliphatic amine, and an aliphatic thiol. The number of carbon atoms is preferably 6 to 20. The number of polar groups is preferably 2 or less per molecule. The polar group is preferably a thiol group or a carboxy group.

Examples of the polar organic ligand include a compound (La) having a polyalkylene glycol structure represented by the following formula and having a polar group at a molecular end.

[Formula 1]

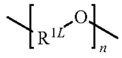

In the formula, $R^{1L}$ is an alkylene group, and examples thereof include an ethylene group and a propylene group.

Specific examples of the compound (La) include a polyalkylene glycol-based compound represented by the following formula (La-1):

[Formula 2]

(La-1)

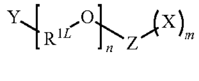

[In the formula (La-1), X is a polar group, Y is a monovalent group, and Z is a divalent or trivalent group. n is an integer of 2 or more. m is 1 or 2. $R^{1L}$ is the same as the above definition.]

The polar group may be, for example, a carboxy group, a thiol group, and an amino group, preferably a carboxy group and a thiol group.

Y may be, for example, a monovalent hydrocarbon group optionally having a substituent (N, O, S, a halogen atom, or the like), and is preferably an alkyl group having a linear, branched, or cyclic structure and having 1 to 12 carbon atoms, or an alkoxy group having a linear, branched, or cyclic structure and having 1 to 12 carbon atoms.

Z may be, for example, a divalent or trivalent hydrocarbon group optionally containing a heteroatom (N, O, S, a halogen atom, or the like), and is preferably an alkylene group having a linear, branched, or cyclic structure and having 1 to 24 carbon atoms, or an alkenylene group having a linear, branched, or cyclic structure and having 1 to 24 carbon atoms.

The molecular weight of compound (B) is preferably 100 or more and 2000 or less.

The curable resin composition may contain only one compound (B) or two or more thereof. The molecular weight is preferably 100 or more and 2000 or less.

[Resin]

The resin (F) is preferably an alkali-soluble resin. Examples of the resin (F) include the following resins [f1] to [f4]:

resin [f1]: resin obtained by copolymerizing at least one (a) (hereinafter also referred to as "(a)") selected from the group consisting of an unsaturated carboxylic acid and an unsaturated carboxylic acid anhydride and a monomer (c) (hereinafter also referred to as "(c)") copolymerizable with (a) (but different from (a));

resin [f2]: resin obtained by reacting a copolymer of (a) and (c) with a monomer (b) (hereinafter also referred to as "(b)") having a cyclic ether structure having 2 to 4 carbon atoms and an ethylenically unsaturated bond;

resin [f3]: resin obtained by reacting a copolymer of (b) and (c) with (a); and resin [f4]: resin obtained by reacting a copolymer of (b) and (c) with (a) and further reacting with a carboxylic acid anhydride.

Examples of (a) include unsaturated monocarboxylic acids such as acrylic acid, methacrylic acid, crotonic acid, and o-, m-, and p-vinylbenzoic acid;

unsaturated dicarboxylic acids such as maleic acid, fumaric acid, citraconic acid, mesaconic acid, itaconic acid, 3-vinylphthalic acid, 4-vinylphthalic acid, 3,4,5,6-tetrahydrophthalic acid, 1,2,3,6-tetrahydrophthalic acid, dimethyltetrahydrophthalic acid, and 1,4-cyclohexenedicarboxylic acid;

bicyclo unsaturated compounds containing a carboxy group, such as methyl-5-norbornene-2,3-dicarboxylic acid, 5-carboxybicyclo[2.2.1]hept-2-ene, 5,6-dicarboxybicyclo[2.2.1]hept-2-ene, 5-carboxy-5-methylbicyclo[2.2.1]hept-2-ene, 5-carboxy-5-ethylbicyclo[2.2.1]hept-2-ene, 5-carboxy-6-methylbicyclo[2.2.1]hept-2-ene, and 5-carboxy-6-ethylbicyclo[2.2.1]hept-2-ene;

unsaturated dicarboxylic acid anhydrides such as maleic anhydride, citraconic anhydride, itaconic anhydride, 3-vinylphthalic anhydride, 4-vinylphthalic anhydride, 3,4,5,6-tetrahydrophthalic anhydride, 1,2,3,6-tetrahydrophthalic anhydride, dimethyltetrahydrophthalic anhydride, and 5,6-dicarboxybicyclo[2.2.1]hept-2-ene anhydride;

unsaturated mono[(meth)acryloyloxyalkyl]esters of di- or higher polycarboxylic acids such as mono[2-(meth)acryloyloxyethyl]succinate and mono[2-(meth)acryloyloxyethyl]phthalate; and unsaturated acrylates containing a hydroxy group and a carboxy group in the same molecule, such as α-(hydroxymethyl) acrylic acid.

Of these, acrylic acid, methacrylic acid, maleic anhydride and the like are preferable from the viewpoint of copolymerization reactivity and solubility of the obtained resin in an alkaline aqueous solution.

(b) is, for example, a monomer having a cyclic ether structure having 2 to 4 carbon atoms (for example, at least one selected from the group consisting of an oxirane ring, an oxetane ring, and a tetrahydrofuran ring) and an ethylenically unsaturated bond. (b) is preferably a monomer having a cyclic ether structure having 2 to 4 carbon atoms and a (meth)acryloyloxy group.

Examples of (b) include monomers having an oxirane ring and an ethylenically unsaturated bond, such as glycidyl (meth) acrylate, β-methylglycidyl (meth) acrylate, β-ethylglycidyl (meth)acrylate, glycidyl vinyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-bis(glycidyloxymethyl)styrene, 2,4-bis(glycidyloxymethyl)styrene, 2,5-bis(glycidyloxymethyl) styrene, 2,6-bis(glycidyloxymethyl)styrene, 2,3,4-tris (glycidyloxymethyl) styrene, 2,3,5-tris(glycidyloxymethyl) styrene, 2,3,6-tris(glycidyloxymethyl) styrene, 3,4,5-tris (glycidyloxymethyl)styrene, and 2,4,6-tris (glycidyloxymethyl) styrene;

monomers having an oxetane ring and an ethylenically unsaturated bond, such as 3-methyl-3-methacryloyloxymethyloxetane, 3-methyl-3-acryloyloxymethyloxetane, 3-ethyl-3-methacryloyloxymethyloxetane, 3-ethyl-3-acryloyloxymethyloxetane, 3-methyl-3-methacryloyloxyethyloxetane, 3-methyl-3-acryloyloxyethyloxetane, 3-ethyl-3-methacryloyloxyethyloxetane, and 3-ethyl-3-acryloyloxyethyloxetane; and monomers having a tetrahydrofuran ring and an ethylenically unsaturated bond, such as tetrahydrofurfuryl acrylate (for example, Viscoat V #150, manufactured by OSAKA ORGANIC CHEMICAL INDUSTRY LTD.) and tetrahydrofurfuryl methacrylate.

(b) is preferably a monomer having an oxirane ring and an ethylenically unsaturated bond, because the reactivity during the production of the resins [f2] to [f4] is high and unreacted (b) is unlikely to remain.

Examples of (c) include (meth)acrylic esters such as methyl (meth)acrylate, ethyl (meth)acrylate, n-butyl (meth) acrylate, sec-butyl (meth) acrylate, tert-butyl (meth) acrylate, 2-ethylhexyl (meth) acrylate, dodecyl (meth)acrylate, lauryl (meth)acrylate, stearyl (meth) acrylate, cyclopentyl (meth) acrylate, cyclohexyl (meth) acrylate, 2-methylcyclohexyl (meth) acrylate, tricyclo[5.2.1.0$^{2,6}$]decan-8-yl (meth) acrylate (common name in the art: dicyclopentanyl (meth) acrylate or tricyclodecyl (meth)acrylate), tricyclo[5.2.1.0$^{2,6}$]decen-8-yl (meth)acrylate (common name in the art: dicyclopentenyl (meth) acrylate), dicyclopentanyloxyethyl (meth) acrylate, isobornyl (meth) acrylate, adamantyl (meth) acrylate, allyl (meth)acrylate, propargyl (meth)acrylate, phenyl (meth)acrylate, naphthyl (meth)acrylate, and benzyl (meth)acrylate;

hydroxy group-containing (meth)acrylic esters such as 2-hydroxyethyl (meth)acrylate and 2-hydroxypropyl (meth)acrylate;

dicarboxylic diesters such as diethyl maleate, diethyl fumarate, and diethyl itaconate;

bicyclo unsaturated compounds such as bicyclo[2.2.1]hept-2-ene, 5-methylbicyclo[2.2.1]hept-2-ene, 5-ethylbicyclo[2.2.1]hept-2-ene, 5-hydroxybicyclo[2.2.1]hept-2-ene, 5-hydroxymethylbicyclo[2.2.1]hept-2-ene, 5-(2'-hydroxyethyl)bicyclo[2.2.1]hept-2-ene, 5-methoxybicyclo[2.2.1]hept-2-ene, 5-ethoxybicyclo[2.2.1]hept-2-ene, 5,6-dihydroxybicyclo[2.2.1]hept-2-ene, 5,6-di(hydroxymethyl)bicyclo[2.2.1]hept-2-ene, 5,6-di(2'-hydroxyethyl)bicyclo[2.2.1]hept-2-ene, 5,6-dimethoxybicyclo[2.2.1]hept-2-ene, 5,6-diethoxybicyclo[2.2.1]hept-2-ene, 5-hydroxy-5-methylbicyclo[2.2.1]hept-2-ene, 5-hydroxy-5-ethylbicyclo[2.2.1]hept-2-ene, 5-hydroxymethyl-5-methylbicyclo[2.2.1]hept-2-ene, 5-tert-butoxycarbonylbicyclo[2.2.1]hept-2-ene, 5-cyclohexyloxycarbonylbicyclo[2.2.1]hept-2-ene, 5-phenoxycarbonylbicyclo[2.2.1]hept-2-ene, 5,6-bis(tert-butoxycarbonyl)bicyclo[2.2.1]hept-2-ene, and 5,6-bis(cyclohexyloxycarbonyl)bicyclo[2.2.1]hept-2-ene;

dicarbonylimide derivatives such as N-phenylmaleimide, N-cyclohexylmaleimide, N-benzylmaleimide, N-succinimidyl-3-maleimidobenzoate, N-succinimidyl-4-maleimidobutyrate, N-succinimidyl-6-maleimide caproate, N-succinimidyl-3-maleimide propionate, and N-(9-acridinyl)maleimide; and styrene, α-methylstyrene, m-methylstyrene, p-methylstyrene, vinyltoluene, p-methoxystyrene, acrylonitrile, methacrylonitrile, vinyl chloride, vinylidene chloride, acrylamide, methacrylamide, vinyl acetate, 1,3-butadiene, isoprene, and 2,3-dimethyl-1,3-butadiene.

Among these, from the viewpoint of copolymerization reactivity and heat resistance of the resin (B), styrene, vinyltoluene, N-phenylmaleimide, N-cyclohexylmaleimide, N-benzylmaleimide, bicyclo[2.2.1]hept-2-ene and the like are preferable.

In the resin [f1], the ratio of the structural units derived from each monomer is preferably such that the structural unit derived from (a) is 2 mol % or more and 70 mol % or less and the structural unit derived from (c) is 30 mol % or more and 98 mol % or less, based on the total structural units constituting the resin [f1]. It is more preferable that the structural unit derived from (a) is 10 mol % or more and 70 mol % or less and the structural unit derived from (c) is 30 mol % or more and 90 mol % or less.

When the ratio of the structural units of the resin [f1] is within the above range, the curable composition tends to be excellent in storage stability, developability when forming a cured pattern, and solvent resistance of the obtained cured pattern.

The resin [f1] can be produced with reference to the method disclosed in for example, a document "Experimental Method for Polymer Synthesis" (edited by Takayuki Otsu, published by Kagaku-Dojin Publishing Company, INC, First Edition, First Printed on Mar. 1, 1972) and cited documents described in the above-mentioned document.

Specific examples thereof include the following method: predetermined amounts of (a) and (c), a polymerization initiator, and a solvent are placed in a reaction vessel; for example, a deoxidization atmosphere is formed by substituting oxygen with nitrogen; and these are heated or kept warm during stirring. The polymerization initiator and the solvent used here are not particularly limited, and those commonly used in the art can be used. Examples of the polymerization initiator include azo compounds (2,2'-azobisisobutyronitrile, 2,2'-azobis(2,4-dimethylvaleronitrile) and the like) and organic peroxides (benzoyl peroxide and the like). The solvent may be any solvent capable of dissolving the monomers, and examples of the solvent (K) that may be contained in the curable composition of the present invention include solvents to be described later.

A solution after a reaction, of the resultant copolymer may be used as it is; a concentrated or diluted solution of the copolymer may be used; or a solid (powder) taken out from the copolymer by a method such as reprecipitation may be used. In particular, by using the solvent (K) described later as the solvent for this polymerization, the solution after the reaction can be used as it is for the preparation of the curable composition of the present invention, whereby the producing process of the curable composition of the present invention can be simplified.

The resin [f2] can be produced by obtaining the copolymer of (a) and (c), and adding a cyclic ether having 2 to 4 carbon atoms of (b) to a carboxylic acid and/or a carboxylic acid anhydride derived from (a).

The copolymer of (a) and (c) is first produced in the same manner as in the method described as the production method of the resin [f1]. In this case, the ratio of the structural units derived from each is preferably the same as that described in the resin [f1].

Next, the cyclic ether having 2 to 4 carbon atoms of (b) is added to a part of the carboxylic acid and/or the carboxylic acid anhydride derived from (a) in the copolymer.

Subsequent to the production of the copolymer of (a) and (c), the resin [f2] can be produced by replacing a nitrogen atmosphere in a flask with air, and placing (b), a reaction catalyst for reaction between the carboxylic acid or carboxylic acid anhydride and a cyclic ether (for example, tris (dimethylaminomethyl)phenol), and a polymerization inhibitor (for example, hydroquinone), for example, at 60 to 130° C. for 1 to 10 hours.

The amount of (b) used is preferably 5 mol or more and 80 mol or less, and more preferably 10 mol or more and 75 mol or less, based on 100 mol of (a). Within this range, the storage stability of the curable composition, the developability when forming the cured pattern, and the solvent resistance, heat resistance, mechanical strength and sensitivity of the cured pattern tend to be well balanced.

The amount of the reaction catalyst used is preferably 0.001 part by mass or more and 5 parts by mass or less based on 100 parts by mass of the total amount of (a), (b), and (c). The amount of the polymerization inhibitor used is preferably 0.001 part by mass or more and 5 parts by mass or less based on 100 parts by mass of the total amount of (a), (b), and (c).

The reaction conditions such as the charging method, the reaction temperature and the time can be appropriately adjusted in consideration of the production equipment, the amount of heat generated by the polymerization, and the like. In the same manner as the polymerization conditions, the charging method and the reaction temperature can be appropriately adjusted in consideration of the production equipment, the amount of heat generated by the polymerization, and the like.

The resin [f3] is produced by producing a copolymer of (b) and (c) in the same manner as in the above-mentioned method for producing the resin [f1] as a first step. In the same manner as in the above, a solution after a reaction, of the resultant copolymer may be used as it is; a concentrated or diluted solution of the copolymer may be used; or a solid (powder) taken out from the copolymer by a method such as reprecipitation may be used.

The ratios of the structural units derived from (b) and (c) are preferably such that the structural unit derived from (b) is 5 mol % or more and 95 mol % or less and the structural unit derived from (c) is 5 mol % or more and 95 mol % or less based on the total number of moles of all structural units constituting the copolymer. It is more preferable that the structural unit derived from (b) is 10 mol % or more and 90 mol % or less and the structural unit derived from (c) is 10 mol % or more and 90 mol % or less.

Further, under the same conditions as the method for producing the resin [f2], the resin [f3] can be obtained by adding a carboxylic acid or carboxylic acid anhydride of (a) to the cyclic ether derived from (b) contained in the copolymer of (b) and (c).

The amount of (a) used to be reacted with the copolymer is preferably 5 mol or more and 80 mol or less based on 100 mol of (b).

The resin [f4] is a resin obtained by further reacting the resin [f3] with a carboxylic acid anhydride. A carboxylic acid anhydride is added to the hydroxy group generated by a reaction between a cyclic ether and a carboxylic acid or a carboxylic anhydride.

Examples of the carboxylic acid anhydride include maleic anhydride, citraconic anhydride, itaconic anhydride, 3-vinylphthalic anhydride, 4-vinylphthalic anhydride, 3,4,5,6-tetrahydrophthalic anhydride, 1,2,3,6-tetrahydrophthalic anhydride, dimethyltetrahydrophthalic anhydride, 5,6-dicarboxybicyclo[2.2.1]hept-2-ene anhydride. The amount of the carboxylic acid anhydride used is preferably 0.5 to 1 mol based on 1 mol of the amount used in (a).

Specific examples of the resin (F) include a resin [f1] such as a benzyl (meth)acrylate/(meth)acrylic acid copolymer and a styrene/(meth)acrylic acid copolymer; a resin [f2] such as a resin produced by adding glycidyl (meth)acrylate to a benzyl (meth)acrylate/(meth)acrylic acid copolymer, a resin produced by adding glycidyl (meth)acrylate to a tricyclodecyl (meth)acrylate/styrene/(meth)acrylic acid copolymer, or a resin produced by adding glycidyl (meth)acrylate to a tricyclodecyl (meth)acrylate/benzyl (meth)acrylate/(meth) acrylic acid copolymer; a resin [f3] such as a resin produced by reacting a tricyclodecyl (meth)acrylate/glycidyl (meth) acrylate copolymer with (meth)acrylic acid or a resin produced by reacting a tricyclodecyl (meth)acrylate/styrene/ glycidyl (meth)acrylate copolymer with (meth)acrylic acid; and a resin [f4] such as a resin produced by reacting a tricyclodecyl (meth)acrylate/glycidyl (meth)acrylate copolymer with (meth)acrylic acid to produce a resin and then reacting this resin with tetrahydrophthalic anhydride.

Further examples of the resin (F) include a resin [f5] containing a structural unit containing a tetrahydropyran ring in the main chain. When the resin (F) contains the resin [f5] containing a structural unit containing a tetrahydropyran ring in the main chain, excellent emission intensity and heat resistance in the cured film can be obtained in the cured film. The structural unit containing a tetrahydropyran ring may be a structural unit represented by the following general formula (I):

[Formula 3]

(I)

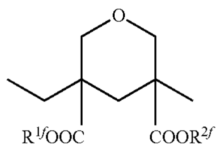

[In the formula, $R^{1f}$ and $R^{2f}$ are the same or different and each represent a hydrogen atom or a hydrocarbon group having 1 to 25 carbon atoms. This hydrocarbon group may have a substituent.]

The content of the structural unit represented by general formula (I) in the resin [f5] may be, for example, based on the total amount of the resin [f5], 0.5% by mass or more and 50% by mass or less, and is preferably 1% by mass or more and 40% by mass or less, and more preferably 5% by mass or more and 30% by mass or less, from the viewpoint of emission intensity and heat resistance.

Examples of the hydrocarbon group having 1 to 25 carbon atoms in $R^{1f}$ and $R^{2f}$ include linear or branched alkyl groups; aryl groups; cycloaliphatic groups; alkyl groups substituted with alkoxy groups; alkyl groups substituted with aryl groups; and the like, which are exemplified in [0037] of Japanese Patent Laid-Open No. 2013-61599. $R^{1f}$ and $R^{2f}$ are preferably hydrocarbon groups of primary or secondary carbons which are not easily eliminated by acids or heat from the viewpoint of emission intensity and heat resistance of devices, and examples thereof include a methyl group, an ethyl group, a cyclohexyl group, and a benzyl group.

The resin [f5] may further include a structural unit represented by general formula (II) and a structural unit represented by general formula (III) in addition to the structural unit represented by general formula (I).

[Formula 4]

(II)

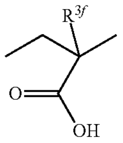

[In the formula, $R^{3f}$ represents a hydrogen atom or a methyl group.]

[Formula 5]

(III)

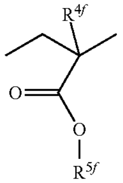

[In the formula, $R^{4f}$ represents a hydrogen atom or a methyl group. $R^{5f}$ represents a saturated or unsaturated linear, branched or cyclic hydrocarbon group having 1 to 20 carbon atoms. This hydrocarbon group may have a substituent.]

$R^{3f}$ is preferably a methyl group. $R^{4f}$ is preferably a methyl group. $R^{5f}$ is preferably a saturated or unsaturated linear, branched, or cyclic hydrocarbon group having 1 to 16 carbon atoms, more preferably a saturated linear or cyclic hydrocarbon group having 1 to 10 carbon atoms, and particularly preferably a methyl group or a cyclohexyl group. The hydrocarbon group in $R^{5f}$ may have a substituent, but preferably does not have a substituent. Examples of the substituent include a hydroxyl group. The hydrocarbon group in $R^{5f}$ may have an ether group.

The resin [f5] may further contain a structural unit derived from a compound having a functional group that can be bonded to an acid group described later and a polymerizable double bond (hereinafter also referred to as compound (X)). When the resin [f5] further contains a structural unit derived from the compound (X), the resin [f5] can further contain a structural unit derived from the carboxylic acid anhydride described later.

When the resin [f5] contains the structural unit represented by the general formula (II), the content of the structural unit represented by the general formula (II) may be, for example, based on the total amount of the resin [f5], 0.5% by mass or more and 50% by mass or less, and is preferably 2% by mass or more and 50% by mass or less, and more preferably 5% by mass or more and 45% by mass or less, from the viewpoint of emission intensity and heat resistance.

When the resin [f5] contains the structural unit represented by the general formula (III), the content of the structural unit represented by the general formula (III) may be, for example, based on the total amount of the resin [f5], 10% by mass or more and 90% by mass or less, and is preferably 20% by mass or more and 80% by mass or less, and more preferably 30% by mass or more and 75% by mass or less, from the viewpoint of emission intensity and heat resistance.

The resin [f5] is preferably a polymer containing the structural units represented by the general formulas (I) to (III) in the main chain, and more preferably, the main chain is a polymer composed of the structural units represented by the general formulas (I) to (III).

When the resin [f5] further contains the structural unit represented by the general formula (II) and the structural unit represented by the general formula (III), the resin [f5] may contain 0.5% by mass or more and 50% by mass or less of the structural unit represented by the general formula (I), 9.5% by mass or more and 40% by mass or less of the structural unit represented by the general formula (II), and 10% by mass or more and 90% by mass or less of the structural unit represented by the general formula (III) based on the total amount of the polymer.

The weight-average molecular weight of the resin [f5] may be, for example, 1000 or more and 200000 or less. The weight-average molecular weight of the resin [f5] is preferably 3000 or more, more preferably 4000 or more, still more preferably 5000 or more, and further preferably 6000 or more, from the viewpoint of emission intensity and heat resistance. The weight-average molecular weight of the resin [f5] is preferably 30000 or less, more preferably 20000 or less, still more preferably 15000 or less, and further preferably 10000 or less, from the viewpoint of emission intensity and heat resistance. The weight-average molecular weight as used herein can be determined by the method described in Examples described later.

The resin [f5] may have a double bond equivalent of, for example, 200 or more and 2000 or less. The resin [f5] may be a polymer containing a double bond (that is, an ethylenically unsaturated group) in the side chain and having double bonds equivalents of 200 or more and 2000 or less. The double bond equivalent is preferably 300 or more, more preferably 400 or more, still more preferably 450 or more, and particularly preferably 490 or more. Further, the double bond equivalent is preferably 1900 or less. The polymer having no double bond in the side chain has no double bond equivalent.

The double bond equivalent is a measure of the amount of double bonds contained in the molecule and means the molecular weight per double bond of the polymer. For compounds of the same molecular weight, the higher the double bond equivalent, the lower the amount of double bond introduced. The double bond equivalent can be calculated from the charge amount of the raw material and can be obtained by dividing the mass (g) of the polymer solid content by the double bond amount (mol) of the polymer. It can also be measured by various analyses such as titration and elemental analysis, NMR, IR, and differential scanning calorimetry.

The resin [f5] may have an acid value of, for example, 20 mg KOH/g or more and 300 mg KOH/g or less. The acid value of the resin [f5] is preferably 40 mg KOH/g or more, more preferably 60 mg KOH/g or more, and still more preferably 80 mg KOH/g or more. Further, the acid value is preferably 200 mg KOH/g or less, more preferably 150 mg KOH/g or less, and still more preferably 120 mg KOH/g or less.

[Production of Resin [f5]]

The resin [f5] is preferably obtained by, for example, reacting a polymer (also referred to as a base polymer) obtained by polymerizing a monomer component comprising a monomer (5a) represented by the general formula (i), an acid group-containing monomer (5b), and a monomer (5c) represented by the general formula (iii) with a compound (X) having a functional group that can be bonded to an acid group and a polymerizable double bond. Each reaction raw material can be used alone or in combination of two or more.

[Monomer (5a)]

The monomer (5a) is a monomer represented by the following general formula (i). The symbols in the formula are the same as the symbols in the formula (I). It is presumed that when the monomer (5a) is used in the polymerization reaction, the monomer (5a) undergoes a cyclization reaction during the polymerization to form a tetrahydropyran ring structure in the structural unit of the polymer.

[Formula 6]

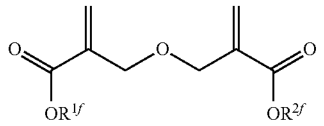

(i)

In the general formula (i), the definitions and preferable ranges in the above formula (I) are applied to $R^{1f}$ and $R^{2f}$.

Specific examples of the monomer (5a) include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate.

Of these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, or dibenzyl-2,2'-[oxybis(methylene)]bis-2-propenoate is preferable. From the viewpoint of less coloring, dispersibility, and ease of industrial availability, dimethyl-2,2'-[oxybis(methylene)]bis-2-propenoate is more preferable.

The content proportion of the monomer (5a) may be, for example, 0.5% by mass or more and 50% by mass, preferably 1% by mass or more and 40% by mass or less, and more preferably 5% by mass or more and 30% by mass or less based on 100% by mass of the total amount of all monomer components giving the base polymer.

[Monomer (5b)]

The monomer (5b) is an acid group-containing monomer. The acid group is not particularly limited, and may be, for example, a carboxyl group or a carboxylic acid anhydride group, preferably a carboxyl group, and more preferably a (meth)acrylic acid group.

Examples of the monomer (5b) include unsaturated monocarboxylic acids such as (meth)acrylic acid, crotonic acid, cinnamic acid, and vinylbenzoic acid; unsaturated polycarboxylic acids such as maleic acid, fumaric acid, itaconic acid, citraconic acid, and mesaconic acid; unsaturated monocarboxylic acids in which one or more repeating unit exist between an unsaturated group and a carboxyl group, such as mono(2-acryloyloxyethyl) succinate and mono(2-methacryloyloxyethyl) succinate; unsaturated acid anhydrides such as maleic anhydride and itaconic acid anhydride; and unsaturated phosphoric acid group-containing compounds such as LIGHT ESTER P-1M (manufactured by KYOEISHA CHEMICAL Co., Ltd.). Among these, carboxylic acid-based monomers (unsaturated monocarboxylic acids, unsaturated polycarboxylic acids, and unsaturated acid anhydrides) are preferable from the viewpoints of versatility, availability, and the like. From the viewpoints of reactivity, alkali solubility, and the like, unsaturated monocarboxylic acids are more preferable, and (meth)acrylic acid is still more preferable. Here, the term (meth)acrylic acid means acrylic acid and/or methacrylic acid.

The content proportion of the monomer (5b) is preferably set so that the acid value is within the above preferred range. The content proportion of the monomer (5b) may be, for example, 0.5% by mass or more and 50% by mass or less, preferably 2% by mass or more and 50% by mass or less, and more preferably 5% by mass or more and 45% by mass or less based on 100% by mass of the total amount of all monomer components giving the base polymer.

When (meth)acrylic acid is used as the monomer (5b), the obtained resin [f5] has a structural unit represented by the general formula (II).

[Monomer (5c)]

The monomer (5c) is a monomer represented by the following general formula (iii). The symbols in the formula are the same as the symbols in the general formula (III). A structural unit represented by general formula (III) is derived and formed from the monomer (5c).

[Formula 7]

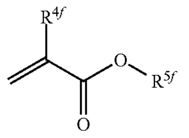

(iii)

In the general formula (iii), the definitions and preferable ranges in the above formula (I) are applied to $R^{4f}$ and $R^{5f}$.

Examples of the monomer (5c) include linear hydrocarbon group-containing (meth)acrylate compounds such as methyl (meth)acrylate, ethyl (meth)acrylate, propyl (meth) acrylate, n-butyl (meth) acrylate, hexyl (meth)acrylate, octyl (meth)acrylate, lauryl (meth)acrylate, and stearyl (meth) acrylate;

branched chain hydrocarbon group-containing (meth) acrylate compounds such as isopropyl (meth)acrylate, sec-butyl (meth)acrylate, tert-butyl (meth)acrylate, amyl (meth) acrylate, 2-ethylhexyl (meth) acrylate, isodecyl (meth)acrylate, tridecyl (meth)acrylate, and isooctyl (meth) acrylate;

cyclic hydrocarbon group-containing (meth)acrylate compounds such as cyclopentyl (meth)acrylate, cyclohexyl (meth) acrylate, 2-methylcyclohexyl (meth) acrylate, tricyclo[5.2.1.$0^{2,6}$]decan-8-yl (meth)acrylate (referred to as "dicyclopentanyl (meth)acrylate" (common name) in the art or sometimes referred to as "tricyclodecyl (meth)acrylate"), tricyclo[5.2.1.$0^{2,6}$]decen-8-yl (meth)acrylate (which is referred to as "dicyclopentenyl (meth)acrylate" (common name) in the art), dicyclopentanyloxyethyl (meth) acrylate, isobornyl (meth)acrylate, and adamantyl (meth)acrylate; unsaturated hydrocarbon group-containing (meth)acrylate compounds such as allyl (meth)acrylate, propargyl (meth)acrylate, phenyl (meth)acrylate, naphthyl (meth) acrylate, and benzyl (meth) acrylate;

hydroxy group-containing (meth)acrylate compounds such as 2-hydroxyethyl (meth)acrylate, 2-hydroxypropyl (meth)acrylate, 2-hydroxybutyl (meth)acrylate, 3-hydroxybutyl (meth)acrylate, and 4-hydroxybutyl (meth) acrylate;

ether group-containing (meth)acrylate compounds such as 2-ethoxyethyl (meth)acrylate; and the like. Among these, alkyl (meth)acrylate compounds are preferable from the viewpoint of improving solvent resistance.

The content proportion of the monomer (5c) may be, for example, 10% by mass or more and 90% by mass or less, preferably 20% by mass or more and 80% by mass or less, and more preferably 30% by mass or more and 75% by mass or less based on 100% by mass of the total amount of all monomer components giving the base polymer.

[Monomer (5d)]

The resin [f5] may also contain one or more structural units derived from other monomers (also referred to as monomers (5d)) copolymerizable with the monomers (5a), (5b) and/or (5c) described above. That is, the monomer component giving the base polymer may further contain the monomer (5d).

Examples of the monomer (5d) include aromatic vinyl compounds such as styrene, vinyltoluene, and α-methylstyrene; ethylene or substituted ethylene compounds such as ethylene, propylene, vinyl chloride, and acrylonitrile; vinyl esters such as vinyl acetate;

dicarboxylic diesters such as diethyl maleate, diethyl fumarate, and diethyl itaconate;

bicyclo unsaturated compounds such as bicyclo[2.2.1]hept-2-ene, 5-methylbicyclo[2.2.1]hept-2-ene, 5-ethylbicyclo[2.2.1]hept-2-ene, 5-hydroxybicyclo[2.2.1]hept-2-ene, 5-hydroxymethylbicyclo[2.2.1]hept-2-ene, 5-(2'-hydroxyethyl)bicyclo[2.2.1]hept-2-ene, 5-methoxybicyclo[2.2.1]hept-2-ene, 5-ethoxybicyclo[2.2.1]hept-2-ene, 5,6-dihydroxybicyclo[2.2.1]hept-2-ene, 5,6-di(hydroxymethyl)bicyclo[2.2.1]hept-2-ene, 5,6-di(2'-hydroxyethyl)bicyclo[2.2.1]hept-2-ene, 5,6-dimethoxybicyclo[2.2.1]hept-2-ene, 5,6-diethoxybicyclo[2.2.1]hept-2-ene, 5-hydroxy-5-methylbicyclo[2.2.1]hept-2-ene, 5-hydroxy-5-ethylbicyclo[2.2.1]hept-2-ene, 5-hydroxymethyl-5-methylbicyclo[2.2.1]hept-2-ene, 5-tert-butoxycarbonylbicyclo[2.2.1]hept-2-ene, 5-cyclohexyloxycarbonylbicyclo[2.2.1]hept-2-ene, 5-phenoxycarbonylbicyclo[2.2.1]hept-2-ene, 5,6-bis(tert-butoxycarbonyl)bicyclo[2.2.1]hept-2-ene, and 5,6-bis(cyclohexyloxycarbonyl)bicyclo[2.2.1]hept-2-ene;

dicarbonylimide derivatives such as N-phenylmaleimide, N-cyclohexylmaleimide, N-benzylmaleimide, N-succinimidyl-3-maleimidobenzoate, N-succinimidyl-4-maleimidobutyrate, N-succinimidyl-6-maleimide caproate, N-succinimidyl-3-maleimide propionate, and N-(9-acridinyl)maleimide; and styrene, α-methylstyrene, m-methylstyrene, p-methylstyrene, vinyltoluene, p-methoxystyrene, acrylonitrile, methacrylonitrile, vinyl chloride, vinylidene chloride, acrylamide, methacrylamide, vinyl acetate, 1,3-butadiene, isoprene, and 2,3-dimethyl-1,3-butadiene. Among these, styrene, vinyltoluene, N-phenylmaleimide, N-cyclohexylmaleimide, N-benzylmaleimide, and bicyclo[2.2.1]hept-2-ene are preferable.

The content proportion of the monomer (5d) may be, but not limited to, for example, 50% by mass or less, preferably 25% by mass or less, and more preferably 10% by mass or less based on 100% by mass of the total amount of all monomer components giving the base polymer. Further, the content proportion of the monomer (5d) may be, for example, more than 0% by mass, 0.001% by mass or more, or 0.01% by mass or more.

As a method for polymerizing the monomer component, a commonly used technique such as bulk polymerization, solution polymerization, or emulsion polymerization can be used, and may be appropriately selected according to the purpose and application. Among these, solution polymerization is preferable because it is industrially advantageous and it is easy to adjust the structure such as molecular weight. As the polymerization mechanism of the monomer component, a polymerization method based on a mechanism such as radical polymerization, anionic polymerization, cationic polymerization, or coordination polymerization can be used, but a polymerization method based on a radical polymerization mechanism is preferable because it is industrially advantageous. A preferred embodiment of the polymerization reaction is as disclosed in paragraphs [0062] to [0072] of Japanese Patent Laid-Open No. 2016-29151.

As described above, the resin [f5] is preferably obtained by reacting the base polymer with a compound (X) having a functional group that can be bonded to an acid group and a polymerizable double bond.

Examples of the polymerizable double bond of the compound (X) include a (meth)acryloyl group, a vinyl group, an allyl group, and a methallyl group, and a compound having one or two or more of these are preferable. In terms of reactivity, the polymerizable double bond is preferably a (meth)acryloyl group. Examples of the functional group that can be bonded to an acid group include a hydroxy group, an epoxy group, an oxetanyl group, and an isocyanate group, and a compound having one or two or more of these is preferable. Of these, an epoxy group (including a glycidyl group) is preferable.

Examples of the compound (X) include glycidyl (meth) acrylate, β-methylglycidyl (meth) acrylate, β-ethylglycidyl (meth)acrylate, vinylbenzyl glycidyl ether, allyl glycidyl ether, (3,4-epoxycyclohexyl)methyl (meth)acrylate, and vinylcyclohexene oxide. Of these, a compound (monomer) having an epoxy group and a (meth)acryloyl group is preferable. In particular, glycidyl (meth)acrylate and/or (3,4-epoxycyclohexyl)methyl (meth)acrylate are used because they are highly reactive, easy to control the reaction, readily available, and capable of introducing not only a radically polymerizable double bond but also a hydroxyl group at the same time.

The addition amount of the compound (X) is not particularly limited as long as the double bond equivalent of the resin [f5] falls within the above range, but may be, for example, based on 100 parts by mass of the total amount of the monomer components giving the base polymer, 2 parts by mass or more and 60 parts by mass or less, preferably 10 parts by mass or more and 55 parts by mass or less, more preferably 10 parts by mass or more and 50 parts by mass or less, and still more preferably 10 parts by mass or more and 45 parts by mass or less.

The method for reacting the compound (X) with (a part of) the acid group in the base polymer is not particularly limited, and a known addition method or the like may be employed. The reaction temperature is preferably, for example, 60° C. to 140° C. It is also preferable to use a known catalyst such as an amine compound such as triethylamine or dimethylbenzylamine; an ammonium salt such as tetraethylammonium chloride; a phosphonium salt such as tetraphenylphosphonium bromide; or an amide compound such as dimethylformamide.

The resin [f5] may also be prepared by reacting the base polymer with the compound (X) and further reacting the resulting product with a carboxylic acid anhydride. In this case, carboxylic acid anhydride is reacted with a hydroxy group generated by a reaction between a cyclic ether and a carboxylic acid or a carboxylic anhydride. Examples of the carboxylic acid anhydride include maleic anhydride, citraconic anhydride, itaconic anhydride, 3-vinylphthalic anhydride, 4-vinylphthalic anhydride, 3,4,5,6-tetrahydrophthalic anhydride, 1,2,3,6-tetrahydrophthalic anhydride, dimethyltetrahydrophthalic anhydride, 5,6-dicarboxybicyclo[2.2.1] hept-2-ene anhydride. The amount of the carboxylic acid anhydride used is preferably 0.5 to 1 mol based on 1 mol of the monomer (5b) used.

In particular, the resin (F) preferably contains at least one selected from the group consisting of the resin [f2], the resin [f3], the resin [f4], and the resin [f5].

The weight-average molecular weight of the resin (F) in terms of polystyrene is preferably 3,000 or more and 100,000 or less, more preferably 5,000 or more and 50,000 or less, and still more preferably 5,000 or more and 30,000 or less. When the molecular weight is within the above range, there is a tendency that the hardness of the cured film is improved, the residual film ratio of the cured pattern is high, the solubility of the unexposed portion in the composition layer in the developer is good, and the resolution of the cured pattern is improved.

The molecular weight distribution [weight-average molecular weight (Mw)/number-average molecular weight (Mn)] of the resin (F) is preferably 1.1 or more and 6 or less, and more preferably 1.2 or more and 4 or less.

The acid value of the resin (F) is preferably 50 to 170 mg-KOH/g, more preferably 60 to 150 mg-KOH/g, and still more preferably 70 to 135 mg-KOH/g. Here, the acid value is a value measured as the amount (mg) of potassium hydroxide necessary for neutralizing 1 g of the resin, and can be obtained by titrating with, for example, an aqueous potassium hydroxide solution.

The content of the resin (F) in the curable resin composition (D) is, for example, based on the total amount of the solid content of the curable resin composition (D), 5% by mass or more and 99% by mass or less, preferably 10% by mass or more and 90% by mass or less, more preferably 20% by mass or more and 80% by mass or less, still more preferably 30% by mass or more and 70% by mass or less, and particularly preferably 30% by mass or more and 60% by mass or less. When the content ratio of the resin (F) is within the above range, the mechanical properties and the optical properties of the cured product of the curable resin composition (D) tend to be good.

[Polymerizable Compound]

The polymerizable compound (G) is a compound that can be polymerized by an active radical, an acid, or the like generated from a polymerization initiator (H) described later. Examples of such a compound include a compound having an ethylenically unsaturated bond, and a (meth) acrylate compound is preferable.

As used herein, the term "(meth)acrylic acid" represents at least one selected from the group consisting of acrylic acid and methacrylic acid. Notations such as "(meth)acryloyl" and "(meth)acrylate" have the same meaning.

In particular, the polymerizable compound (G) is preferably a polymerizable compound having three or more ethylenically unsaturated bonds. Examples of such a polymerizable compound include trimethylolpropane tri(meth) acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa (meth)acrylate, tripentaerythritol hepta(meth)acrylate, tetrapentaerythritol deca(meth)acrylate, tetrapentaerythritol nona (meth)acrylate, tris(2-(meth)acryloyloxyethyl)isocyanurate, ethylene glycol-modified pentaerythritol tetra(meth)acrylate, ethylene glycol-modified dipentaerythritol hexa(meth) acrylate, propylene glycol-modified pentaerythritol tetra(meth)acrylate, propylene glycol-modified dipentaerythritol hexa(meth)acrylate, caprolactone-modified pentaerythritol tetra(meth)acrylate, caprolactone-modified dipentaerythritol hexa(meth)acrylate. The polymerizable compound may be used alone or in combination of two or more.

The weight-average molecular weight of the polymerizable compound (G) is preferably 150 or more and 2900 or less, and more preferably 250 or more and 1500 or less.

The content ratio of the polymerizable compound (G) in the curable resin composition (D) is preferably 1% by mass and 50% by mass, more preferably 5% by mass or more and 40% by mass or less, still more preferably 10% by mass or more and 30% by mass or less, and particularly preferably 10% by mass or more and 20% by mass or less, based on the total amount of the solid content of the curable resin composition (D). When the content ratio of the polymerizable compound (G) is within the above range, the residual film ratio of the cured pattern and the chemical resistance of the cured pattern tend to be further improved. The solid content of the curable resin composition (D) means the total of all the components contained in the curable resin composition (D) excluding the solvent.

[Polymerization Initiator]

The polymerization initiator (H) is a compound capable of initiating a polymerization reaction by generating an active radical, an acid, or the like by the action of light or heat, and includes at least one selected from the group consisting of an oxime compound, a biimidazole compound, a triazine compound, and an acylphosphine compound. Above all, it is preferable to contain an oxime compound. When these polymerization initiators are used, the residual film ratio of the cured pattern is increased.

The oxime compound, the biimidazole compound, the triazine compound, and the acylphosphine compound are preferably compounds having at least two aromatic rings in the molecule because the degree of polymerization tends to be higher when a cured film is produced.

Examples of the aromatic ring include 5-membered rings such as a furan ring, a pyrrole ring, an imidazole ring, a thiophene ring, and a thiazole ring; 6-membered rings such as a benzene ring, a pyridine ring, a pyrimidine ring, and a triazine ring; and condensed rings thereof.

The oxime compound is preferably an O-acyloxime compound, and is a compound having a partial structure represented by the formula (d1). Hereinafter, * represents a bond.

[Formula 8]

(d1)

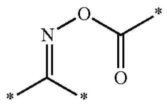

Examples of the oxime compound include N-benzoyloxy-1-(4-phenylsulfanylphenyl)butan-1-one-2-imine, N-benzoyloxy-1-(4-phenylsulfanylphenyl)octan-1-one-2-imine, N-benzoyloxy-1-(4-phenylsulfanylphenyl)-3-cyclopentylpropan-1-one-2-imine, N-acetoxy-1-[9-ethyl-6-(2-methylbenzoyl)-9H-carbazole-3-yl]ethane-1-imine, N-acetoxy-1-[9-ethyl-6-{2-methyl-4-(3,3-dimethyl-2,4-dioxacyclopentanylmethyloxy)benzoyl}-9H-carbazole-3-yl]ethane-1-imine, N-acetoxy-1-[9-ethyl-6-(2-methylbenzoyl)-9H-carbazole-3-yl]-3-cyclopentylpropane-1-imine, and N-benzoyloxy-1-[9-ethyl-6-(2-methylbenzoyl)-9H-carbazole-3-yl]-3-cyclopentylpropan-1-one-2-imine, and compounds disclosed in Japanese Patent Laid-Open No. 2011-132215, International Publication No. 2008/78678, International Publication No. 2008/78686, and International Publication No. 2012/132558. Commercially available products such as Irgacure OXE01 and Irgacure OXE02 (all manufactured by BASF Japan Ltd.), and N-1919 (manufactured by ADEKA Corporation) may also be used.

Of these, the oxime compound is preferably at least one selected from the group consisting of N-benzoyloxy-1-(4-phenylsulfanylphenyl)butan-1-one-2-imine, N-benzoyloxy-1-(4-phenylsulfanylphenyl)octan-1-one-2-imine, N-benzoyloxy-1-(4-phenylsulfanylphenyl)-3-cyclopentylpropan-1-one-2-imine, and N-acetoxy-1-[9-ethyl-6-(2-methylbenzoyl)-9H-carbazole-3-yl]ethane-1-imine, and more preferably N-benzoyloxy-1-(4-phenylsulfanylphenyl)octan-1-one-2-imine and/or N-acetoxy-1-[9-ethyl-6-(2-methylbenzoyl)-9H-carbazole-3-yl]ethane-1-imine.

An oxime compound having a first molecular structure represented by the following formula (1) can also be used as the oxime compound. Hereinafter, the oxime compound is also referred to as "oxime compound (1)".

[Formula 9]

(1)

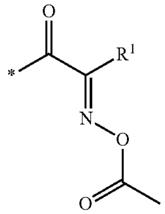

When the oxime compound (1) is contained as the polymerization initiator (H), it tends to be advantageous from the viewpoint of increasing the emission intensity. One of the reasons why the curable resin composition according to the present invention can exhibit such an effect is presumed to be that the oxime compound (1) has a high ability to initiate photoradical polymerization, because the absorption wavelength of the oxime compound (1) changes greatly before and after cleavage (decomposition) of the oxime compound (1), which is necessary when the oxime compound (1) initiates photopolymerization, due to the unique molecular structure of the oxime compound (1).

In the formula (1), $R^1$ represents $R^{11}$, $OR^{11}$, $COR^{11}$, $SR^{11}$, $CONR^{12}R^{13}$, or CN.

$R^{11}$, $R^{12}$, and $R^{13}$ each independently represent a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

The hydrogen atoms of the group represented by $R^{11}$, $R^{12}$, or $R^{13}$ are optionally replaced by $OR^{21}$, $COR^{21}$, $SR^{21}$, $NR^{22}Ra^{23}$, $CONR^{22}R^{23}$, $-NR^{22}-OR^{23}$, $-N(COR^{22})-OCOR^{23}$, $OCOR^{23}$, $-C(=N-OR^{21})-R^{22}$, $-C(=N-OCOR^{21})-R^{22}$, CN, a halogen atom, or $COOR^{21}$.

$R^{21}$, $R^{22}$, and $R^{23}$ each independently represent a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

The hydrogen atoms of the group represented by $R^{21}$, $R^{22}$, or $R^{23}$ are optionally replaced by CN, a halogen atom, a hydroxy group, or a carboxy group.

When the group represented by $R^{11}$, $R^{12}$, $R^{13}$, $R^{21}$, $R^{22}$, or $R^{23}$ has an alkylene moiety, the alkylene moiety is optionally interrupted one to five times by —O—, —S—, —COO—, —OCO—, $-NR^{24}-$, $-NR^{24}CO-$, $-NR^{24}COO-$, $-OCONR^{24}-$, —SCO—, —COS—, —OCS—, or —CSO—.

$R^{24}$ represents a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

When the group represented by $R^{11}$, $R^{12}$, $R^{13}$, $R^{21}$, $R^{22}$, or $R^{23}$ has an alkyl moiety, the alkyl moiety is optionally branched or cyclic, and $R^{22}$ and $R^{23}$, and $R^{22}$ and $R^{23}$ are each optionally joined together to form a ring.

* represents a bond with a second molecular structure which is a molecular structure other than the first molecular structure of the oxime compound (1).

Examples of alkyl groups having 1 to 20 carbon atoms represented by $R^{11}$, $R^{12}$, $R^{13}$, $R^{21}$, $R^{22}$, $R^{23}$, and $R^{24}$ in the formula (1) include a methyl group, an ethyl group, a propyl group, an isopropyl group, a butyl group, an isobutyl group, a sec-butyl group, a tert-butyl group, a pentyl group, an isopentyl group, a tert-pentyl group, a hexyl group, a heptyl group, an octyl group, an isooctyl group, a 2-ethylhexyl group, a tert-octyl group, a nonyl group, an isononyl group, a decyl group, an isodecyl group, an undecyl group, a dodecyl group, a tetradecyl group, a hexadecyl group, an octadecyl group, an icosyl group, a cyclopentyl group, a cyclohexyl group, a cyclohexylmethyl group, and a cyclohexylethyl group.

Examples of aryl groups having 6 to 30 carbon atoms represented by $R^{11}$, $R^{12}$, $R^{13}$, $R^{21}$, $R^{22}$, $R^{23}$, and $R^{24}$ in the formula (1) include a phenyl group, a tolyl group, a xylyl group, an ethylphenyl group, a naphthyl group, an anthryl group, a phenanthryl group; and a phenyl group, a biphenylyl group, a naphthyl group, and an anthryl group substituted with one or more of the alkyl groups.

Examples of aralkyl groups having 7 to 30 carbon atoms represented by $R^{11}$, $R^{12}$, $R^{13}$, $R^{21}$, $R^{22}$, $R^{23}$, and $R^{24}$ in the formula (1) include a benzyl group, an α-methylbenzyl group, an α,α-dimethylbenzyl group, and a phenylethyl group.

Examples of the heterocyclic groups having 2 to 20 carbon atoms represented by $R^{11}$, $R^{12}$, $R^{13}$, $R^{21}$, $R^{22}$, $R^{23}$, and $R^{24}$ in the formula (1) include a pyridyl group, a pyrimidyl group, a furyl group, a thienyl group, a tetrahydrofuryl group, a dioxolanyl group, a benzoxazol-2-yl group, a tetrahydropyranyl group, a pyrrolidyl group, an imidazolidyl group, a pyrazolidyl group, a thiazolidyl group, an isothiazolidyl group, an oxazolidyl group, an isoxazolidyl group, a piperidyl group, a piperazyl group, and a morpholinyl group, and preferable is a 5- to 7-membered heterocyclic group.

$R^{12}$ and $R^{13}$ and $R^{22}$ and $R^{23}$ in the formula (1) are each optionally joined together to form a ring, meaning that $R^{12}$ and $R^{13}$ and $R^{22}$ and $R^{23}$ are each optionally joined together to form a ring together with a nitrogen atom, a carbon atom, or an oxygen atom to be connected.

Examples of the ring that can be formed by joining $R^{12}$ and $R^{13}$ and $R^{22}$ and $R^{23}$ in the formula (1) together include a cyclopentane ring, a cyclohexane ring, a cyclopentene ring, a benzene ring, a piperidine ring, a morpholine ring, a lactone ring, and a lactam ring, and preferable is a 5- to 7-membered ring.

Examples of the halogen atom that $R^{11}$, $R^{12}$, $R^{13}$, $R^{21}$, $R^{22}$, and $R^{23}$ in the formula (1) may have as a substituent include a fluorine atom, a chlorine atom, a bromine atom and an iodine atom.

$R^1$ in the formula (1) is preferably $R^{11}$, more preferably an alkyl group having 1 to 20 carbon atoms, still more preferably an alkyl group having 1 to 10 carbon atoms, and yet still more preferably an alkyl group having 1 to 6.

An example of the second molecular structure linked to the first molecular structure represented by the formula (1) is a structure represented by the following formula (2). The second molecular structure refers to a molecular structure portion of the oxime compound (1) other than the first molecular structure.

The bond represented by "*" in the formula (2) is directly bonded to the bond represented by "*" in the formula (1). That is, when the second molecular structure is a structure represented by the formula (2), the benzene ring having "—*" in the formula (2) and the carbonyl group having "—*" in the formula (1) are directly bonded to each other.

[Formula 10]

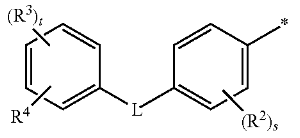

(2)

In the formula (2), $R^2$ and $R^3$ each independently represent $R^{11}$, $OR^{11}$, $SR^{11}$, $COR^{11}$, $CONR^{12}R^{13}$, $NR^{12}COR^{11}$, $OCOR^{11}$, $COOR^{11}$, $SCOR^{11}$, $OCSR^{11}$, $COSR^{11}$, $CSOR^{11}$, CN, or a halogen atom.

A plurality of $R^2$, when present, are optionally the same or different.

A plurality of $R^3$, when present, are optionally the same or different.

$R^{11}$, $R^{12}$, and $R^{13}$ have the same meaning as described above.

s and t each independently represent an integer of 0 to 4.

L represents a sulfur atom, $CR^{31}R^{32}$, CO, or $NR^{33}$.

$R^{31}$, $R^{32}$, and $R^{33}$ each independently represent a hydrogen atom, an alkyl group having 1 to 20 carbon atoms, an aryl group having 6 to 30 carbon atoms, or an aralkyl group having 7 to 30 carbon atoms.

When the group represented by $R^{31}$, $R^{32}$, or $R^{33}$ has an alkyl moiety, the alkyl moiety is optionally branched or cyclic, and $R^{31}$, $R^{32}$, and $R^{33}$ are each independently and optionally joined together to form a ring with any of adjacent benzene rings.

$R^4$ represents a hydroxy group, a carboxy group, or a group represented by the following formula (2-1):

[Formula 11]

$$(R^{4a})_v—L^2—L^1— \quad (2\text{-}1)$$

(In the formula (2-1), $L^1$ represents —O—, —S—, —$NR^{22}$—, —$NR^{22}$CO—, —$SO_2$—, —CS—, —OCO—, or —COO—.

$R^{22}$ has the same meaning as described above.

$L^2$ represents a group obtained by removing v hydrogen atoms from an alkyl group having 1 to 20 carbon atoms, a group obtained by removing v hydrogen atoms from an aryl group having 6 to 30 carbon atoms, a group obtained by removing v hydrogen atoms from an aralkyl group having 7 to 30 carbon atoms, or a group obtained by removing v hydrogen atoms from a heterocyclic group having 2 to 20 carbon atoms.

When the group represented by $L^2$ has an alkylene moiety, the alkylene moiety is optionally interrupted one to five times by —O—, —S—, —COO—, —OCO—, —$NR^{22}$—, —$NR^{22}$COO—, —OCO$NR^{22}$—, —SCO—, —COS—, —OCS—, or —CSO—, and the alkylene moiety is optionally branched or cyclic.

$R^{4a}$ is each independently $OR^{41}$, $SR^{41}$, $CONR^{42}R^{43}$, $NR^{42}COR^{43}$, $OCOR^{41}$, $COOR^{41}$, $SCOR^{41}$, $OCSR^{41}$, $COSR^{41}$, $CSOR^{41}$, CN, or a halogen atom.

A plurality of $R^{4a}$, when present, are optionally the same or different.

$R^{41}$, $R^{42}$, and $R^{43}$ each independently represent a hydrogen atom, an alkyl group having 1 to 20 carbon atoms, an aryl group having 6 to 30 carbon atoms, or an aralkyl group having 7 to 30 carbon atoms, and when the group represented by $R^{41}$, $R^{42}$, and $R^{43}$ has an alkyl moiety, the alkyl moiety is optionally branched or cyclic, and $R^{42}$ and $R^{43}$ are optionally joined together to form a ring.

v represents an integer of 1 to 3.)

* represents a bond with the first molecular structure of the oxime compound (1).

Examples of alkyl groups having 1 to 20 carbon atoms, aryl groups having 6 to 30 carbon atoms, and aralkyl groups having 7 to 30 carbon atoms represented by $R^{11}$, $R^{12}$, $R^{13}$, $R^{21}$, $R^{22}$, $R^{23}$, $R^{24}$, $R^{31}$, $R^{32}$, and $R^{33}$ in the formula (2) and $R^{22}$, $R^{41}$, $R^{42}$, and $R^{43}$ in the formula (2-1) are the same as examples for $R^{11}$, $R^{12}$, $R^{13}$, $R^{21}$, $R^{22}$, $R^{23}$, and $R^{24}$ in the formula (1).

Examples of heterocyclic groups having 2 to 20 carbon atoms represented by $R^{11}$, $R^{12}$, $R^{13}$, $R^{21}$, $R^{22}$, $R^{23}$, and $R^{24}$ in the formula (2) and $R^{22}$ in the formula (2-1) are the same as examples for $R^{11}$, $R^{12}$, $R^{13}$, $R^{21}$, $R^{22}$, $R^{23}$, and $R^{24}$ in the formula (1).

$R^{31}$, $R^{32}$, and $R^{33}$ in the formula (2) are each independently and optionally joined together to form a ring with any of adjacent benzene rings, meaning that $R^{31}$, $R^{32}$, and $R^{33}$ are each independently and optionally joined together to form a ring with any of adjacent benzene rings together with a nitrogen atom to be connected.

Examples of the ring which can be formed by joining $R^{31}$, $R^{32}$, and $R^{33}$ in the formula (2) together with any of adjacent benzene rings are the same as those of the ring which can be formed by joining $Ra^{12}$ and $Ra^{13}$ and $Ra^{22}$ and $Ra^{23}$ in the formula (1) together.

$L^2$ in the above formula (2-1) represents groups obtained by removing v hydrogen atoms from an alkyl group having 1 to 20 carbon atoms, an aryl group having 6 to 30 carbon atoms, an aralkyl group having 7 to 30 carbon atoms, or a heterocyclic group having 2 to 20 carbon atoms.

Examples of the group obtained by removing v hydrogen atoms from an alkyl group having 1 to 20 carbon atoms when v is 1 include alkylene groups such as a methylene group, an ethylene group, a propylene group, a methylethylene group, a butylene group, a 1-methylpropylene group, a 2-methylpropylene group, a 1,2-dimethylpropylene group, a 1,3-dimethylpropylene group, a 1-methylbutylene group, a 2-methylbutylene group, a 3-methylbutylene group, a 4-methylbutylene group, a 2,4-dimethylbutylene group, a 1,3-dimethylbutylene group, a pentylene group, a hexylene group, a heptylene group, an octylene group, a nonylene group, a decylene group, a dodecylene group, a tridecylene group, a tetradecylene group, a pentadecylene group, an ethane-1,1-diyl group, and a propane-2,2-diyl group.

Examples of the group obtained by removing v hydrogen atoms from an aryl group having 6 to 30 carbon atoms when v is 1 include arylene groups such as a 1,2-phenylene group, 1,3-phenylene group, and a 1,4-phenylene group, a 2,6-naphthylene group, a 1,4-naphthylene group, a 2,5-dimethyl-1,4-phenylene group, a diphenylmethane-4,4'-diyl group, a 2,2-diphenylpropane-4,4'-diyl group, a diphenylsulfide-4,4'-diyl group, and a diphenylsulfon-4,4'-diyl group.

Examples of the group obtained by removing v hydrogen atoms from an aralkyl group having 7 to 30 carbon atoms when v is 1 include a group represented by the following formula (a) and a group represented by the following formula (b).

[Formula 12]

(a)

(b)

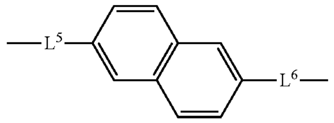

[In the formulas (a) and (b), $L^3$ and $L^5$ represent an alkylene group having 1 to 10 carbon atoms, and $L^4$ and $L^6$ represent a single bond or an alkylene group having 1 to 10 carbon atoms.]

Examples of the alkylene group having 1 to 10 carbon atoms include alkylene groups such as a methylene group, an ethylene group, a propylene group, a methylethylene group, a butylene group, a 1-methylpropylene group, a 2-methylpropylene group, a 1,2-dimethylpropylene group, a 1,3-dimethylpropylene group, a 1-methylbutylene group, a 2-methylbutylene group, a 3-methylbutylene group, a 4-methylbutylene group, a 2,4-dimethylbutylene group, a 1,3-dimethylbutylene group, a pentylene group, a hexylene group, a heptylene group, an octylene group, a nonylene group, and a decylene group.

Examples of the group obtained by removing v hydrogen atoms from a heterocyclic group having 2 to 20 carbon atoms when v is 1 include divalent heterocyclic groups such as a 2,5-pyridinediyl group, a 2,6-pyridinediyl group, a 2,5-pyrimidinediyl group, a 2,5-thiophenediyl group, a 3,4-tetrahydrofurandiyl group, a 2,5-tetrahydrofurandiyl group, a 2,5-furandiyl group, a 3,4-thiazolediyl group, a 2,5-benzofurandiyl group, a 2,5-benzothiophenediyl group, an N-methylindole-2,5-diyl group, a 2,5-benzothiazolediyl group, and a 2,5-benzoxazolediyl group.

Examples of the halogen atom represented by $R^2$ and $R^3$ in the formula (2) and $R^{4a}$ in the formula (2-1) include a fluorine atom, a chlorine atom, a bromine atom and an iodine atom.

From the viewpoint of solubility in the solvent (K) and/or the development speed of the cured film, a preferable example of the structure represented by the formula (2) is the structure represented by the following formula (2a):

[Formula 13]

(2a)

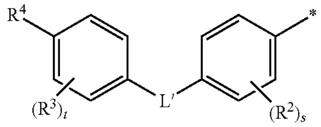

[In the formula (2a), L' represents a sulfur atom or $NR^{50}$, $R^{50}$ represents a linear, branched, or cyclic alkyl group having 1 to 20 carbon atoms, and $R^2$, $R^3$, $R^4$, s, and t have the same meaning as described above.]

From the same viewpoint as above, another preferable example of the structure represented by the formula (2) is the structure represented by the following formula (2b):

[Formula 14]

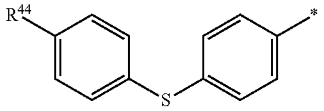

(2b)

[In the formula (2b), $R^{44}$ represents a hydroxy group, a carboxy group, or a group represented by the following formula (2-2):

[Formula 15]

$$R^{44a}—L^{12}—L^{11}— \quad (2\text{-}2)$$

(In the formula (2-2), $L^{11}$ represents —O— or *—OCO—, * represents a bond to $L^{12}$, $L^{12}$ represents an alkylene group having 1 to 20 carbon atoms, the alkylene group may be interrupted by one to three —O—, $R^{44a}$ represents $OR^{55}$ or $COOR^{55}$, $R^{55}$ represents a hydrogen atom or an alkyl group having 1 to 6 carbon atoms.).]

$R^{44}$ is preferably a group represented by the formula (2-2). In this case, it is advantageous in terms of the solubility of the oxime compound (1) in the solvent (K) and the development speed of the cured film.

The number of carbon atoms of the alkylene group represented by $L^{12}$ is preferably 1 to 10, and more preferably 1 to 4.

$R^{44a}$ is preferably a hydroxy group or a carboxy group, and more preferably a hydroxy group.

The method for producing the oxime compound (1) having the second molecular structure represented by the formula (2) is not particularly limited, but the oxime compound (1) can be produced by the method disclosed in Japanese Patent Laid-Open No. 2011-132215.

Another example of the second molecular structure linked to the first molecular structure represented by the formula (1) is a structure represented by the following formula (3).

The bond represented by "*" in the formula (3) is directly bonded to the bond represented by "*" in the formula (1). That is, when the second molecular structure is a structure represented by the formula (3), the benzene ring having "—*" in the formula (3) and the carbonyl group having "—*" in the formula (1) are directly bonded to each other.

[Formula 16]

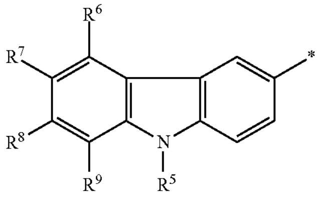

(3)

In the formula (3), $R^5$ represents a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

When the group represented by $R^5$ has an alkyl moiety, the alkyl moiety is optionally branched or cyclic.

The hydrogen atoms of the group represented by $R^5$ are optionally replaced by $R^{21}$, $OR^{21}$, $COR^{21}$, $SR^{21}$, $NR^{22}R^{23}$, $CONR^{22}R^{23}$, $—NR^{22}—OR^{23}$, $—N(COR^{22})—OCOR^{23}$, $NR^{22}COR^{21}$, $OCOR^{21}$, $COOR^{21}$, $—C(=N—OR^{21})—R^{22}$, $—C(=N—OCOR^{21})—R^{22}$, $SCOR^{21}$, $OCSR^{21}$, $COSR^{21}$, $CSOR^{21}$, a hydroxyl group, a nitro group, CN, a halogen atom, or $COOR^{21}$.

$R^{21}$, $R^{22}$, and $R^{23}$ have the same meaning as described above.

The hydrogen atoms of the group represented by $R^{21}$, $R^{22}$, or $R^{23}$ are optionally replaced by CN, a halogen atom, a hydroxy group, or a carboxy group.

When the group represented by $R^{21}$, $R^{22}$, and $R^{23}$ has an alkylene moiety, the alkylene moiety is optionally interrupted one to five times by —O—, —S—, —COO—, —OCO—, $—NR^{24}—$, $—NR^{24}CO—$, $—NR^{24}COO—$, $—OCONR^{24}—$, —SCO—, —COS—, —OCS—, or —CSO—.

$R^{24}$ has the same meaning as described above.

When the group represented by $R^{21}$, $R^{22}$, and $R^{23}$ has an alkyl moiety, the alkyl moiety is optionally branched or cyclic, and $R^{22}$ and $R^{23}$ are optionally joined together to form a ring.

$R^6$, $R^7$, $R^8$, and $R^9$ are each independently $R^{61}$, $OR^{61}$, $SR^{61}$, $COR^{62}$, $CONR^{63}R^{64}$, $NR^{65}COR^{61}$, $OCOR^{61}$, $COOR^{62}$, $SCOR^{61}$, $OCSR^{61}$, $COSR^{62}$, $CSOR^{61}$, a hydroxy group, a nitro group, CN, or a halogen atom.

$R^{61}$, $R^{62}$, $R^{63}$, $R^{64}$, and $R^{65}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

The hydrogen atoms of the group represented by $R^{61}$, $R^{62}$, $R^{63}$, $R^{64}$, or $R^{65}$ are optionally replaced by $OR^{21}$, $COR^{21}$, $SR^{21}$, $NR^{22}Ra^{23}$, $CONR^{22}R^{23}$, $—NR^{22}—OR^{23}$, $—N(COR^{22})—OCOR^{23}$, $—C(=N—OR^{21})—R^{22}$, $—C(=N—OCOR^{21})—R^{22}$, CN, a halogen atom, or $COOR^{21}$.

$R^6$ and $R^7$, $R^7$ and $R^8$, and $R^8$ and $R^9$ are each optionally joined together to form a ring.

* represents a bond with the first molecular structure of the oxime compound (1).

Examples of alkyl groups having 1 to 20 carbon atoms, aryl groups having 6 to 30 carbon atoms, aralkyl groups having 7 to 30 carbon atoms, and heterocyclic groups having 2 to 20 carbon atoms represented by $R^5$, $R^{21}$, $R^{22}$, $R^{23}$, $R^{24}$, $R^{61}$, $R^{62}$, $R^{63}$, $R^{64}$, and $R^{65}$ in the formula (3) are the same as examples for $R^{11}$, $R^{12}$, $R^{13}$, $R^{21}$, $R^{22}$, $R^{23}$, and $R^{24}$ in the formula (1).

$R^{22}$ and $R^{23}$ in the formula (3) are each optionally joined together to form a ring, meaning that $R^{22}$ and $R^{23}$ are each optionally joined together to form a ring together with a nitrogen atom, a carbon atom, or an oxygen atom to be connected.

Examples of the ring which can be formed by joining $R^{22}$ and $R^{23}$ in the formula (3) together are the same as those of the ring which can be formed by joining $Ra^{12}$ and $Ra^{13}$, and $Ra^{22}$ and $Ra^{23}$ in the formula (1) together.

Examples of the halogen atom represented by $R^6$, $R^7$, $R^8$, and $R^9$, and the halogen atoms which may replace the hydrogen atoms of $R^5$, $R^{21}$, $R^{22}$, $R^{23}$, $R^{61}$, $R^{62}$, $R^{63}$, $R^{64}$, and $R^{65}$ in the formula (3) include a fluorine atom, a chlorine atom, a bromine atom and an iodine atom.

From the viewpoint of solubility in the solvent (K) and/or the development speed of the cured film, in one preferable embodiment, $R^5$ is a group represented by the following formula (3-1):

[Formula 17]

(3-1)

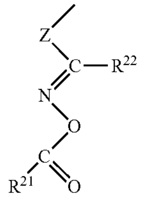

[In the formula (3-1), Z represents a group obtained by removing one hydrogen atom from an alkyl group having 1 to 20 carbon atoms, a group obtained by removing one hydrogen atom from an aryl group having 6 to 30 carbon atoms, a group obtained by removing one hydrogen atom from an aralkyl group having 7 to 30 carbon atoms, or a group obtained by removing one hydrogen atom from a heterocyclic group having 2 to 20 carbon atoms.

When the group represented by Z has an alkylene moiety, the alkylene moiety is optionally interrupted one to five times by —O—, —S—, —COO—, —OCO—, —$NR^{24}$—, —$NR^{24}$COO—, —OCO$NR^{24}$—, —SCO—, —COS—, —OCS—, or —CSO—, and the alkylene moiety is optionally branched or cyclic.

$R^{21}$, $R^{22}$, and $R^{24}$ have the same meaning as described above.]

From the same viewpoint as above, Z in the formula (3-1) is preferably a methylene group, an ethylene or phenylene group.

From the same viewpoint as above, $R^{21}$ and $R^{22}$ in the formula (3-1) are preferably an alkyl group having 1 to 20 carbon atoms or an aryl group having 6 to 30 carbon atoms, and more preferably a methyl group, an ethyl group, or a phenyl group.

From the same viewpoint as above, in another preferred embodiment, $R^7$ is a nitro group.

The method for producing the oxime compound (1) having the second molecular structure represented by the formula (3) is not particularly limited, but the oxime compound (1) can be produced by the method disclosed in Japanese Patent Laid-Open No. 2000-80068 and Japanese Patent Laid-Open No. 2011-178776.

Yet another example of the second molecular structure linked to the first molecular structure represented by the formula (1) is a structure represented by the following formula (4).

The bond represented by "*" in the formula (4) is directly bonded to the bond represented by "*" in the formula (1). That is, when the second molecular structure is a structure represented by the formula (4), the benzene ring having "—*" in the formula (4) and the carbonyl group having "—*" in the formula (1) are directly bonded to each other.

[Formula 18]

(4)

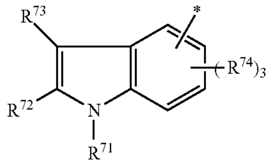

In the formula (4), $R^{71}$ represents a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

When the group represented by $R^{71}$ has an alkyl moiety, the alkyl moiety is optionally branched or cyclic.

The hydrogen atoms of the group represented by $R^{71}$ are optionally replaced by $R^{21}$, $OR^{21}$, $COR^{21}$, $SR^{21}$, $NR^{22}R^{23}$, $CONR^{22}R^{23}$, —$NR^{22}$—$OR^{23}$, —N($COR^{22}$)—$OCOR^{23}$, $NR^{22}COR^{21}$, $OCOR^{21}$, $COOR^{21}$, —C(═N—$OR^{21}$)—$R^{22}$, —C(═N—$OCOR^{21}$)—$R^{22}$, $SCOR^{21}$, $OCSR^{21}$, $COSR^{21}$, $CSOR^{21}$, a hydroxyl group, a nitro group, CN, a halogen atom, or $COOR^{21}$.

$R^{21}$, $R^{22}$, and $R^{23}$ have the same meaning as described above.

The hydrogen atoms of the group represented by $R^{21}$, $R^{22}$, or $R^{23}$ are optionally replaced by CN, a halogen atom, a hydroxy group, or a carboxy group.

When the group represented by $R^{21}$, $R^{22}$, and $R^{23}$ has an alkylene moiety, the alkylene moiety is optionally interrupted one to five times by —O—, —S—, —COO—, —OCO—, —$NR^{24}$—, —$NR^{24}$CO—, —$NR^{24}$COO—, —OCO$NR^{24}$—, —SCO—, —COS—, —OCS—, or —CSO—.

$R^{24}$ has the same meaning as described above.

When the group represented by $R^{21}$, $R^{22}$, and $R^{23}$ has an alkyl moiety, the alkyl moiety is optionally branched or cyclic, and $R^{22}$ and $R^{23}$ are optionally joined together to form a ring.

$R^{72}$, $R^{73}$, and three $R^{74}$ each independently represent $R^{61}$, $OR^{61}$, $SR^{61}$, $COR^{62}$, $CONR^{63}R^{64}$, $NR^{65}COR^{61}$, $OCOR^{61}$, $COOR^{62}$, $SCOR^{61}$, $OCSR^{61}$, $COSR^{62}$, $CSOR^{61}$, a hydroxy group, a nitro group, CN, or a halogen atom.

$R^{61}$, $R^{62}$, $R^{63}$, $R^{64}$, and $R^{65}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

The hydrogen atoms of the group represented by $R^{61}$, $R^{62}$, $R^{63}$, $R^{64}$, or $R^{65}$ are optionally replaced by $OR^{21}$, $COR^{21}$, $SR^{21}$, $NR^{22}Ra^{23}$, $CONR^{22}R^{23}$, —$NR^{22}$—$OR^{23}$, —N($COR^{22}$)—$OCOR^{23}$, —C(═N—$OR^{21}$)— $R^{22}$, —C(═N—$OCOR^{21}$)—$R^{22}$, CN, a halogen atom, or $COOR^{21}$.

$R^{72}$ and $R^{73}$ and two $R^{74}$ are each optionally joined together to form a ring.

* represents a bond with the first molecular structure of the oxime compound (1).

Examples of alkyl groups having 1 to 20 carbon atoms, aryl groups having 6 to 30 carbon atoms, aralkyl groups having 7 to 30 carbon atoms, and heterocyclic groups having 2 to 20 carbon atoms represented by $R^{71}$, $R^{21}$, $R^{22}$, $R^{23}$, $R^{24}$, $R^{61}$, $R^{62}$, $R^{63}$, $R^{64}$, and$R^{65}$ in the formula (4) are the same as examples for $R^{11}$, $R^{12}$, $R^{13}$, $R^{21}$, $R^{22}$, $R^{23}$, and $R^{24}$ in the formula (1).

$R^{22}$ and $R^{23}$ in the formula (4) are each optionally joined together to form a ring, meaning that $R^{22}$ and $R^{23}$ are each optionally joined together to form a ring together with a nitrogen atom, a carbon atom, or an oxygen atom to be connected.

Examples of the ring which can be formed by joining $R^{22}$ and $R^{23}$ in the formula (4) together are the same as those of the ring which can be formed by joining $Ra^{12}$ and $Ra^{13}$, and $Ra^{22}$ and $Ra^{23}$ in the formula (1) together.

Examples of the halogen atom represented by $R^{72}$, $R^{73}$, and $R^{74}$, and the halogen atoms which may replace the hydrogen atoms of $R^{71}$, $R^{21}$, $R^{22}$, $R^{23}$, $R^{61}$, $R^{62}$, $R^{63}$, $R^{64}$, and $R^{65}$ in the formula (4) include a fluorine atom, a chlorine atom, a bromine atom and an iodine atom.

The method for producing the oxime compound (1) having the second molecular structure represented by the formula (4) is not particularly limited, but the oxime compound (1) can be produced by the method disclosed in International Publication No. 2017/051680 and International Publication No. 2020/004601.

Yet another example of the second molecular structure linked to the first molecular structure represented by the formula (1) is a structure represented by the following formula (5).

The bond represented by "*" in the formula (5) is directly bonded to the bond represented by "*" in the formula (1). That is, when the second molecular structure is a structure represented by the formula (5), the pyrrole ring having "—*" in the formula (5) and the carbonyl group having "—*" in the formula (1) are directly bonded to each other.

[Formula 19]

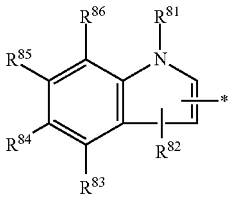

(5)

In the formula (5), $R^{81}$ represents a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

When the group represented by $R^{81}$ has an alkyl moiety, the alkyl moiety is optionally branched or cyclic.

The hydrogen atoms of the group represented by $R^{81}$ are optionally replaced by $R^{21}$, $OR^{21}$, $COR^{21}$, $SR^{21}$, $NR^{22}R^{23}$, $CONR^{22}R^{23}$, $-NR^{22}-OR^{23}$, $-N(COR^{22})-OCOR^{23}$, $NR^{22}COR^{21}$, $OCOR^{21}$, $COOR^{21}$, $-C(=N-OR^{21})-R^{22}$, $-C(=N-OCOR^{21})-R^{22}$, $SCOR^{21}$, $OCSR^{21}$, $COSR^{21}$, $CSOR^{21}$, a hydroxyl group, a nitro group, CN, a halogen atom, or $COOR^{21}$.

$R^{21}$, $R^{22}$, and $R^{23}$ have the same meaning as described above.

The hydrogen atoms of the group represented by $R^{21}$, $R^{22}$, or $R^{23}$ are optionally replaced by CN, a halogen atom, a hydroxy group, or a carboxy group.

When the group represented by $R^{21}$, $R^{22}$, and $R^{23}$ has an alkylene moiety, the alkylene moiety is optionally interrupted one to five times by —O—, —S—, —COO—, —OCO—, $-NR^{24}-$, $-NR^{24}CO-$, $-NR^{24}COO-$, $-OCONR^{24}-$, —SCO—, —COS—, —OCS—, or —CSO—.

$R^{24}$ has the same meaning as described above.

When the group represented by $R^{21}$, $R^{22}$, and $R^{23}$ has an alkyl moiety, the alkyl moiety is optionally branched or cyclic, and $R^{22}$ and $R^{23}$ are optionally joined together to form a ring.

$R^{82}$, $R^{83}$, $R^{84}$, $R^{85}$, and $R^{86}$ are each independently $R^{61}$, $OR^{61}$, $SR^{61}$, $COR^{62}$, $CONR^{63}R^{64}$, $NR^{65}COR^{61}$, $OCOR^{61}$, $COOR^{62}$, $SCOR^{61}$, $OCSR^{61}$, $COSR^{62}$, $CSOR^{61}$, a hydroxy group, a nitro group, CN, or a halogen atom.

$R^{61}$, $R^{62}$, $R^{63}$, $R^{64}$, and $R^{65}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

The hydrogen atoms of the group represented by $R^{61}$, $R^{62}$, $R^{63}$, $R^{64}$, or $R^{65}$ are optionally replaced by $OR^{21}$, $COR^{21}$, $SR^{21}$, $NR^{22}Ra^{23}$, $CONR^{22}R^{23}$, $-NR^{22}-OR^{23}$, $-N(COR^{22})-OCOR^{23}$, $-C(=N-OR^{21})-$ $R^{22}$, $-C(=N-OCOR^{21})-R^{22}$, CN, a halogen atom, or $COOR^{21}$.

$R^{83}$ and $R^{84}$, $R^{84}$ and $R^{85}$, and $R^{85}$ and $R^{86}$ are each optionally joined together to form a ring.

* represents a bond with the first molecular structure of the oxime compound (1).

Examples of alkyl groups having 1 to 20 carbon atoms, aryl groups having 6 to 30 carbon atoms, aralkyl groups having 7 to 30 carbon atoms, and heterocyclic groups having 2 to 20 carbon atoms represented by $R^{81}$, $R^{21}$, $R^{22}$, $R^{23}$, $R^{24}$, $R^{61}$, $R^{62}$, $R^{63}$, $R^{64}$, and$R^{65}$ in the formula (5) are the same as examples for $R^{11}$, $R^{12}$, $R^{13}$, $R^{21}$, $R^{22}$, $R^{23}$, and $R^{24}$ in the formula (1).

$R^{22}$ and $R^{23}$ in the formula (5) are each optionally joined together to form a ring, meaning that $R^{22}$ and $R^{23}$ are each optionally joined together to form a ring together with a nitrogen atom, a carbon atom, or an oxygen atom to be connected.

Examples of the ring which can be formed by joining $R^{22}$ and $R^{23}$ in the formula (5) together are the same as those of the ring which can be formed by joining $Ra^{12}$ and $Ra^{13}$, and $Ra^{22}$ and $Ra^{23}$ in the formula (1) together.

Examples of the halogen atom represented by $R^{82}$, $R^{83}$, $R^{84}$, $R^{85}$, and $R^{86}$, and the halogen atoms which may replace the hydrogen atoms of $R^{81}$, $R^{21}$, $R^{22}$, $R^{23}$, $R^{61}$, $R^{62}$, $R^{63}$, $R^{64}$, and $R^{65}$ in the formula (5) include a fluorine atom, a chlorine atom, a bromine atom and an iodine atom.

The method for producing the oxime compound (1) having the second molecular structure represented by the formula (5) is not particularly limited, but the oxime compound (1) can be produced by the method disclosed in International Publication No. 2017/051680 and International Publication No. 2020/004601.

Yet another example of the second molecular structure linked to the first molecular structure represented by the formula (1) is a structure represented by the following formula (6).

The bond represented by "*" in the formula (6) is directly bonded to the bond represented by "*" in the formula (1). That is, when the second molecular structure is a structure represented by the formula (6), the benzene ring having "—*" in the formula (6) and the carbonyl group having "—*" in the formula (1) are directly bonded to each other.

[Formula 20]

(6)

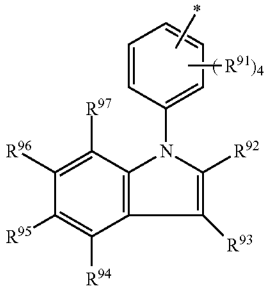

In the formula (6), four $R^{91}$, $R^{92}$, $R^{93}$, $R^{94}$, $R^{95}$, $R^{96}$, and $R^{97}$ are each independently $R^{61}$, $OR^{61}$, $SR^{61}$, $COR^{62}$, $CONR^{63}R^{64}$, $NR^{65}COR^{61}$, $OCOR^{61}$, $COOR^{62}$, $SCOR^{61}$, $OCSR^{61}$, $COSR^{62}$, $CSOR^{61}$, a hydroxy group, a nitro group, CN, or a halogen atom.

$R^{61}$, $R^{62}$, $R^{63}$, $R^{64}$, and $R^{65}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

The hydrogen atoms of the group represented by $R^{61}$, $R^{62}$, $R^{63}$, $R^{64}$, or $R^{65}$ are optionally replaced by $OR^{21}$, $COR^{21}$, $SR^{21}$, $NR^{22}Ra^{23}$, $CONR^{22}R^{23}$, $-NR^{22}-OR^{23}$, $-N(COR^{22})-OCOR^{23}$, $-C(=N-OR^{21})-R^{22}$, $-C(=N-OCOR^{21})-R^{22}$, CN, a halogen atom, or $COOR^{21}$.

$R^{21}$, $R^{22}$, and $R^{23}$ have the same meaning as described above.

$R^{92}$ and $R^{93}$, $R^{94}$ and $R^{95}$, $R^{95}$ and $R^{96}$, and $R^{96}$ and $R^{97}$ are each optionally joined together to form a ring.

* represents a bond with the first molecular structure of the oxime compound (1).

Examples of alkyl groups having 1 to 20 carbon atoms, aryl groups having 6 to 30 carbon atoms, aralkyl groups having 7 to 30 carbon atoms, and heterocyclic groups having 2 to 20 carbon atoms represented by $R^{21}$, $R^{22}$, $R^{23}$, $R^{61}$, $R^{62}$, $R^{63}$, $R^{64}$, and $R^{65}$ in the formula (6) are the same as examples for $R^{11}$, $R^{12}$, $R^{13}$, $R^{21}$, $R^{22}$, and $R^{23}$ in the formula (1).

$R^{22}$ and $R^{23}$ in the formula (6) are each optionally joined together to form a ring, meaning that $R^{22}$ and $R^{23}$ are each optionally joined together to form a ring together with a nitrogen atom, a carbon atom, or an oxygen atom to be connected.

Examples of the ring which can be formed by joining $R^{22}$ and $R^{23}$ in the formula (6) together are the same as those of the ring which can be formed by joining $Ra^{12}$, and $Ra^{13}$ and $Ra^{22}$ and $Ra^{23}$ in the formula (1) together.

Examples of the halogen atom represented by $R^{91}$, $R^{92}$, $R^{93}$, $R^{94}$, $R^{95}$, $R^{96}$, and $R^{97}$, and the halogen atoms which may replace the hydrogen atoms of $R^{21}$, $R^{22}$, $R^{23}$, $R^{61}$, $R^{62}$, $R^{63}$, $R^{64}$, and $R^{65}$ in the formula (6) include a fluorine atom, a chlorine atom, a bromine atom and an iodine atom.

The method for producing the oxime compound (1) having the second molecular structure represented by the formula (6) is not particularly limited, but the oxime compound (1) can be produced by the method disclosed in International Publication No. 2017/051680 and International Publication No. 2020/004601.

An example of the biimidazole compound is a compound represented by the formula (d5):

[Formula 21]

(d5)

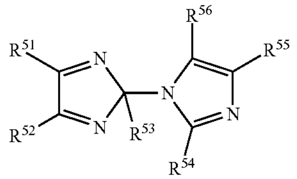

[In the formula (d5), $R^{51}$ to $R^{56}$ represent an aryl group having 6 to 10 carbon atoms which may have a substituent.]

Examples of the aryl group having 6 to 10 carbon atoms include a phenyl group, a toluyl group, a xylyl group, an ethylphenyl group, and a naphthyl group, and preferable is a phenyl group.

Examples of the substituent include a halogen atom and an alkoxy group having 1 to 4 carbon atoms. Examples of the halogen atom include a fluorine atom, a chlorine atom, a bromine atom and an iodine atom, and preferable is a chlorine atom. Examples of the alkoxy group having 1 to 4 carbon atoms include a methoxy group, an ethoxy group, a propoxy group, and a butoxy group, and preferable is a methoxy group.

Examples of the biimidazole compound include 2,2'-bis(2-chlorophenyl)-4,4',5,5'-tetraphenylbiimidazole, 2,2'-bis(2-chlorophenyl)-4,4',5,5'-tetraphenyl-1,2-biimidazole, 2,2'-bis(2,3-dichlorophenyl)-4,4',5,5'-tetraphenylbiimidazole, 2,2'-bis(2-chlorophenyl)-4,4',5,5'-tetraphenyl biimidazole, 2,2'-bis(2-chlorophenyl)-4,4',5,5'-tetra(alkoxyphenyl)biimidazole, 2,2'-bis(2-chlorophenyl)-4,4',5,5'-tetra(dialkoxyphenyl)biimidazole, 2,2'-bis(2-chlorophenyl)-4,4',5,5'-tetra(trialkoxyphenyl)biimidazole, and an imidazole compound in which a phenyl group at the 4,4',5,5' position is substituted with a carboalkoxy group. These compounds are disclosed, for example, in Japanese Patent Laid-Open No. 06-75372, Japanese Patent Laid-Open No. 06-75373, Japanese Patent Publication No. 48-38403, Japanese Patent Laid-Open No. 62-174204, and Japanese Patent Laid-Open No. 7-10913. Of these, a compound represented by the following formula or a mixture thereof is preferable.

[Formula 22]

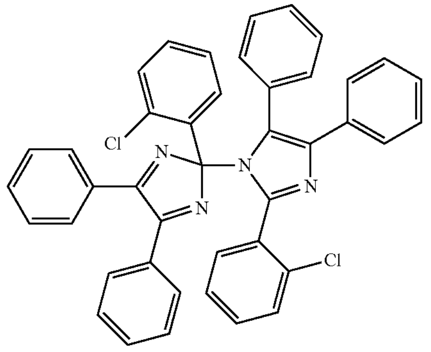

-continued

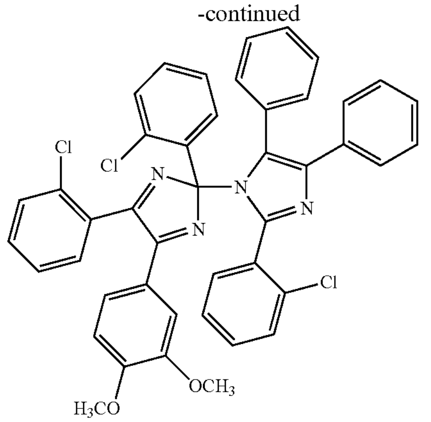

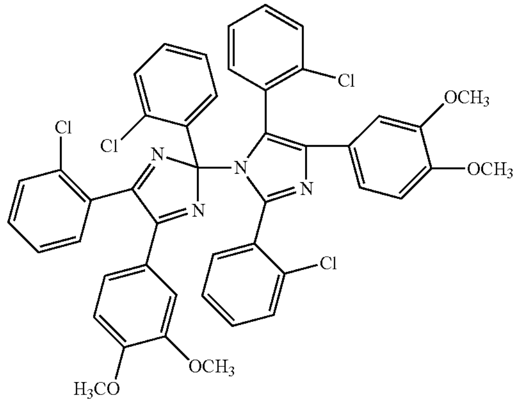

Examples of the triazine compound include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, and 2,4-bis(trichloromethyl)-6-[2-(3,4-dimethoxyphenyl)ethenyl]-1,3,5-triazine. Of these, 2,4-bis(trichloromethyl)-6-piperonyl-1,3,5-triazine is preferable.

Examples of the acylphosphine compound include bis(2,4,6-trimethylbenzoyl)-phenylphosphine oxide and (2,4,6-trimethylbenzoyl)diphenylphosphine oxide.

The polymerization initiator (H) described above may be used alone or in combination of two or more polymerization initiators (H). When two or more polymerization initiators (H) are used in combination, a known polymerization initiator (H) other than the oxime compound, biimidazole compound, triazine compound, and acylphosphine compound described above may be used in combination.

As the combination of the two or more polymerization initiators (H), the same kind of compounds having different structures may be combined or different kinds of compounds may be combined. When the same kind of compounds are combined, the combination of oxime compounds is preferable, and the combination of O-acyloxime compounds having a partial structure represented by formula (d1) is more preferable. Examples of such a combination include N-benzoyloxy-1-(4-phenylsulfanylphenyl)octan-1-one-2-imine and/or N-acetoxy-1-[9-ethyl-6-(2-methylbenzoyl)-9H-carbazole-3-yl]ethane-1-imine. In this case, the blending ratio of N-benzoyloxy-1-(4-phenylsulfanylphenyl)octan-1-one-2-imine and/or N-acetoxy-1-[9-ethyl-6-(2-methylbenzoyl)-9H-carbazole-3-yl]ethane-1-imine is preferably 10:90 to 90:10, more preferably 30:70 to 70:30, and still more preferably 30:70 to 50:50.

Example of the combination of different kinds of compounds include a combination of an oxime compound and a biimidazole compound, an oxime compound and a triazine compound, an oxime compound and an acylphosphine compound, a biimidazole compound and a triazine compound, a combination of a biimidazole compound and an acylphosphine compound, and a combination of a triazine compound and an acylphosphine compound.

Examples of the known polymerization initiator (H) include include benzoin compounds such as benzoin, benzoin methyl ether, benzoin ethyl ether, benzoin isopropyl ether, and benzoin isobutyl ether; benzophenone compounds such as benzophenone, methyl o-benzoylbenzoate, 4-phenylbenzophenonne, 4-benzoyl-4'-methyldiphenyl sulfide, 3,3',4,4'-tetra(tert-butylperoxycarbonyl)benzophenone, 2,4,6-trimethylbenzophenone, and 4,4'-bis(diethylamino)benzophenone; quinone compounds such as 9,10-phenanthrene quinone, 2-ethylanthraquinone, and camphorquinone; 10-butyl-2-chloroacridone, benzyl, methyl phenylglyoxylate, and a titanocene compound.

The content of the polymerization initiator (H) is preferably 0.1 parts by mass or more and 300 parts by mass or less, and more preferably 0.1 parts by mass or more and 200 parts by mass or less, based on 100 parts by mass of the polymerizable compound (G). When the curable resin composition (D) contains a resin described later, the content of the polymerization initiator (H) is preferably 0.1 parts by mass or more and 30 parts by mass or less, and more preferably 1 part by mass or more and 20 parts by mass or less, based on 100 parts by mass of the total amount of the resin (F) and the polymerizable compound (G) described later. When the content of the polymerization initiator (H) is within the above range, the sensitivity tends to be increased and the exposure time tends to be shortened, so that the productivity of the cured film is improved.

[Polymerization Initiation Aid]

If necessary, a polymerization initiation aid may be used in combination. The polymerization initiation aid is a compound or a sensitizer used to promote the polymerization of the polymerizable compound (G) whose polymerization is initiated by the polymerization initiator (H). When the polymerization initiation aid is contained, it is usually used in combination with the polymerization initiator (H). Examples of the polymerization initiation aid include amine compounds, alkoxyanthracene compounds, thioxanthone compounds, and carboxylic acid compounds.

Examples of the amine compound include triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, 2-ethylhexyl 4-dimethylaminobenzoate, N,N-dimethylparatoluidine, 4,4'-bis(dimethylamino)benzophenone (common name: Michler's ketone), 4,4'-bis(diethylamino)benzophenone, and 4,4'-bis(ethylmethylamino)benzophenone, and of these, 4,4'-bis(diethylamino)benzophenone is preferable. Commercially available products such as EAB-F (manufactured by Hodogaya Chemical Co., Ltd.), may be used.

Examples of the alkoxy anthracene compound include 9,10-dimethoxyanthracene, 2-ethyl-9,10-dimethoxyanthracene, 9,10-diethoxyanthracene, 2-ethyl-9,10-diethoxyanthracene, 9,10-dibutoxyanthracene, and 2-ethyl-9,10-dibutoxyanthracene.

Examples of the thioxanthone compound include 2-isopropylthioxanthone, 4-isopropylthioxanthone, 2,4-diethylthioxanthone, 2,4-dichlorothioxanthone, and 1-chloro-4-propoxythioxanthone.

Examples of the carboxylic acid compound include phenylsulfanylacetic acid, methylphenylsulfanylacetic acid, ethylphenylsulfanylacetic acid, methylethylphenylsulfanylacetic acid, dimethylphenylsulfanylacetic acid, methoxyphenysulfanylacetic acid, dimethoxyphenylsulfanylacetic acid, chlorophenylsulfanylacetic acid, dichlorophenylsulfanylacetic acid, N-phenylglycine, phenoxyacetic acid, naphthylthioacetic acid, N-naphthylglycine, and naphthoxyacetic acid.

When a polymerization initiation aid is contained, the content of the polymerization initiation aid is preferably 0.1 parts by mass or more and 300 parts by mass or less, and more preferably 0.1 parts by mass or more and 200 parts by mass or less, based on 100 parts by mass of the polymerizable compound (G). When the curable resin composition (D) contains a resin described later, the content of the polymerization initiator (H) is preferably 0.1 parts by mass or more and 30 parts by mass or less, and more preferably 1 part by mass or more and 20 parts by mass or less, based on 100 parts by mass of the total amount of the curable resin composition (D). When the amount of the polymerization initiation aid is within this range, a cured film tends to be formed with higher sensitivity.

[Solvent]

A coloring curable resin composition may contain a solvent (K). The solvent (K) is not particularly limited, and a solvent usually used in the art can be used.

Examples of the solvent (K) include an ester solvent (a solvent which contains —CO—O— but does not contain —O— in its molecule), an ether solvent (a solvent which contains —O— but does not contain —CO—O— in its molecule), an ether ester solvent (a solvent which contains —CO—O— and —O— in its molecule), a ketone solvent (a solvent which contains —CO— but does not contain —CO—O— in its molecule), an alcohol solvent (a solvent which contains OH but does not contain —O—, —CO— nor —CO—O— in its molecule), an aromatic hydrocarbon solvent, an amide solvent, and dimethyl sulfoxide.

Examples of the ester solvent include methyl lactate, ethyl lactate, butyl lactate, methyl 2-hydroxy isobutanoate, ethyl acetate, n-butylacetate, isobutylacetate, pentyl formate, isopentyl acetate, butyl propionate, isopropyl butyrate, ethyl butyrate, butyl butyrate, methyl pyruvate, ethyl pyruvate, propyl pyruvate, methyl acetoacetate, ethyl acetoacetate, cyclohexanol acetate, and γ-butyrolactone.

Examples of the ether solvent include ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monobutyl ether, propylene glycol monomethyl ether (PGME), propylene glycol monoethyl ether, propylene glycol monopropyl ether, propylene glycol monobutyl ether, 3-methoxy-1-butanol, 3-methoxy-3-methylbutanol, tetrahydrofuran, tetrahydropyran, 1,4-dioxane, diethylene glycol dimethyl ether, diethylene glycol diethyl ether, diethylene glycol methyl ethyl ether, diethylene glycol dipropyl ether, diethylene glycol dibutyl ether, anisole, phenetol, and methyl anisole.

Examples of the ether ester solvent include methyl methoxyacetate, ethyl methoxyacetate, butyl methoxyacetate, methyl ethoxyacetate, ethyl ethoxyacetate, methyl 3-methoxypropionate, ethyl 3-methoxypropionate, methyl 3-ethoxypropionate, ethyl 3-ethoxypropionate, methyl 2-methoxypropionate, ethyl 2-methoxypropionate, propyl 2-methoxypropionate, methyl 2-ethoxypropionate, ethyl 2-ethoxypropionate, methyl 2-methoxy-2-methylpropionate, ethyl 2-ethoxy-2-methylpropionate, 3-butyl methoxyacetate, 3-methyl-3-butyl methoxyacetate, propylene glycol monomethyl ether acetate, propylene glycol monoethyl ether acetate (PGMEA), propylene glycol monopropyl ether acetate, ethylene glycol monomethyl ether acetate, ethylene glycol monoethyl ether acetate, diethylene glycol monoethyl ether acetate, diethylene glycol monobutyl ether acetate, and dipropylene glycol methyl ether acetate.

Examples of the ketone solvent include 4-hydroxy-4-methyl-2-pentanone, acetone, 2-butanone, 2-heptanone, 3-heptanone, 4-heptanone, 4-methyl-2-pentanone, cyclopentanone, cyclohexanone, and isophorone.

Examples of the alcohol solvent include methanol, ethanol, propanol, butanol, hexanol, cyclohexanol, ethylene glycol, propylene glycol, and glycerin.

Examples of the aromatic hydrocarbon solvent include benzene, toluene, xylene, and mesitylene.

Examples of the amide solvent include N,N-dimethylformamide, N,N-dimethylacetamide, and N-methylpyrrolidone.

These solvents may be used in combination of two or more kinds thereof.

Among the above solvents, an organic solvent having a boiling point at 1 atm of 120° C. or more and 180° C. or less is preferable from the viewpoints of coating properties and drying properties. Preferred examples of the solvent include propylene glycol monomethyl ether acetate, ethyl lactate, propylene glycol monomethyl ether, ethyl 3-ethoxypropionate, ethylene glycol monomethyl ether, diethylene glycol monomethyl ether, diethylene glycol monoethyl ether, 4-hydroxy-4-methyl-2-pentanone, and N,N-dimethylformamide, and more preferred examples thereof include propylene glycol monomethyl ether acetate, propylene glycol monomethyl ether, ethyl lactate, ethyl 3-ethoxypropionate, and 4-hydroxy-4-methyl-2-pentanone.

When the curable resin composition (D) contains a solvent (K), the content ratio of the solvent (K) in the curable resin composition (D) may be, for example, 30% by mass or more and 99.99% by mass or less, preferably 40% by mass or more and 90% by mass or less, and more preferably 45% by mass or more and 85% by mass or less. From the viewpoint of storage stability of the liquid and thick film coating, the content ratio of the solvent (K) is preferably in the above range.

When the curable resin composition (D) contains the solvent (K), the curable resin composition (D) can be prepared by mixing a part of the solvent (K) with the light-emitting compound (Q) to prepare the light-emitting compound dispersion (Qh), and then mixing the light-emitting compound dispersion (Qh) with other components.

[Other Components]

The curable resin composition (D) may contain, as other components, additives known in the art, such as an antioxidant (I), a leveling agent (J), a stabilizer, a chain transfer agent, and the like. The content proportion of the other components is preferably 10% by mass or less, more preferably 5% by mass or less, and still more preferably 1% by mass or less based on the total amount of the curable resin composition (D).

[Antioxidant]

The color curable resin composition may contain an antioxidant (I).

From the viewpoint of improving heat resistance and light resistance of the colorant, it is preferable to use the antioxidant singly or in combination of two or more kinds thereof. The antioxidant is not particularly limited as long as it is an antioxidant that is generally used industrially, and a phenol-based antioxidant, a phosphorus-based antioxidant, a sulfur-based antioxidant, and the like can be used.

Examples of the phenol-based antioxidant include Irganox 1010 (Irganox 1010: pentaerythritol tetrakis[3-(3,5-di-tert-butyl-4-hydroxyphenyl)propionate], manufactured by BASF Japan Ltd.), Irganox 1076 (Irganox 1076: Octadecyl-3-(3,5-di-tert-butyl-4-hydroxyphenyl)propionate, manufactured by BASF Japan Ltd.), Irganox 1330 (Irganox 1330: 3,3',3",5,5',5"-hexa-tert-butyl-a,a',a"-(mesitylene-2,4,6-triyl)tri-p-cresol, BASF Japan Ltd.), Irganox 3114 (Irganox 3114: 1,3,5-tris(3,5-di-tert-butyl-4-hydroxybenzyl)-1,3,5-triazine-2,4,6(1H,3H,5H)-trione, BASF Japan Ltd.), Irganox 3790 (Irganox 3790: 1,3,5-tris((4-tert-butyl-3-hydroxy-2,6-xylyl)methyl)-1,3,5-triazine-2,4,6(1H,3H,5H)-trione, BASF Japan Ltd.), Irganox 1035 (Irganox 1035: thiodiethylenebis[3-(3,5-di-tert-butyl-4 hydroxyphenyl)propionate], manufactured by BASF Japan Ltd.), Irganox 1135 (Irganox 1135: 3,5-bis(1,1-dimethylethyl)-4-hydroxy-C7-C9 side-chain alkyl ester of benzene propanoic acid, manufactured by BASF Japan Ltd.), Irganox 1520 L (Irganox 1520 L: 4,6-bis(octylthiomethyl)-o-cresol, manufactured by BASF Japan Ltd.), Irganox 3125 (Irganox 3125, BASF Japan Ltd.), Irganox 565 (Irganox 565: 2,4-bis(n-octylthio)-6-(4-hydroxy-3',5'-di-tert-butylanilino)-1,3,5-triazine, manufactured by BASF Japan Ltd.), ADK STAB AO-80 (ADK STAB AO-80: 3,9-bis(2-(3-(3-tert-butyl-4-hydroxy-5-methylphenyl)propionyloxy)-1,1-dimethylethyl)-2,4,8,10-tetraoxaspiro(5,5)undecane, manufactured by ADEKA Corporation), SUMILIZER BHT (SUMILIZER BHT, manufactured by Sumitomo Chemical Co., Ltd.), SUMILIZER GA-80 (SUMILIZER GA-80, manufactured by Sumitomo Chemical Co., Ltd.), SUMILIZER GS (SUMILIZER GS, manufactured by Sumitomo Chemical Co., Ltd.), Cyanox 1790 (Cyanox 1790, manufactured by Cytec Industries Inc.), and vitamin E (manufactured by Eisai Co., Ltd.).

Examples of the phosphorus-based antioxidant include Irgafos 168 (Irgafos 168: tris(2,4-di-tert-butylphenyl)phosphite, manufactured by BASF Japan Ltd.), Irgafo 12 (Irgafos 12: tris[2-[[2,4,8,10-tetra-tert-butyldibenzo[d,f][1,3,2]-dioxaphosphine-6-yl]oxy]ethyl]amine, manufactured by BASF Japan Ltd.), Irgafos 38 (Irgafos 38: bis(2,4-bis(1,1-dimethylethyl)-6-methylphenyl)ethyl ester phosphite, BASF Japan Ltd.), ADK STAB 329K (manufactured by ADEKA Corporation), ADK STAB PEP36 (manufactured by ADEKA Corporation), ADK STAB PEP-8 (manufactured by ADEKA Corporation), Sandstab P-EPQ (manufactured by Clariant AG), Weston 618 (Weston 618, manufactured by GE), Weston 619G (Weston 619G, manufactured by GE), Ultranox 626 (Ultranox 626, manufactured by GE), and SUMILIZER GP (SUMILIZER GP: 6-[3-(3-tert-butyl-4-hydroxy-5-methylphenyl)propoxy]-2,4,8,10-tetra-tert-butyldibenz[d,f][1.3.2]dioxaphosphepine) (manufactured by Sumitomo Chemical Co., Ltd.).

Examples of the sulfur-based antioxidant include dialkyl thiodipropionate compounds such as dilauryl thiodipropionate, dimyristyl thiodipropionate, and distearate thiodipropionate; and β-alkylmercaptopropionic acid ester compounds of polyols such as tetrakis[methylene(3-dodecylthio)propionate]methane.

[Leveling Agent]

Examples of the leveling agent (J) include a silicone-based surfactant, a fluorine-based surfactant, and a silicone-based surfactant having a fluorine atom. These may have a polymerizable group at its side chain.

Examples of the silicone-based surfactant include a surfactant having a siloxane bond in its molecule. Specific examples thereof include Toray Silicone DC3PA, Toray Silicone SH7PA, Toray Silicone DC11PA, Toray Silicone SH21PA, Toray Silicone SH28PA, Toray Silicone SH29PA, Toray Silicone SH30PA, and Toray Silicone SH8400 (manufactured by Dow Corning Toray Co., Ltd.); KP321, KP322, KP323, KP324, KP326, KP340, and KP341 (manufactured by Shin-Etsu Chemical Co., Ltd.); and TSF400, TSF401, TSF410, TSF4300, TSF4440, TSF4445, TSF4446, TSF4452, and TSF4460 (manufactured by Momentive Performance Materials Inc.).

Examples of the fluorine-based surfactant include a surfactant having a fluorocarbon chain in its molecule. Specific examples thereof include Fluorad® FC430 and Fluorad FC431 (manufactured by Sumitomo 3M Limited); MEGAFACE® F142D, MEGAFACE F171, MEGAFACE F172, MEGAFACE F173, MEGAFACE F177, MEGAFACE F183, MEGAFACE F554, MEGAFACE F575, MEGAFACE R30, and MEGAFACE RS-718-K (manufactured by DIC Corporation); EFTOP® EF301, EFTOP EF303, EFTOP EF351, and EFTOP EF352 (manufactured by Mitsubishi Materials Electronic Chemicals Co., Ltd.); Surflon® S381, Surflon S382, Surflon SC101, and Surflon SC105 (manufactured by Asahi Glass Co., Ltd.); and E5844 (manufactured by Daikin Fine Chemical Laboratory).

Examples of the silicone-based surfactant having a fluorine atom include a surfactant having a siloxane bond and a fluorocarbon chain in its molecule. Specific examples thereof include MEGAFACE® R08, MEGAFACE BL20, MEGAFACE F475, MEGAFACE F477, and MEGAFACE F443 (manufactured by DIC Corporation).

When the curable resin composition (D) contains at least one compound selected from the group consisting of ammonia, amine, carboxylic acid, and salts or ions thereof, the content ratio of the at least one compound selected from the group consisting of ammonia, amine, carboxylic acid, and salts or ions thereof in the curable resin composition (D) may be, for example, 0.01% by mass or more and 10% by mass or less, and preferably 1% by mass or more and 5% by mass or less.

The wavelength conversion layer (B) can be disposed on the display device in a sealed form in a glass tube or the like, or in a sealed form sandwiched between two barrier films as a sheet.

<Light Absorption Layer (C)>

The light absorption layer (C) can have wavelength selectivity that transmits light in a specific wavelength range and absorbs light in other wavelength ranges. The light emitted from the wavelength conversion layer (B) is emitted from the display device as blue light, green light, and red light by transmitting through the light absorption layer (C). Since the display device has the light absorption layer (C), it tends to easily exhibit a wide color gamut.

The light absorption layer (C) can be arranged on the first wavelength conversion layer (B1) and the second wavelength conversion layer (B2).

The light absorption layer (C) may be a layer that transmits yellow light but absorbs light other than yellow light (hereinafter also referred to as a light absorption layer (CY)).

The light absorption layer (C) can also be composed of a first light absorption layer (C1) and a second light absorption layer (C2). When the light absorption layer (C) is composed of the first light absorption layer (C1) and the second light absorption layer (C2), the first light absorption layer (C1) is disposed on the first wavelength conversion layer (B1), and the second light absorption layer (C2) is disposed on the second wavelength conversion layer (B2). The first light absorption layer (C1) may be a layer that transmits red light but absorbs light other than red light. The second light absorption layer (C2) may be a layer that transmits green light but absorbs light other than green light.

The light absorption layer (C) may be composed of the first light absorption layer (C1), the second light absorption layer (C2), and a third light absorption layer (C3). The third light absorption layer (C3) may be disposed on the blue light source (A), or may be disposed on the light guide plate when the display device has the light guide plate described above. The third light absorption layer (C3) may transmit green light and absorb light other than blue light.

The light absorption layer (C) usually contains a colorant (P). The colorant (P) may be a dye or a pigment. As the dye, known dyes can be used, and examples thereof include known dyes disclosed in "Color Index" (published by The Society of Dyers and Colourists) and "Dyeing Note" (SHIKISENSHA CO., LTD.). Further, according to the chemical structure, examples thereof include azo dyes, cyanine dyes, triphenylmethane dyes, xanthene dyes, anthraquinone dyes, naphthoquinone dyes, quinoneimine dyes, methine dyes, azomethine dyes, squarylium dyes, acridine dyes, styryl dyes, coumarin dyes, quinoline dyes, nitro dyes, phthalocyanine dyes, and perylene dyes. These dyes may be used singly or in combination of two or more kinds thereof.

Specific examples thereof include dyes having the following color index (C.I.) numbers:

C.I. Solvent dyes including:

C.I. Solvent Yellow 4, 14, 15, 23, 24, 25, 38, 62, 63, 68, 79, 81, 82, 83, 89, 94, 98, 99, 117, 162, 163, 167, and 189;

C.I. Solvent Red 24, 45, 49, 90, 91111, 118, 119, 122, 124, 125, 127, 130, 132, 143, 145, 146, 150, 151, 155, 160, 168, 169, 172, 175, 181, 207, 218, 222, 227, 230, 245, and 247;

C.I. Solvent Orange 2, 7, 11, 15, 26, 41, 54, 56, 77, 86, and 99;

C.I. Solvent Violet 11, 13, 14, 26, 31, 36, 37, 38, 45, 47, 48, 51, 59, and 60;

C.I. Solvent Blue 4, 5, 14, 18, 35, 36, 37, 38, 44, 45, 58, 59, 59:1, 63, 67, 68, 69, 70, 78, 79, 83, 90, 94, 97, 98, 100, 101, 102, 104, 105, 111, 112, 122, 128, 132, 136, and 139; and C.I. Solvent Green 1, 3, 4, 5, 7, 28, 29, 32, 33, 34, and 35;

C.I. Acid dyes including:

C.I. Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, and 251;

C.I. Acid Red 1, 4, 8, 14, 17, 18, 26, 27, 29, 31, 33, 34, 35, 37, 40, 42, 44, 50, 51, 52, 57, 66, 73, 76, 80, 87, 88, 91, 92, 94, 95, 97, 98, 103, 106, 111, 114, 129, 133, 134, 138, 143, 145, 150, 151, 155, 158, 160, 172, 176, 182, 183, 195, 198, 206, 211, 215, 216, 217, 227, 228, 249, 252, 257, 258, 260, 261, 266, 268, 270, 274, 277, 280, 281, 289, 308, 312, 315, 316, 339, 341, 345, 346, 349, 382, 383, 388, 394, 401, 412, 417, 418, 422, and 426;

C.I. Acid Orange 6, 7, 8, 10, 12, 26, 50, 51, 52, 56, 62, 63, 64, 74, 75, 94, 95, 107, 108, 149, 162, 169, and 173;

C.I. Acid Violet 6B, 7, 9, 15, 16, 17, 19, 21, 23, 24, 25, 30, 34, 38, 49, 72, and 102;

C.I. Acid Blue 1, 3, 5, 7, 9, 11, 13, 15, 17, 18, 22, 23, 24, 25, 26, 27, 29, 34, 38, 40, 41, 42, 43, 45, 48, 51, 54, 59, 60, 62, 70, 72, 74, 75, 78, 80, 82, 83, 86, 87, 88, 90, 90:1, 91, 92, 93, 93:1, 96, 99, 100, 102, 103, 104, 108, 109, 110, 112, 113, 117, 119, 120, 123, 126, 127, 129, 130, 131, 138, 140, 142, 143, 147, 150, 151, 154, 158, 161, 166, 167, 168, 170, 171, 175, 182, 183, 184, 187, 192, 199, 203, 204, 205, 210, 213, 229, 234, 236, 242, 243, 249, 256, 259, 267, 269, 278, 280, 285, 290, 296, 315, 324:1, 335, and 340; and C.I. Acid Green 1, 3, 5, 6, 7, 8, 9, 11, 13, 14, 15, 16, 22, 25, 27, 28, 41, 50, 50:1, 58, 63, 65, 80, 104, 105, 106, and 109;

C.I. Direct dyes including:

C.I. Direct Yellow 2, 4, 28, 33, 34, 35, 38, 39, 43, 44, 47, 50, 54, 58, 68, 69, 70, 71, 86, 93, 94, 95, 98, 102, 108, 109, 129, 132, 136, 138, and 141;

C.I. Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, and 250;

C.I. Direct Orange 26, 34, 39, 41, 46, 50, 52, 56, 57, 61, 64, 65, 68, 70, 96, 97, 106, and 107;

C.I. Direct Violet 47, 52, 54, 59, 60, 65, 66, 79, 80, 81, 82, 84, 89, 90, 93, 95, 96, 103, and 104;

C.I. Direct Blue 1, 2, 3, 6, 8, 15, 22, 25, 28, 29, 40, 41, 42, 47, 52, 55, 57, 71, 76, 77, 78, 80, 81, 84, 85, 86, 87, 90, 93, 94, 95, 97, 98, 99, 100, 101, 106, 107, 108, 109, 113, 114, 115, 117, 119, 120, 137, 149, 150, 153, 155, 156, 158, 159, 160, 161, 162, 163, 164, 165, 166, 167, 168, 170, 171, 172, 173, 188, 189, 190, 192, 193, 194, 195, 196, 198, 199, 200, 201, 202, 203, 207, 209, 210, 212, 213, 214, 222, 225, 226, 228, 229, 236, 237, 238, 242, 243, 244, 245, 246, 247, 248, 249, 250, 251, 252, 256, 257, 259, 260, 268, 274, 275, and 293; and C.I. Direct Green 25, 27, 31, 32, 34, 37, 63, 65, 66, 67, 68, 69, 72, 79, and 82;

C.I. Disperse dyes including:

C.I. Disperse Yellow 51, 54, and 76;

C.I. Disperse Violet 26 and 27; and

C.I. Disperse Blue 1, 14, 56, and 60;

C.I. Basic dyes including:

C.I. Basic Red 1 and 10;

C.I. Basic Blue 1, 3, 5, 7, 9, 19, 21, 22, 24, 25, 26, 28, 29, 40, 41, 45, 47, 54, 58, 59, 60, 64, 65, 66, 67, 68, 81, 83, 88, and 89;

C.I. Basic Violet 2;

C.I. Basic Red 9; and

C.I. Basic Green 1;

C.I. Reactive dyes including:

C.I. Reactive Yellow 2, 76, and 116;

C.I. Reactive Orange 16; and

C.I. Reactive Red 36;

C.I. Mordant dyes including:

C.I. Mordant Yellow 5, 8, 10, 16, 20, 26, 30, 31, 33, 42, 43, 45, 56, 61, 62, and 65;

C.I. Mordant red 1, 2, 3, 4, 9, 11, 12, 14, 17, 18, 19, 22, 23, 24, 25, 26, 27, 29, 30, 32, 33, 36, 37, 38, 39, 41, 42, 43, 45, 46, 48, 52, 53, 56, 62, 63, 71, 74, 76, 78, 85, 86, 88, 90, 94, and 95;

C.I. Mordant Orange 3, 4, 5, 8, 12, 13, 14, 20, 21, 23, 24, 28, 29, 32, 34, 35, 36, 37, 42, 43, 47, and 48;

C.I. Mordant Violet 1, 1: 1, 2, 3, 4, 5, 6, 7, 8, 10, 11, 14, 15, 16, 17, 18, 19, 21, 22, 23, 24, 27, 28, 30, 31, 32, 33, 36, 37, 39, 40, 41, 44, 45, 47, 48, 49, 53, and 58;

C.I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, and 84; and C.I. Mordant Green 1, 3, 4, 5, 10, 13, 15, 19, 21, 23, 26, 29, 31, 33, 34, 35, 41, 43, and 53; and C.I. Vat dyes including C.I. Vat Green 1.

Examples thereof further include BASF's products, Lumogen (R), including Lumogen® F Yellow 083 (manufactured by BASF Japan Ltd.), Lumogen® F Yellow 170 (manufactured by BASF Japan Ltd.), Lumogen® F Orange 240 (manufactured by BASF Japan Ltd.) and Lumogen (R) F Red 305 (manufactured by BASF Japan Ltd.).

As the pigment, known pigments can be used, and examples thereof include pigments classified as pigments in "Color Index" (published by The Society of Dyers and Colourists). These may be used singly or in combination of two or more kinds thereof.

Specific examples thereof include yellow pigments such as C.I. Pigment Yellow 1, 3, 12, 13, 14, 15, 16, 17, 20, 24, 31, 53, 83, 86, 93, 94, 109, 110, 117, 125, 128, 129, 137, 138, 139, 147, 148, 150, 153, 154, 166, 173, 185, 194, 214, and 231;

orange pigments such as C.I. Pigment Orange 13, 31, 36, 38, 40, 42, 43, 51, 55, 59, 61, 64, 65, 71, and 73;

red pigments such as C.I. Pigment Red 9, 97, 105, 122, 123, 144, 149, 166, 168, 176, 177, 178, 179, 180, 190, 192, 209, 215, 216, 224, 242, 254, 255, 264, 265, 266, 268, 269, and 273;

blue pigments such as C.I. Pigment Blue 15, 15:1, 15:2, 15:3, 15:4, 15:6, 16, and 60;

violet pigments such as C.I. Pigment Violet 1, 19, 23, 29, 32, 36, and 38;

green pigments such as C.I. Pigment Green 7, 36, 58, 59, 62, and 63;

brown pigments such as C.I. Pigment Brown 23 and 25; and black pigments such as C.I. Pigment Black 1, 7, 31, and 32.

Examples of the colorant include, in terms of chemical structure, perylene yellow dyes, quinophthalone yellow pigments, metal-containing yellow pigments, isoindoline yellow pigments, perylene orange dyes, perylene orange pigments, perylene red dyes, perylene red pigments, phthalocyanine pigments, halogenated copper phthalocyanine pigments, halogenated zinc phthalocyanine pigments, halogenated aluminum zinc phthalocyanine pigments, and brominated diketopyrrolopyrrole pigments.

The light absorption layer (CY) can contain at least one of the above colorants, a dye and a pigment of which hue is classified as yellow. The colorant contained in the light absorption layer (CY) is preferably at least one selected from the group consisting of C.I. Pigment Yellow 185 and 150.

The first light absorption layer (C1) can contain at least one of the above colorants, a dye and a pigment of which hue is classified as red. The colorant contained in the first light absorption layer (C1) is preferably a red pigment, and more preferably C.I. Pigment Red 177 and 254, and brominated diketopyrrolopyrrole pigment.

The second light absorption layer (C2) can contain at least one of the above colorants, a dye and a pigment of which hue is classified as green. The colorant contained in the second light absorption layer (C2) is preferably a combination of a green pigment and a yellow pigment, more preferably a combination of at least one selected from the group consisting of C.I. Pigment Green 7, 36, and 58, and C.I. Pigment yellow 150.

The third light absorption layer (C3) can contain at least one of the above colorants, a dye and a pigment of which hue is classified as blue. The colorant contained in the third light absorption layer (C3) is preferably a blue pigment, and more preferably C.I. Pigment Blue 15, 15:3, 15:4, 15:6, 16, and 60, more preferably C.I. Pigment Blue 15:6.

The film thickness (T7) of the first light absorption layer (C1), the film thickness (T8) of the second light absorption layer (C2), and the film thickness (T8) of the third light absorption layer (C3) are not particularly limited, can be appropriately adjusted according to the purpose, application, and the like, and is, for example, 0.1 μm or more and 30 μm or less, preferably 0.1 μm or more and 20 μm or less, and more preferably 0.5 μm or more and 6 μm or less.

The colorant content ratio (W7) in the first light absorption layer (C1), the colorant content ratio (W8) in the second light absorption layer (C2), and the colorant content ratio (W9) in the third light absorption layer (C3) are not particularly limited, and can be appropriately adjusted according to the purpose, application, and the like, and may be, for example, 0.01% by mass or more and 99.99% by mass or less, preferably 0.1% by mass or more and 99.9% by mass or less, more preferably 1% by mass or more and 99% by mass or less, still more preferably 10% by mass or more and 90% by mass or less, and particularly preferably 15% by mass or more and 70% by mass or less. The colorant content ratio is determined as the mass percentage of the colorant (P) based on the total amount of the solid content of the coloring curable resin composition (E) described later.

The product (X7) (hereinafter, also abbreviated as X7) of the colorant content ratio (W7) [% by mass] of the first light absorption layer (C1) and the film thickness (T7) [μm] may be, for example, 0.1 or more and 3 or less, or 0.2 or more and 2 or less.

The product (X8) (hereinafter, also abbreviated as X8) of the colorant content ratio (W8) [% by mass] of the second light absorption layer (C2) and the film thickness (T8) [μm] may be, for example, 0.1 or more and 3 or less, or 0.2 or more and 2 or less.

The product (X9) (hereinafter, also abbreviated as X9) of the colorant content ratio (W9) [% by mass] of the third light absorption layer (C3) and the film thickness (T9) [μm] may be, for example, 0.1 or more and 3 or less, or 0.2 or more and 2 or less.

[Method for Producing Light Absorption Layer (C)]

The light absorption layer (C) can be produced as the light absorption layer (CY), the first light absorption layer (C1), the second light absorption layer (C2), and the third light absorption layer (C3) by forming a yellow pattern, a red pattern, a green pattern, and a blue pattern (hereinafter, collectively referred to as colored patterns) on a substrate from a yellow curable resin composition (E-y), a red curable resin composition (E-r), a green curable resin composition (E-g), and a blue curable resin composition (E-b) (hereinafter, collectively referred to as coloring curable resin composition (E)), respectively.

Examples of the method for forming a colored pattern from the coloring curable resin composition (E) include a photolithography method, an inkjet method, and a printing method, and a photolithography method is preferable. The photolithography method is a method in which a coloring curable resin composition (E) is applied to a substrate, dried to form a coloring curable resin composition layer, and the coloring curable resin composition layer is developed by exposing the coloring curable resin composition layer to light through a photomask. In the photolithography method, the photomask is not used during the exposure to light, and/or the coloring composition layer is not developed, whereby a colored coating film which is a cured product of the coloring curable resin composition layer can be formed. The colored pattern and the colored coating film which have been formed from the coloring curable resin composition (E) are the light absorption layer (C) of the present invention.

Examples of the substrate include a glass plate made from, for example, quartz glass, borosilicate glass, alumina silicate glass, soda lime glass of which the surface is coated with silica, or the like; a resin plate made from, for example, polycarbonate, polymethyl methacrylate, polyethylene terephthalate or the like; a substrate made from silicon; and a substrate produced by forming a thin film made from aluminum, silver or a silver/copper/palladium alloy or the like on a substrate. Another light absorption layer, a resin layer, a transistor, a circuit, or the like may be formed on these substrates. The substrate may be included in the light absorption layer (C).

The formation of each color pixel using a photolithography method can be carried out using a known or conventional device or under known or conventional conditions. For example, the color pixel can be prepared in the following manner.

First, the coloring curable resin composition (E) is applied onto a substrate, and then dried by heat-drying (prebaking) and/or drying under reduced pressure to remove volatile components such as a solvent, thereby obtaining a smooth coloring curable resin composition layer.

Examples of the coating method include a spin coating method, a slit coating method, and a slit and spin coating method.

The temperature to be employed in the case where heat-drying is carried out is preferably 30 to 120° C. or less, more preferably 50° C. to 110° C. The heating time is preferably 10 seconds to 60 minutes, and more preferably 30 seconds to 30 minutes. In the case where drying under reduced pressure is carried out, it is preferred to carry out the drying procedure under a pressure of 50 to 150 Pa in a temperature range of 20 to 25° C. The film thickness of the coloring curable resin composition layer is not particularly limited, and may be appropriately selected depending on the target film thickness of the light absorption layer.

Next, the coloring curable resin composition layer is exposed to light through a photomask for forming a desired colored pattern.

The pattern on the photomask is not particularly limited, and a pattern according to the intended application is used. The light sources used for exposure are preferably a light source that emits light having a wavelength of 250 to 450 nm. For example, light having a wavelength of shorter than 350 nm may be cut with a filter capable of cutting light having this wavelength region, or light having a wavelength in the vicinity of 436 nm, in the vicinity of 408 nm, or in the vicinity of 365 nm may be extracted selectively with a band-pass filter capable of extracting light having those wavelength region. Specific examples of the light source include a mercury lamp, a light-emitting diode, a metal halide lamp, and a halogen lamp.

A light-exposing device such as a mask aligner and a stepper is preferably used because the device is capable of emitting a parallel light beam uniformly over the whole area of the exposed surface or aligning the photomask accurately to the substrate which has the coloring curable resin composition layer formed thereon.

A colored pattern is formed on the substrate by bringing the exposed coloring curable resin composition layer into contact with a developer to develop the coloring curable resin composition layer. By developing, an unexposed portion in the coloring curable resin composition layer is dissolved in the developer and therefore removed.

The developer is preferably an aqueous solution of an alkaline compound such as potassium hydroxide, sodium hydrogen carbonate, sodium carbonate, and tetramethylammonium hydroxide.

The concentration of the alkaline compound is preferably 0.01 to 10% by mass, and more preferably 0.02 to 5% by mass. The developer may contain a surfactant.

The developing method may be any of a paddle method, a dipping method, a spray method and the like. Further, the substrate may be inclined at any degree during development.

The developed substrate is preferably washed with water.

Furthermore, the resultant colored pattern is preferably subjected to post-baking.

The post-baking temperature is preferably 150 to 250° C., and more preferably 160 to 235° C. The post-baking time is preferably 1 to 120 minutes, and more preferably 10 to 60 minutes. The thus obtained light absorption layer which is a colored pattern or a colored coating film may be further subjected to a surface coating treatment in order to impart various characteristics.

[Coloring Curable Resin Composition]

The coloring curable resin composition (E) contains a resin (F), a polymerizable compound (G), and a polymerization initiator (H) in addition to the colorant described above (hereinafter, also referred to as colorant (P)). Examples of the resin (F), the polymerizable compound (G), and the polymerization initiator (H) are the same as those in the description of the curable resin composition (D) described above. The coloring curable resin composition (E) may further include at least one selected from the group consisting of a solvent (K), a leveling agent (J), and an antioxidant (I).

The content ratio of the solid content in the coloring curable resin composition (E) is 100% by mass or less, preferably 0.01% by mass or more and 100% by mass or less, more preferably 0.1% by mass or more and 99.9% by mass or less, still more preferably 0.1% by mass or more and 99% by mass or less, further preferably 1% by mass or more and 90% by mass or less, even further preferably 1% by mass or more and 80% or less, particularly preferably 1% by mass or more and 70% or less, extremely preferably 1% by mass or more and 60% or less, and most preferably 1% by mass or more and 50% by mass or less, based on the total amount of the coloring curable resin composition (E). As used herein, the solid content in the coloring curable resin composition (E) means the total amount of the components excluding the solvent (K) from the coloring curable resin composition (E). The total amount of solid content and the content ratio of each component can be measured by a known analytical means such as liquid chromatography or gas chromatography.

The content ratio of the colorant (P) in the coloring curable resin composition may be, for example, based on the total amount of the solid content, 0.01% by mass or more and 99.99% by mass or less, preferably 0.1% by mass or more and 99.9% by mass or less, more preferably 1% by mass or more and 99% by mass or less, still more preferably 10% by mass or more and 90% by mass or less, and particularly preferably 15% by mass or more and 70% by mass or less.

The content ratio of the resin (F) in the coloring curable resin composition (E) is less than 100% by mass, preferably 0.00001% by mass or more and 99.99999% by mass or less, more preferably 1% by mass or more and 99% by mass or less, still more preferably 1% by mass or more and 97% by mass or less, further preferably 1% by mass or more and 95% by mass or less, even further preferably 3% by mass or more and 90% by mass or less, particularly preferably 5% by mass or more and 80% by mass or less, and extremely preferably 10% by mass or more and 70% by mass or less based on the total amount of the solid content.

The content ratio of the polymerizable compound (G) in the coloring curable resin composition (E) is less than 100% by mass, preferably 0.00001% by mass or more and 99.99999 or less, more preferably 1% by mass or more and 99% by mass or less, still more preferably 1% by mass or more and 97% by mass or less, further preferably 1% by mass or more and 95% by mass or less, even further preferably 1% by mass or more and 90% by mass or less, particularly preferably 2% by mass or more and 80% by mass or less, and extremely preferably 3% by mass or more and 70% by mass or less based on the total amount of the solid content.

The content ratio of the polymerization initiator (H) in the coloring curable resin composition (E) is preferably from 0.001% by mass or more and 60% by mass or less, and more preferably from 0.01% by mass or more and 50% by mass or less, based on the total amount of the resin (F) and the polymerizable compound (G).

When these polymerization initiation aids are used, the content ratio of the polymerization initiation aid in the coloring curable resin composition (E) is preferably from 0.00001% by mass or more and 60% by mass or less, and more preferably from 0.0001% by mass or more and 50% by mass or less, based on the total amount of the resin (F) and the polymerizable compound (G).

[Preparation of Colorant-Containing Liquid]

When the coloring curable resin composition (E) contains the solvent (K), a colorant-containing liquid (Ph) containing the colorant (P) and the solvent (K) may be prepared in advance, and then the coloring curable resin composition (E) may be prepared by using the colorant-containing liquid (Ph). When the colorant (A) is not dissolved in the solvent (K), the colorant-containing liquid (Ph) can be prepared by dispersing and mixing the colorant (A) in the solvent (K). The colorant-containing liquid (Ph) may contain a part or all of the solvent (K) contained in the coloring curable resin composition (E).

The content ratio of the solid content in the colorant-containing liquid (Ph) is less than 100% by mass, preferably 0.01% by mass or more and 99.99% by mass or less, more preferably 0.1% by mass or more and 99.9% by mass or less, still more preferably 0.1% by mass or more and 99% by mass or less, further preferably 1% by mass or more and 90% by mass or less, even further preferably 1% by mass or more and 80% by mass or less, particularly preferably 1% by mass or more and 70% by mass or less, extremely preferably 1% by mass or more and 60% by mass or less, and most preferably 1% by mass or more and 50% by mass or less, based on the total amount of the colorant-containing liquid (Ph).

The content ratio of the colorant (P) in the colorant-containing liquid (Ph) is 100% by mass or less, preferably 0.0001% by mass or more and 99.9999% by mass or less, more preferably 0.0001% by mass or more and 99% by mass or less, still more preferably 1% by mass or more and 99% by mass or less, further preferably 3% by mass or more and 99% by mass or less, and even further preferably 5% by mass or more and 99% by mass or less, based on the total amount of the solid content in the colorant-containing liquid (Ph).

If necessary, the colorant (P) may be subjected to a rosin treatment, a surface treatment using a colorant (P) derivative or the like having an introduced acidic group or basic group, a colorant (P) surface graft treatment with a polymeric compound or the like, a particle micronization treatment with a sulfuric acid micronization method or the like, a washing treatment with an organic solvent, water or the like for removing impurities, a removing treatment with an ionic exchange method or the like of ionic impurities or the like. The colorant (P) preferably has a substantially uniform particle size.

The colorant (P) can be uniformly dispersed in the colorant-containing liquid (Ph) by dispersing the colorant (P) in the colorant-containing liquid (Ph) with a dispersant. The colorant (P) may be individually dispersed, or a plurality of kinds thereof may be mixed and dispersed.

Examples of the dispersant include a surfactant, which may be any of a cationic surfactant, an anionic surfactant, a nonionic surfactant, and an amphoteric surfactant. Specific examples thereof include a polyester-based surfactant, a polyamine-based surfactant, and an acrylic-based surfactant. These dispersants may be used singly or in combination of two or more kinds thereof. Examples of the dispersant include KP (manufactured by Shin-Etsu Chemical Co., Ltd.), FLOWLEN (manufactured by KYOEISHA CHEMICAL Co., LTD.), Solsperse® (manufactured by Zeneca Co., Ltd.), EFKA® (manufactured by BASF Japan Ltd.), AJISPER® (manufactured by Ajinomoto Fine-Techno Co., Inc.), DISPERBYK® (manufactured by BYK Japan KK.), and BYK® (manufactured by BYK Japan KK.). Of these, solvent-based pigment dispersants are preferable. Typical commercially available products thereof include DISPERBYK-101, 102, 103, 106, 107, 108, 109, 110, 111, 116, 118, 130, 140, 154, 161, 162, 163, 164, 165, 166, 170, 171, 174, 180, 181, 182, 183, 184, 185, 190, 192, 2000, 2001, 2020, 2025, 2050, 2070, 2095, 2150, 2155; ANTI-TERRA-U, U100, 203, 204, 250; BYK-P104, P104S, P105, 220S, 6919; BYK-LPN6919, and 21116; LACTIMON and LACTIMON-WS; Bykumen; and the like, manufactured by BYK Japan KK;

SOLSPERSE-3000, 9000, 13000, 13240, 13650, 13940, 16000, 17000, 18000, 20000, 21000, 24000, 26000, 27000, 28000, 31845, 32000, 32500, 32550, 33500, 32600, 34750, 35100, 36600, 38500, 41000, 41090, 53095, 55000, 76500, and the like, manufactured by Lubrizol Japan Limited;

EFKA-46, 47, 48, 452, 4008, 4009, 4010, 4015, 4020, 4047, 4050, 4055, 4060, 4080, 4400, 4401, 4402, 4403, 4406, 4408, 4300, 4310, 4320, 4330, 4340, 450, 451, 453, 4540, 4550, 4560, 4800, 5010, 5065, 5066, 5070, 7500, 7554, 1101, 120, 150, 1501, 1502, 1503, and the like, manufactured by BASF Japan Ltd.; and AJISPER PA111, PB711, PB821, PB822, and PB824, manufactured by Ajinomoto Fine-Techno Co., Inc.

When the colorant-containing liquid (P) contains a dispersant, the amount of the dispersant used (solid content) is, for example, based on 100 parts by mass of the colorant (P), 0.01 parts by mass or more and 10000 parts by mass or less, preferably 0.01 parts by mass or more and 5000 parts by mass or less, more preferably 0.01 parts by mass or more and 1000 parts by mass or less, still more preferably 0.1 parts by mass or more and 500 parts by mass or less, further preferably 0.1 parts by mass or more and 300 parts by mass or less, even further preferably 1 part by mass or more and 300 parts by mass or less, and particularly preferably 5 parts by mass or more and 260 parts by mass. When the amount of the dispersant is in the above range, a colorant (A)-containing liquid in a more uniform dispersion state tends to be obtained.

When a colorant-containing liquid (Ph) containing the colorant (P) and the solvent (K) is prepared in advance and then the coloring curable resin composition (E) is prepared by using the colorant-containing liquid (Ph), the colorant-containing liquid (Ph) may contain a part or all, preferably a part of the resin (F) contained in the coloring curable resin composition (E) in advance. By incorporating the resin (F) in advance, the dispersion stability of the colorant-containing liquid (Ph) can be further improved.

When the colorant-containing liquid (Ph) contains the resin (F), the content ratio of the resin (F) is, for example, based on 100 parts by mass of the colorant (P), 0.01 parts by mass or more and 10000 parts by mass or less, preferably 0.01 parts by mass or more and 5000 parts by mass or less, more preferably 0.01 parts by mass or more and 1000 parts by mass or less, still more preferably 0.1 parts by mass or more and 500 parts by mass or less, and further preferably 0.1 parts by mass or more and 300 parts by mass or less.

If necessary, the coloring curable resin composition may further contain an additive known in the art, such as a leveling agent (J) and an antioxidant (I), a filler, other polymeric compound, an adhesion promoter, a light stabilizer, or a chain transfer agent. Examples of the leveling agent (J) and the antioxidant (I) are applied to as those in the description of the curable resin composition (D) described above.

<Method for Producing Coloring Curable Resin Composition>

The coloring curable resin composition (E) can be prepared, for example, by mixing the colorant (P), the resin (F), the polymerizable compound (G), the polymerization initiator (H), and as necessary, the solvent (K), the leveling agent (J), the antioxidant (I), and other components.

Mixing can be carried out by using a known or conventional device or under known or conventional conditions.

The colorant (P) is preferably used in a state of a colorant (P) dispersion obtained by mixing the colorant (P) with a part or all of the solvent (K) in advance and dispersing the mixture using a bead mill or the like until the average particle size of the colorant (P) becomes about 0.2 μm or less. At this time, a part or all of the dispersant and the resin (F) may be blended as necessary.

The colorant (P) is preferably dissolved in a part or all of the solvent (E) in advance to prepare a solution. The solution is preferably filtered through a filter having a pore size of about 0.01 μm or more and 1 μm or less.

The coloring curable resin composition (E) after mixing is preferably filtered through a filter having a pore size of about 0.01 μm or more and 10 μm or less.

<Reflection Film>

The display device is not particularly limited, and may include a light reflecting member for irradiating the light of the light source toward the mixture or the laminated structure.

The reflection film is not particularly limited, and may include any suitable known material such as a reflecting mirror, a film of reflective particles, a reflective metal film, a reflector, or the like.

<Diffusion Film>

The display device is not particularly limited, and may include a diffusion film for diffusing the light of the light source or the light emitted from the mixture. The diffusing film may include any diffusion film known in the art, such as an amplified diffusing film.

<Brightness Enhancement Unit>

The display device according to the present invention is not particularly limited, but may include a brightness enhancement unit that reflects and returns a part of the light in the direction in which the light is transmitted.

<Prism Sheet>

The prism sheet typically has a base material section and a prism section. The base material section may be omitted, depending on the adjacent members. The prism sheet may be pasted together with the adjacent members via any appropriate adhesive layer (for example, an adhesive layer or a pressure sensitive adhesive layer). The prism sheet is configured to have a plurality of unit prisms that are convex in parallel on the side opposite to the visible side (rear side). By arranging the convex sections of the prism sheet toward the rear side, the light that passes through the prism sheet is more likely to be focused. Also, when the convex sections of the prism sheet are arranged toward the rear side, there is less light reflected without incident on the prism sheet compared to the case where the convex sections are arranged toward the visible side, and a display with high brightness can be obtained.

<Light Guide Plate>

Any appropriate light guide plate may be used as the light guide plate. For example, a light guide plate having a lens pattern formed on the rear side such that light from the lateral direction can be deflected in the thickness direction or a light guide plate having a prism shape or the like formed on the rear side and/or the visible side can be used.

<Medium Material Layer Between Elements>

The display device according to the present invention is not particularly limited, but may include a layer composed of one or more medium materials on the optical path between adjacent elements (layers). Examples of the one or more medium materials include, but not limited to, vacuum, air, gas, optical materials, adhesives, optical adhesives, glass, polymers, solids, liquids, gels, cured materials, optical bonding materials, refractive index matching or refractive index mismatching materials, refractive index gradient materials, cladding or anti-cladding materials, spacers, silica gel, brightness enhancement materials, scattering or diffusion materials, reflective or anti-reflective materials, wavelength selective materials, wavelength selective anti-reflective materials, or other suitable media known in the art.

Specific examples of the display device include those provided with a wavelength conversion material for an EL display or a liquid crystal display. Specific examples thereof include a display device in which the wavelength conversion layer (B) is disposed between the blue light source (A) and the light guide plate along an end surface (side surface) of the light guide plate to form a backlight (on-edge type backlight) that emits white light, and the light absorption layer (C) is disposed on the light guide plate side; a display device in which the wavelength conversion layer (B) is disposed on the light guide plate to form a backlight (surface-mounting type backlight) that emits light irradiated from the blue light source (A) placed on an end surface (side surface) of the light guide plate to the wavelength conversion layer (B) through the light guide plate as white light, and the light absorption layer (C) is disposed on the wavelength conversion layer (B); and a display device in which the quantum dot composition is disposed in the vicinity of a light-emitting portion of the blue light source (A) as the wavelength conversion layer (B) to form a backlight (on-chip type backlight) that emits irradiated light as white light, and the light absorption layer (C) is disposed on the wavelength conversion layer (B).

The display device is preferably a display device in which the blue light source (A), the wavelength conversion layer (B), and the light absorption layer (C) are disposed and/or laminated in this order in the optical path of the light from the blue light source (A).

FIG. 1 is a schematic cross-sectional view of a display device according to an embodiment of the present invention. The display device 100 shown in FIG. 1 includes a blue light source (A) 110, a wavelength conversion layer (B) 120, and a light absorption layer (C) 130. The wavelength conversion layer (B) 120 has a first wavelength conversion layer (B1) 121 and a second wavelength conversion layer (B2) 122. The light absorption layer (C) 130 has a first light absorption layer (C1) 131 and a second light absorption layer (C2) 132.

FIG. 2 is a schematic cross-sectional view of a display device according to another embodiment of the present invention. The display device 200 shown in FIG. 2 includes a blue light source (A) 210, a wavelength conversion layer (B) 220, and a light absorption layer (C) 230. The wavelength conversion layer (B) 220 has a first wavelength conversion layer (B1) 221 and a second wavelength conversion layer (B2) 222. The light absorption layer (C) 230 may be the light absorption layer (CY) described above.

<Film>

Another embodiment of the present invention is a film containing a compound that absorbs blue and emits green light, and satisfying the condition (5). As the compound that absorbs blue and emits green light, the examples and preferred ranges of the light-emitting compound Q1 described above are applied. The preferred ranges of the thickness T5, the content ratio W5, and X5 in the condition (5) are the same as those of T1 and W1 in the condition (1) described above. When the film satisfying the condition (5) is used as the wavelength conversion layer that emits green light of the display device, both a wide color gamut and excellent energy efficiency can be achieved, and thus the film is suitable as the wavelength conversion layer of the display device.

Yet another embodiment of the present invention is a film containing a compound that absorbs blue and emits red light, and satisfying condition (6). As the compound that absorbs blue and emits red light, the examples and preferred ranges of the light-emitting compound Q2 described above are applied. The preferred ranges of the thickness T6, the content ratio W6, and X6 in the condition (6) are the same as those of T2 and W2 in the condition (2) described above. When the film satisfying the condition (6) is used as the wavelength conversion layer that emits red light of the display device, both a wide color gamut and excellent energy efficiency can be achieved, and thus the film is suitable as the wavelength conversion layer of the display device.

<Display>

As shown in FIG. 3, a display 300 of the present embodiment includes a liquid crystal panel 301 and the above-described display device 100 in this order from the viewing side. The liquid crystal panel 301 typically includes a liquid crystal cell; a viewing-side polarizing plate disposed on a viewing side of the liquid crystal cell; and a rear-side polarizing plate disposed on a rear side of the liquid crystal cell. The display may further include other appropriate optional members.

<Liquid Crystal Panel>

The liquid crystal panel typically includes a liquid crystal cell; a viewing-side polarizing plate disposed on a viewing side of the liquid crystal cell; and a rear-side polarizing plate disposed on a rear side of the liquid crystal cell. The viewing-side polarizing plate and the rear-side polarizing plate can be disposed such that respective absorption axes are substantially orthogonal or parallel to each other.

[Liquid Crystal Cell]

The liquid crystal cell has a pair of substrates and a liquid crystal layer as a display medium sandwiched between the substrates. In a general configuration, a light absorption layer and a black matrix are provided on one substrate, and switching elements for controlling electro-optical characteristics of liquid crystals, scanning lines for applying gate signals to the switching elements, signal lines for applying source signals to the switching elements, pixel electrodes, and counter electrodes are provided on the other substrate. The spacing (cell gap) between the substrates can be controlled by a spacer or the like. For example, an alignment film made of polyimide can be provided on the side of the substrate in contact with the liquid crystal layer.

[Polarizing Plate]

The polarizing plate typically has a polarizer and protective layers disposed on both sides of the polarizer. The polarizer is typically an absorption type polarizer.

Any appropriate polarizer may be used as the polarizer. For example, the polarizer may be a product produced by a process including adsorbing a dichroic material such as iodine or a dichroic dye to a hydrophilic polymer film such as a polyvinyl alcohol-based film, a partially-formalized polyvinyl alcohol-based film, or a partially-saponified, ethylene-vinyl acetate copolymer-based film and uniaxially stretching the film, or may be a polyene-based oriented film such as a film of a dehydration product of polyvinyl alcohol or a dehydrochlorination product of polyvinyl chloride. Among these, a polarizer obtained by adsorbing a dichroic material such as iodine to a polyvinyl alcohol-based film and uniaxially stretching the film is particularly preferable because of its high polarization dichroic ratio.

EXAMPLES

Hereinafter, the present invention will be described in more detail by way of examples. Unless otherwise specified, "%" and "part" in the example are % by mass and parts by mass.

<Measurement of Display Device>

With respect to light emitted from the display devices of the Examples and Comparative Examples, chromaticity (x, y) and emission spectrum were measured in front (0°) of the light source with the focus on the film surface using a microscope equipped with a spectrometer Spectrum meter (manufactured by Ocean Optics, Inc) via an optical fiber. The chromaticity (x, y) is the xy chromaticity coordinates (x, y) in the XYZ color system of CIE.

<Measurement of Peak Wavelength of Light Source>

The emission spectrum of the light source was measured by the measuring device used for the measurement of the display device described above, and the peak wavelength of the light source was read from the measured emission spectrum.

<Measurement of Transmittance (450 nm) of Wavelength Conversion Layer>

An ultraviolet-visible near-infrared spectrophotometer (UV-3600; manufactured by Shimadzu Corporation) equipped with an integrating sphere was used. The measurement substrate was a glass substrate on which a cured film of the curable resin composition used in Examples and Comparative Examples was directly formed on a glass substrate in the same manner as the method used to form the wavelength conversion layer in Example 1 described below, except that exposure was performed without a photomask. The background was acquired with a glass substrate.

<Measurement of Thickness of Wavelength Conversion Layer>

The film thickness was measured using a film thickness measurement device (DEKTAK3; manufactured by Nihon Shinku Gijutsu Kabushiki Gaisha).

<Measurement of Emission Spectrum of Light-Emitting Compound>

Using an absolute PL quantum yield measuring device (trade name: C9920-02, manufactured by HAMAMATSU PHOTONICS K.K., excitation light 450 nm, room temperature, in the atmosphere), the emission spectrum of a quantum dot solution diluted so as to have an Abs value of 0.4 was measured. The maximum wavelength (λmax) and the full width at half maximum were obtained from the obtained emission spectrum.

<Measurement of Weight-Average Molecular Weight (Mw) and Number-Average Molecular Weight (Mn)>

The weight-average molecular weight (Mw) and number-average molecular weight (Mn) in terms of polystyrene of the resin (F) were measured by the GPC method under the following conditions.

Equipment: HLC-8120GPC (manufactured by Tosoh Corporation)

Column: TSK-GELG2000HXL

Column temperature: 40° C.

Solvent: Tetrahydrofuran

Flow rate: 1.0 mL/min

Solid content concentration of analytical sample: 0.001 to 0.01% by mass

Injection volume: 50 μL

Detector: RI

Standard for calibration; TSK STANDARD POLYSTYRENE F-40, F-4, F-288, A-2500, A-500 (manufactured by Tosoh Corporation)

The ratio (Mw/Mn) of the weight-average molecular weight (Mw) and number-average molecular weight (Mn) in terms of polystyrene obtained above was defined as the degree of dispersion.

<Color Gamut Evaluation Value (Y)>

When the area of the overlapping portion of the color gamut surrounded by the coordinates calculated from the xy chromaticity coordinates (x, y) measured in accordance with the "Measurement of display device" described above and the color gamut surrounded by the coordinates of BT 2020 is defined as Y1, and the color gamut surrounded by the coordinates of BT 2020 is defined as Y2, the following formula:

$$Y=(Y1/Y2)\times 100$$

<Efficiency Evaluation Value (Z)>

From the emission spectrum measured in accordance with the "Measurement of display device" described above, the spectral intensities of each of the blue pixel, the green pixel, and the red pixel were calculated according to the following formula:

$$Z=[(Zr+Zg+Zb)/3Zb]\times 100$$

Zb: Integrated intensity of blue pixels

Zg: Integrated intensity of green pixels

Zr: Integrated intensity of red pixels

<Characteristic Evaluation Value>

Calculation was performed according to the following formula:

$$\text{Characteristic evaluation value}=(Y\times Z)/100$$

Y: Color gamut evaluation value

Z: Efficiency evaluation value

[Preparation of Blue Light Source]

Blue light source (A1): blue light emitting diode having a maximum peak wavelength of 445 nm Blue light source (A2): blue light emitting diode having a maximum peak wavelength of 450 nm

[Synthesis Example 1] Resin (F1)

Into a flask equipped with a reflux condenser, a dropping funnel, and a stirrer, an appropriate amount of nitrogen was poured to purge the inside of the flask with a nitrogen atmosphere, and 80 parts of propylene glycol monomethyl ether acetate were added thereto, and the mixture was heated to 85° C. while stirring. Next, a mixed solution prepared by dissolving 6 parts of methacrylic acid, 25 parts of dicyclopentanyl methacrylate, 40 parts of methyl methacrylate, and 29 parts of 1-[2-(methacryloyloxy)ethyl] succinate in 20 parts of propylene glycol monomethyl ether acetate was dropped into the flask over 4 hours. Meanwhile, a solution prepared by dissolving 9 parts of the polymerization initiator 2,2-azobis(2,4-dimethylvaleronitrile) in 40 parts of propylene glycol monomethyl ether acetate was dropped over 5 hours. After the completion of the dropping of the initiator solution, the mixture was kept at 85° C. for 4 hours and then cooled to room temperature to obtain a copolymer (resin F1) solution. The solid content of the resin F1 solution was 40%, and the weight-average molecular weight was 11500.

[Synthesis Example 2] Resin (F2)

Into a flask equipped with a reflux condenser, a dropping funnel, and a stirrer, an appropriate amount of nitrogen was poured to purge the inside of the flask with a nitrogen atmosphere, and 371 parts of propylene glycol monomethyl ether acetate were added thereto, and the mixture was heated to 85° C. while stirring. Next, a mixed solution prepared by dissolving 54 parts of acrylic acid, 225 parts of a mixture of 3,4-epoxytricyclo[5.2.1.$0^{2,6}$]decan-8-yl acrylate and 3,4-epoxytricyclo[5.2.1.$0^{2,6}$]decan-9-yl acrylate (content ratio is 50:50 in molar ratio), and 81 parts of vinyl toluene (isomer mixture) in 80 parts of propylene glycol monomethyl ether acetate was dropped into the flask over 4 hours. Meanwhile, a solution prepared by dissolving 30 parts of the polymerization initiator 2,2-azobis(2,4-dimethylvaleronitrile) in 160 parts of propylene glycol monomethyl ether acetate was dropped over 5 hours. After the completion of the dropping of the initiator solution, the mixture was kept at 85° C. for 4 hours and then cooled to room temperature to obtain a copolymer (resin F2) solution. The solid content of the resin F2 solution was 37%, and the weight-average molecular weight was 10600.

[Preparation Example 1] Preparation of Quantum Dot Dispersion (Qh)

Toluene dispersion of InP/ZnSeS quantum dots (Q1) containing oleic acid as an organic ligand (L): maximum peak wavelength: 625 nm, full width at half maximum: 44 nm Toluene dispersion of InP/ZnSeS quantum dots (Q2) containing oleic acid as an organic ligand (L): maximum peak wavelength: 530 nm, full width at half maximum: 42 nm After removing the toluene by drying the toluene dispersion of the quantum dots by vacuum distillation, 70 parts of cyclohexyl acetate (K3) was added to a total of 30 parts of the quantum dots (Q) and the organic ligand (L) to obtain quantum dot dispersions (Qh-1) and (Qh-2) shown in Table 1.

TABLE 1

| | | Qh-1 | Qh-2 |
|---|---|---|---|
| Quantum dots (Q) | Q1 | 22.1 | — |
| | Q2 | — | 21.3 |
| Organic ligand (L) | | 7.9 | 8.7 |
| Solvent (K) | K3 | 70 | 70 |

The ratio of the quantum dots (Q) to the organic ligands (L) was calculated from the remaining amount of the mixture heated to 550° C. at a temperature increasing rate of 5° C./min by TG-DTA measurement after removal of toluene.

[Preparation Example 2] Curable Resin Composition (D)

The components shown in Tables 2 and 3 were mixed with the quantum dot dispersion (Qh) to prepare curable resin compositions (D-r1), (D-r2), (D-r3), (D-g1), (D-g2), and (D-g3) for forming wavelength conversion layers. In Tables 2 and 3, the number of parts of the components other than the solvent (K) are shown in terms of solid content.

TABLE 2

| | | D-r1 | D-r2 | D-r3 |
|---|---|---|---|---|
| Quantum dots (Q) | Q1 | 12.0 | 29.0 | 29.0 |
| Organic ligand (L) | L1 | 4.3 | 10.4 | 10.4 |
| Light scattering agent (S) | S1 | — | — | 10.0 |
| Resin (F) | F1 | 57.5 | 41.6 | 34.7 |
| Polymerizable compound (G) | G1 | 19.1 | 13.9 | 11.6 |
| Polymerization initiator (H) | H1 | 2.3 | 1.7 | 1.4 |
| Antioxidant (I) | I1 | 4.7 | 3.3 | 2.8 |
| Leveling agent (J) | J1 | 0.1 | 0.1 | 0.1 |
| Solvent (K) | K1 | 150 | 150 | 150 |

TABLE 3

| | | D-g1 | D-g2 | D-g3 |
|---|---|---|---|---|
| Quantum dots (Q) | Q2 | 12.0 | 28.0 | 28.0 |
| Organic ligand (L) | L1 | 4.9 | 11.4 | 11.4 |
| Light scattering agent (S) | S1 | — | — | 10.0 |
| Resin (F) | F1 | 57.1 | 41.6 | 34.7 |
| Polymerizable compound (G) | G1 | 19.0 | 13.9 | 11.6 |
| Polymerization initiator (H) | H1 | 2.3 | 1.7 | 1.4 |
| Antioxidant (I) | I1 | 4.6 | 3.3 | 2.8 |
| Leveling agent (J) | J1 | 0.1 | 0.1 | 0.1 |
| Solvent (K) | K1 | 150 | 150 | 150 |

Light scattering agent (S1): To 60 parts of titanium dioxide particles, 10 parts by mass (in terms of solid content) of resin (F1) and 30 parts by mass in total of PGMEA were mixed, and the titanium dioxide particles were sufficiently dispersed using a bead mill.

Polymerizable compound (G1): polybasic acid-modified acrylic oligomer (trade name: M-510: manufactured by Toagosei Co., Ltd.)

Polymerization initiator (H1): Irgacure® OXE-02: manufactured by BASF Japan Ltd.

Antioxidant (I1): SUMILIZER GP: manufactured by Sumitomo Chemical Co., Ltd.

Leveling agent (J1): Toray Silicone SH8400: manufactured by Dow Corning Toray Co., Ltd.

Solvent (K1): propylene glycol monomethyl ether acetate (PGMEA)

[Preparation Example 3] Pigment Dispersion (pH)

The components shown in Table 4 were mixed, and the pigment was sufficiently dispersed using a bead mill to prepare pigment dispersions (Ph-1) to (Ph-7).

TABLE 4

| | | Pigment dispersion (Ph) | | | | | | |
|---|---|---|---|---|---|---|---|---|
| | | Ph-1 | Ph-2 | Ph-3 | Ph-4 | Ph-5 | Ph-6 | Ph-7 |
| Pigment (P) | P1 | 12.0 | — | — | — | — | — | — |
| | P2 | — | 12.0 | — | — | — | — | — |
| | P3 | — | — | 12.0 | — | — | — | — |
| | P4 | — | — | — | 12.0 | — | — | — |
| | P5 | — | — | — | — | 15.0 | — | — |
| | P6 | — | — | — | — | — | 14.0 | — |
| | P7 | — | — | — | — | — | — | 12.0 |
| Pigment dispersant | | 6.0 | 6.0 | 7.2 | 6.0 | 2.3 | 4.1 | 3.9 |
| Resin (F) | F3 | — | — | 6.0 | 4.8 | 4.5 | 3.0 | 4.0 |
| Solvent (K) | K1 | 77 | 82 | 70 | 77 | 78 | 79 | 80 |
| | K2 | 5 | — | 5 | — | — | — | — |

Pigment (P1): C.I. Pigment Red 254
Pigment (P2): C.I. Pigment Red 177
Pigment (P3): C.I. Pigment Yellow 185
Pigment (P4): C.I. Pigment Yellow 150
Pigment (P5): C.I. Pigment Green 58
Pigment (P6): C.I. Pigment Green 36
Pigment (P7): C.I. Pigment Green 7
Pigment dispersant: Solvent-based pigment dispersant
Resin (F3): methacrylic acid/benzyl methacrylate copolymer (copolymerization ratio (mass ratio): 30/70, Mw: $1.2\times10^4$)
Solvent (K2): propylene glycol 1-monomethyl ether (PGME)

[Preparation Example 4] Coloring Curable Resin Composition (E)

The components shown in Table 5 were mixed to obtain coloring curable resin compositions (E-r) and (E-g) for forming a light absorption layer. In Table 5, the parts of the resin are shown in terms of solid content.

TABLE 5

| | | Coloring curable resin composition (E-r) | | | Coloring curable resin composition (E-g) | | |
|---|---|---|---|---|---|---|---|
| | | E-r1 | E-r2 | E-r3 | E-g1 | E-g2 | E-g3 |
| Pigment dispersion (Ph) | Ph-1 | 292 | — | 146 | — | — | — |
| | Ph-2 | — | 308 | — | — | — | — |
| | Ph-3 | — | — | 146 | — | — | — |
| | Ph-4 | — | — | — | 200 | 200 | 200 |
| | Ph-5 | — | — | — | 106 | — | — |
| | Ph-6 | — | — | — | — | 114 | — |
| | Ph-7 | — | — | — | — | — | 133 |
| Resin (F) | F2 | 14 | 13 | 11 | 9 | 9 | 8 |
| Polymerizable compound (G) | G2 | 25 | 24 | 20 | 17 | 16 | 15 |
| Polymerization initiator (H) | H2 | 8 | 7 | 6 | 5 | 5 | 4 |
| Leveling agent (J) | J2 | 0.1 | 0.1 | 0.1 | 0.1 | 0.1 | 0.1 |
| Solvent (K) | K1 | 307 | 314 | 317 | 329 | 322 | 206 |
| | K2 | 18 | — | 19 | — | — | — |

Polymerizable compound (G2): dipentaerythritol hexaacrylate (trade name: KAYARAD® DPHA; manufactured by Nippon Kayaku Co., Ltd.)

Polymerization Initiator (H2): N-benzoyloxy-1-(4-phenylsulfanylphenyl)octan-1-on-2-imine, trade name: Irgacure® OXE-01: manufactured by BASF Japan Ltd.

Leveling agent (J2): Polyether-modified silicone oil, trade name: Toray Silicone SH8400, manufactured by Dow Corning Toray Co., Ltd.

Example 1

Onto a 5-cm square glass substrate (Eagle 2000; manufactured by Corning Incorporated), a coloring curable resin composition (E-r1) for light absorption layer was applied by a spin coat method, and then prebaked at 100° C. for 3 minutes, to form a red curable resin composition layer. The substrate on which the red curable resin composition layer was formed was subjected to light irradiation in an exposure amount (basis: 365 nm) of 100 mJ/cm$^2$ under an air atmosphere using an exposure device (TME-150RSK; manufactured by TOPCON CORPORATION) and after development, post-baking was performed 230° C. for 20 minutes, to obtain a cured film. This cured film was used as a first light absorption layer (C1). In the same manner, a second light absorption layer (C2) was prepared on the substrate on which the first light absorption layer (C1) was prepared, using the coloring curable resin composition (E-g1).

Next, on the substrate, the first wavelength conversion layer (B1) was formed on the first light absorption layer (C1) in the same manner as in the preparation method for the first light absorption layer except that the exposure amount was changed to 500 mJ/cm$^2$ and the post-baking time was changed to 60 minutes at 180° C. using a curable resin composition (D-r2). In the same manner, the second wavelength conversion layer (B2) was prepared on the second light absorption layer (C2) using the curable resin composition (D-g2).

According to the conditions for production of the display device shown in Table 6, the substrate was mounted on the blue light source (A) so that the first light absorption layer (C1) was disposed on the first wavelength conversion layer (B1) and the second light absorption layer (C2) was disposed on the second wavelength conversion layer (B2), thereby the display device was produced. The evaluation results are shown in Table 7.

Examples 2 to 12 and Comparative Examples 1 and 2

A display device was produced in the same manner as in Example 1 except that the materials and film thicknesses were as shown in Table 6. The evaluation results are shown in Table 7.

TABLE 6

| | | Example | | | | | | | | | | | | Comparative Example | |
|---|---|---|---|---|---|---|---|---|---|---|---|---|---|---|---|
| | | 1 | 2 | 3 | 4 | 5 | 6 | 7 | 8 | 9 | 10 | 11 | 12 | 1 | 2 |
| First wavelength conversion layer (B1) | Curable resin composition (D1) | D-r2 | D-r3 | D-r3 | D-r3 | D-r3 | D-r3 | D-r3 | D-r3 | Q-r3 | D-r3 | D-r3 | D-r3 | D-r1 | D-r1 |
| | Thickness (T1) [μm] | 9.7 | 9.9 | 8.6 | 6.3 | 3.6 | 2.3 | 8.6 | 8.6 | 6.3 | 6.3 | 6.3 | 9.9 | 3.0 | 5.0 |
| | Quantum dot content ratio (W1) [%] | 29.0 | 29.0 | 29.0 | 29.0 | 29.0 | 29.0 | 29.0 | 29.0 | 29.0 | 29.0 | 29.0 | 29.0 | 12.0 | 12.0 |
| | Light scattering agent content ratio (W3) [%] | — | 10.0 | 10.0 | 10.0 | 10.0 | 10.0 | 10.0 | 10.0 | 10.0 | 10.0 | 10.0 | 10.0 | — | — |
| | X1 | 2.8 | 2.9 | 2.5 | 1.8 | 1.0 | 0.7 | 2.5 | 2.5 | 1.8 | 1.8 | 1.8 | 2.9 | 0.4 | 0.6 |
| | X3 | — | 1.0 | 0.9 | 0.6 | 0.4 | 0.2 | 0.9 | 0.9 | 0.6 | 0.6 | 0.6 | 1.0 | — | — |
| Second wavelength conversion layer (B2) | Curable resin composition (D2) | D-g2 | D-g3 | D-g3 | D-g3 | D-g3 | D-g3 | D-g3 | D-g3 | D-g3 | D-g3 | D-g3 | D-g3 | D-g1 | D-g1 |
| | Thickness (T2) [μm] | 9.8 | 12.1 | 9.9 | 6.9 | 4.1 | 2.3 | 9.9 | 9.9 | 6.9 | 6.9 | 6.9 | 9.9 | 3.0 | 5.0 |
| | Quantum dot content ratio (W2) [%] | 28.0 | 28.0 | 28.0 | 28.0 | 28.0 | 28.0 | 28.0 | 28.0 | 28.0 | 28.0 | 28.0 | 28.0 | 12.0 | 12.0 |
| | Light scattering agent content ratio (W4) [%] | — | 10.0 | 10.0 | 10.0 | 10.0 | 10.0 | 10.0 | 10.0 | 10.0 | 10.0 | 10.0 | 10.0 | — | — |
| | X2 | 2.7 | 3.4 | 2.8 | 1.9 | 1.1 | 0.6 | 2.8 | 2.8 | 1.9 | 1.9 | 1.9 | 2.8 | 0.4 | 0.6 |
| | X4 | — | 1.2 | 1.0 | 0.7 | 0.4 | 0.2 | 1.0 | 1.0 | 0.7 | 0.7 | 0.7 | 1.0 | — | — |
| First light absorption layer (C1) | Coloring curable resin composition (E-r) | E-r1 | E-r1 | E-r1 | E-r1 | E-r1 | E-r1 | E-r2 | E-r3 | E-r1 | E-r1 | E-r1 | E-r1 | E-r1 | E-r1 |
| | Thickness (T7) [μm] | 3.0 | 3.0 | 3.0 | 3.0 | 3.0 | 3.0 | 3.0 | 3.0 | 2.5 | 1.5 | 1.0 | 1.0 | 3.0 | 3.0 |
| | Colorant content ratio (W7) [%] | 35.0 | 35.0 | 35.0 | 35.0 | 35.0 | 35.0 | 37.0 | 35.0 | 35.0 | 35.0 | 35.0 | 35.0 | 35.0 | 35.0 |
| | X7 | 1.1 | 1.1 | 1.1 | 1.1 | 1.1 | 1.1 | 1.1 | 1.1 | 0.9 | 0.5 | 0.4 | 0.4 | 1.1 | 1.1 |
| Second light absorption layer (C2) | Coloring curable resin composition (E-g) | E-g1 | E-g1 | E-g1 | E-g1 | E-g1 | E-g1 | E-g2 | E-g3 | E-g1 | E-g1 | E-g1 | E-g1 | E-g1 | E-g1 |
| | Thickness (T8) [μm] | 3.0 | 3.0 | 3.0 | 3.0 | 3.0 | 3.0 | 3.0 | 3.0 | 2.5 | 1.5 | 1.0 | 1.0 | 3.0 | 3.0 |
| | Colorant content ratio (W8) [%] | 39.9 | 39.9 | 39.9 | 39.9 | 39.9 | 39.9 | 40.0 | 40.0 | 39.9 | 39.9 | 39.9 | 39.9 | 39.9 | 39.9 |
| | X8 | 1.2 | 1.2 | 1.2 | 1.2 | 1.2 | 1.2 | 1.2 | 1.2 | 1.0 | 0.6 | 0.4 | 0.4 | 1.2 | 1.2 |

TABLE 7

| | | | Example | | | | | | |
|---|---|---|---|---|---|---|---|---|---|
| | | | 1 | 2 | 3 | 4 | 5 | 6 | 7 |
| Blue light source A) | | | A1 | A1 | A1 | A1 | A1 | A1 | A1 |
| First wavelength conversion layer (B1) | X1 | | 2.8 | 2.9 | 2.5 | 1.8 | 1.0 | 0.7 | 2.5 |
| | X3 | | — | 1.0 | 0.9 | 0.6 | 0.4 | 0.2 | 0.9 |
| | Transmittance (450 nm) [%] | | 35 | 7 | 9 | 14 | 25 | 32 | 9 |
| Second wavelength conversion layer (B2) | X2 | | 2.7 | 3.4 | 2.8 | 1.9 | 1.1 | 0.6 | 2.8 |
| | X4 | | — | 1.2 | 1.0 | 0.7 | 0.4 | 0.2 | 1.0 |
| | Transmittance (450 nm) [%] | | 72 | 15 | 20 | 30 | 44 | 55 | 20 |
| First light absorption layer | X7 | | 1.1 | 1.1 | 1.1 | 1.1 | 1.1 | 1.1 | 1.1 |
| Second light absorption layer (C2) | X8 | | 1.2 | 1.2 | 1.2 | 1.2 | 1.2 | 1.2 | 1.2 |
| Display device | Red | x | 0.678 | 0.703 | 0.699 | 0.696 | 0.692 | 0.689 | 0.704 |
| | | y | 0.308 | 0.297 | 0.300 | 0.304 | 0.305 | 0.307 | 0.295 |
| | | Δ | 0.034 | 0.007 | 0.012 | 0.017 | 0.021 | 0.024 | 0.005 |
| | | Zr | 59 | 179 | 193 | 170 | 124 | 103 | 184 |
| | Green | x | 0 256 | 0.309 | 0.296 | 0.282 | 0.270 | 0.252 | 0.297 |
| | | y | 0.689 | 0.675 | 0.684 | 0.692 | 0.697 | 0.704 | 0.683 |
| | | Δ | 0.138 | 0.185 | 0.169 | 0.154 | 0.142 | 0.124 | 0.171 |
| | | Zg | 36 | 139 | 134 | 104 | 70 | 48 | 130 |
| | Blue | x | 0.159 | 0.159 | 0.159 | 0.159 | 0.159 | 0.159 | 0.159 |
| | | y | 0.019 | 0.019 | 0.019 | 0.019 | 0.019 | 0.019 | 0.019 |
| | | Δ | 0.039 | 0.039 | 0.039 | 0.039 | 0.039 | 0.039 | 0.039 |
| | | Zb | 903 | 903 | 903 | 903 | 903 | 903 | 903 |
| | Color gamut evaluation value (Y) % | | 72.7 | 69.4 | 71.5 | 73.5 | 74.6 | 76.3 | 71.6 |
| | Efficiency evaluation value (Z) % | | 36.8 | 45.1 | 45.4 | 43.4 | 40.5 | 38.9 | 44.9 |
| | Characteristic evaluation value (Y × Z/100) | | 26.8 | 31.3 | 32.5 | 31.9 | 30.2 | 29.7 | 32.2 |

| | | | Example | | | | | Comparative Example | |
|---|---|---|---|---|---|---|---|---|---|
| | | | 8 | 9 | 10 | 11 | 12 | 1 | 2 |
| Blue light source A) | | | A1 | A1 | A1 | A1 | A1 | A1 | A1 |
| First wavelength conversion layer (B1) | X1 | | 2.5 | 1.8 | 1.8 | 1.8 | 2.9 | 0.4 | 0.6 |
| | X3 | | 0.9 | 0.6 | 0.6 | 0.6 | 1.0 | — | — |
| | Transmittance (450 nm) [%] | | 9 | 14 | 14 | 14 | 7 | 87 | 79 |
| Second wavelength conversion layer (B2) | X2 | | 2.8 | 1.9 | 1.9 | 1.9 | 2.8 | 0.4 | 0.6 |
| | X4 | | 1.0 | 0.7 | 0.7 | 0.7 | 1.0 | — | — |
| | Transmittance (450 nm) [%] | | 20 | 30 | 30 | 30 | 20 | 95 | 93 |
| First light absorption layer | X7 | | 1.1 | 0.9 | 0.5 | 0.4 | 0.4 | 1.1 | 1.1 |
| Second light absorption layer (C2) | X8 | | 1.2 | 1.0 | 0.6 | 0.4 | 0.4 | 1.2 | 1.2 |
| Display device | Red | x | 0.698 | 0.694 | 0.694 | 0.694 | 0.694 | 0.658 | 0.661 |
| | | y | 0.302 | 0.304 | 0.304 | 0.304 | 0.304 | 0.305 | 0.305 |
| | | Δ | 0.014 | 0.018 | 0.018 | 0.018 | 0.018 | 0.051 | 0.049 |
| | | Zr | 186 | 172 | 172 | 172 | 172 | 33 | 36 |
| | Green | x | 0.269 | 0.285 | 0.287 | 0.280 | 0.304 | 0.228 | 0.236 |
| | | y | 0.704 | 0.688 | 0.663 | 0.606 | 0.645 | 0.594 | 0.622 |
| | | Δ | 0.136 | 0.158 | 0.178 | 0.220 | 0.203 | 0.211 | 0.187 |
| | | Zg | 103 | 109 | 122 | 137 | 168 | 11 | 13 |
| | Blue | x | 0.159 | 0.159 | 0.159 | 0.159 | 0.159 | 0.159 | 0.159 |
| | | y | 0.019 | 0.019 | 0.019 | 0.019 | 0.019 | 0.019 | 0.019 |
| | | Δ | 0.039 | 0.039 | 0.039 | 0.039 | 0.039 | 0.039 | 0.039 |
| | | Zb | 903 | 903 | 903 | 903 | 903 | 903 | 903 |
| | Color gamut evaluation value (Y) % | | 76.1 | 72.8 | 69.5 | 62.8 | 66.0 | 63.1 | 66.2 |
| | Efficiency evaluation value (Z) % | | 44.0 | 43.7 | 44.2 | 44.7 | 45.9 | 35.0 | 35.1 |

TABLE 7-continued

| | | | | | | | |
|---|---|---|---|---|---|---|---|
| Characteristic evaluation value (Y × Z/100) | 33.5 | 31.8 | 30.7 | 28.1 | 30.3 | 22.1 | 23.3 |

In the display device produced according to Examples, the LED elements of the light source are driven independently, so that full-color display can be performed.

REFERENCE SIGNS LIST

100, 200: display device, 110, 210: blue light source, 120, 220: wavelength conversion layer, 121, 221: first wavelength conversion layer, 122, 222: second wavelength conversion layer, 130, 230: light absorption layer, 131: first light absorption layer, 132: second light absorption layer, 300: liquid crystal display, 301: liquid crystal

The invention claimed is:

1. A film formed from a curable resin composition and satisfying the following condition (5), wherein the curable resin composition comprises a light scattering agent(S), a resin (F), a polymerizable compound (G), a polymerization initiator (H) and a compound (Q1) that absorbs blue and emits red light, $$0.7 \leq X5, \quad (5)$$

wherein

X5 is a value obtained by dividing a product of a thickness T5 [μm] of the film and a content ratio W5 [% by mass] of the compound (Q1) in the film by 100 [X5=(T5×W5)/100].

2. The film according to claim 1, wherein the compound (Q1) contains at least one selected from the group consisting of an indium compound and a cadmium compound.

3. The film according to claim 1, wherein the film satisfies the following condition (3):

$$X3 \leq 1.6, \quad (3)$$

wherein

X3 is a value obtained by dividing a product of a thickness T1 [μm] of the film and a content ratio W3 [% by mass] of the light scattering agent(S) in the film by 100 [X3=(T1×W3)/100].

4. The film according to claim 1, wherein the resin (F) is an alkali-soluble resin, and the acid value of the resin (F) is 50 to 170 mg-KOH/g.

5. The film according to claim 1, wherein the light scattering agent(S) includes titanium oxide particles.

* * * * *